(12) United States Patent
Yamazaki

(10) Patent No.: US 11,574,933 B2
(45) Date of Patent: Feb. 7, 2023

(54) METAL OXIDE AND FIELD-EFFECT TRANSISTOR

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 21 days.

(21) Appl. No.: 17/371,153

(22) Filed: Jul. 9, 2021

(65) Prior Publication Data

US 2021/0408073 A1 Dec. 30, 2021

Related U.S. Application Data

(63) Continuation of application No. 16/843,922, filed on Apr. 9, 2020, now Pat. No. 11,069,717, which is a
(Continued)

(30) Foreign Application Priority Data

Jun. 3, 2016 (JP) .............................. JP2016-111984
Jun. 24, 2016 (JP) .............................. JP2016-125756
(Continued)

(51) Int. Cl.
*H01L 27/12* (2006.01)
*H01L 29/06* (2006.01)
(Continued)

(52) U.S. Cl.
CPC ...... *H01L 27/1225* (2013.01); *H01L 29/0665* (2013.01); *H01L 29/66969* (2013.01);
(Continued)

(58) Field of Classification Search
None
See application file for complete search history.

(56) References Cited

U.S. PATENT DOCUMENTS 5,160,415 A 11/1992 Kondo et al.
5,731,856 A 3/1998 Kim et al.
(Continued)

FOREIGN PATENT DOCUMENTS

CN 001930692 A 3/2007
CN 001937250 A 3/2007
(Continued)

OTHER PUBLICATIONS

Chinese Office Action (Application No. 201780033970.3) dated Jul. 22, 2021.
(Continued)

*Primary Examiner* — Jay C Chang
(74) *Attorney, Agent, or Firm* — Robinson Intellectual Property Law Office; Eric J. Robinson

(57) ABSTRACT

To provide a novel material. In a field-effect transistor including a metal oxide, a channel formation region of the transistor includes a material having at least two different energy band widths. The material includes nano-size particles each with a size of greater than or equal to 0.5 nm and less than or equal to 10 nm. The nano-size particles are dispersed or distributed in a mosaic pattern.

4 Claims, 59 Drawing Sheets

Related U.S. Application Data continuation of application No. 15/610,796, filed on Jun. 1, 2017, now Pat. No. 10,665,611.

(30) Foreign Application Priority Data

| Jun. 25, 2016 | (JP) | 2016-126116 |
|---|---|---|
| Jul. 7, 2016 | (JP) | 2016-135510 |
| Aug. 2, 2016 | (JP) | 2016-151723 |
| Aug. 8, 2016 | (JP) | 2016-155888 |
| Sep. 22, 2016 | (JP) | 2016-184961 |
| Sep. 28, 2016 | (JP) | 2016-189426 |

(51) Int. Cl.
H01L 29/66 (2006.01)
H01L 29/786 (2006.01)

(52) U.S. Cl.
CPC .... *H01L 29/7869* (2013.01); *H01L 29/78648* (2013.01); *H01L 29/78696* (2013.01)

(56) References Cited

U.S. PATENT DOCUMENTS

| 5,744,864 | A | 4/1998 | Cillessen et al. |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,909,114 | B1 | 6/2005 | Yamazaki |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,172,928 | B2 | 2/2007 | Yamazaki |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,439,543 | B2 | 10/2008 | Yamazaki |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,049,275 | B2 | 11/2011 | Yamazaki |
| 8,148,259 | B2 | 4/2012 | Arai et al. |
| 8,680,532 | B2 | 3/2014 | Yamazaki |
| 8,952,377 | B2 | 2/2015 | Yamazaki et al. |
| 8,957,422 | B2 | 2/2015 | Yamazaki |
| 9,196,745 | B2 | 11/2015 | Yamazaki et al. |
| 9,406,760 | B2 | 8/2016 | Shimomura et al. |
| 9,530,897 | B2 | 12/2016 | Yamazaki et al. |
| 9,559,174 | B2 | 1/2017 | Shimomura et al. |
| 9,590,050 | B2 | 3/2017 | Hitora et al. |
| 9,627,460 | B2 | 4/2017 | Yamazaki |
| 9,806,201 | B2 | 10/2017 | Yamazaki et al. |
| 9,929,279 | B2 | 3/2018 | Yamazaki et al. |
| 10,043,918 | B2 | 8/2018 | Yamazaki et al. |
| 10,680,116 | B2 | 6/2020 | Yamazaki et al. |
| 2001/0046027 | A1 | 11/2001 | Tai et al. |
| 2002/0054461 | A1 | 5/2002 | Fujiwara et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199879 | A1 | 9/2005 | Hoffman et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Theiss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0093072 | A1 | 4/2007 | Fukuda et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0123130 | A1 | 5/2010 | Akimoto et al. |
| 2013/0099229 | A1* | 4/2013 | Wakana ............ H01L 29/7869 257/43 |
| 2014/0361304 | A1* | 12/2014 | Cho ................ H01L 29/78696 257/66 |
| 2015/0214248 | A1 | 7/2015 | Chou |
| 2015/0318171 | A1 | 11/2015 | Yamazaki |
| 2015/0318359 | A1 | 11/2015 | Shimomura et al. |
| 2016/0056043 | A1 | 2/2016 | Tanaka et al. |
| 2016/0079089 | A1 | 3/2016 | Koezuka et al. |
| 2016/0126283 | A1 | 5/2016 | Ohmaru |
| 2017/0069765 | A1 | 3/2017 | Yamazaki et al. |

(56) References Cited

U.S. PATENT DOCUMENTS

| | | | |
|---|---|---|---|
| 2017/0141233 | A1 | 5/2017 | Shimomura et al. |
| 2018/0366588 | A1 | 12/2018 | Yamazaki et al. |
| 2020/0052127 | A1 | 2/2020 | Yamazaki et al. |

FOREIGN PATENT DOCUMENTS

| | | |
|---|---|---|
| CN | 101136330 A | 3/2008 |
| CN | 101740637 A | 6/2010 |
| CN | 102403361 A | 4/2012 |
| EP | 1003223 A | 5/2000 |
| EP | 1733433 A | 12/2006 |
| EP | 1737044 A | 12/2006 |
| EP | 2226847 A | 9/2010 |
| EP | 2259292 A | 12/2010 |
| EP | 2942804 A | 11/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-529117 | 10/2007 |
| JP | 2010-027808 A | 2/2010 |
| JP | 2010-153802 A | 7/2010 |
| JP | 2015-181151 A | 10/2015 |
| JP | 2015-181161 A | 10/2015 |
| JP | 2015-189631 A | 11/2015 |
| JP | 2015-195384 A | 11/2015 |
| JP | 2016-046530 A | 4/2016 |
| JP | 2016-056446 A | 4/2016 |
| JP | 2016-063225 A | 4/2016 |
| JP | 2016-066776 A | 4/2016 |
| JP | 2016-074580 A | 5/2016 |
| JP | 2016-092824 A | 5/2016 |
| KR | 2007-0006770 A | 1/2007 |
| KR | 2010-0056970 A | 5/2010 |
| KR | 2015-0125555 A | 11/2015 |
| KR | 2015-0126272 A | 11/2015 |
| TW | 200534367 | 10/2005 |
| TW | 201036160 | 10/2010 |
| TW | 201543547 | 11/2015 |
| WO | WO-2004/114391 | 12/2004 |
| WO | WO-2005/093847 | 10/2005 |
| WO | WO-2015/132697 | 9/2015 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "p. 9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YBFe2O4, and YB2Fe3O7 Types of Structures for Compounds in the In2O3 and SC2O3—A2O3—BO Systems [A; Fe, Ga, or Al; B: Mg, Mn, Fe, Nl, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge To Future Displays: Transparent AM-OLED Driven by Peald Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW' 09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Wager.J, "Oxide TFTs: A Progress Report", Information Display, 2016, vol. 32, No. 1, pp. 16-21.

International Search Report (Application No. PCT/IB2017/053100) dated Aug. 22, 2017.

Written Opinion (Application No. PCT/IB2017/053100) dated Aug. 22, 2017.

Taiwanese Office Action (Application No. 106117926) dated Jan. 20, 2021.

\* cited by examiner $\Delta CB_{001} > \Delta CB_{002}$
$CB_{001} \approx CB_{002}$ $CB_{001} > CB_{002}$ $\Delta CB_{001} > \Delta CB_{002} > 0$

700

○ : In
● : Ga
● : Zn
○ : O

FIG. 21A
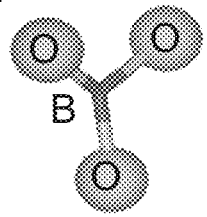
FIG. 21B Valence band　　Conduction band
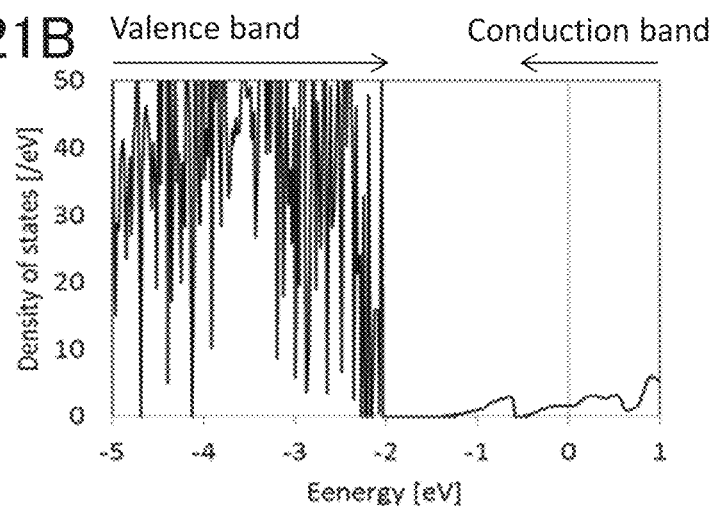
FIG. 21C
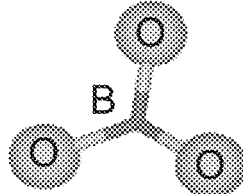
FIG. 21D Valence band　　Conduction band
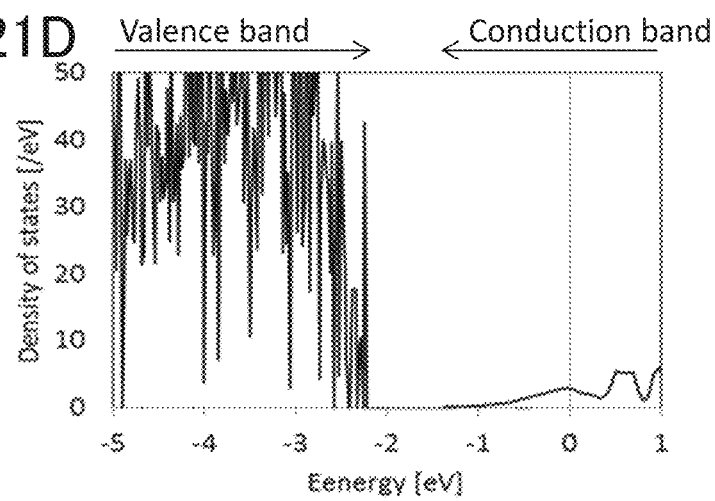

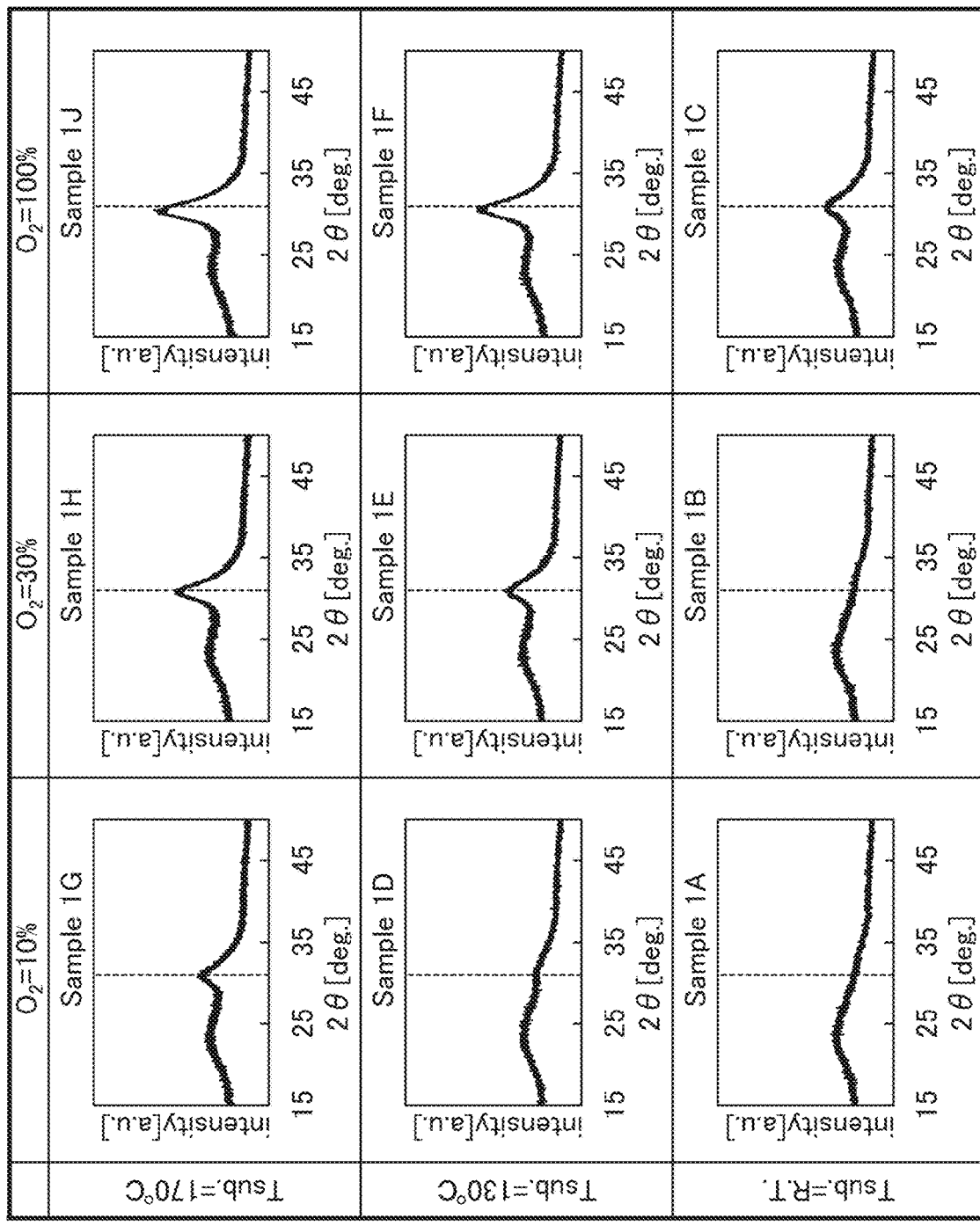

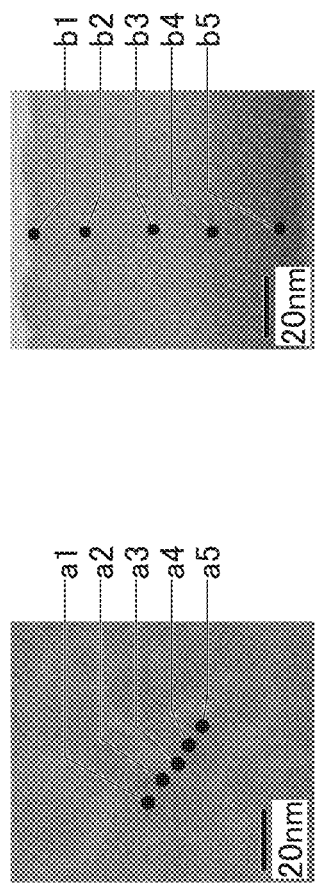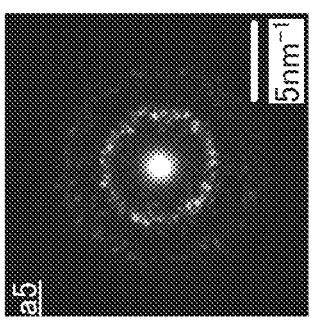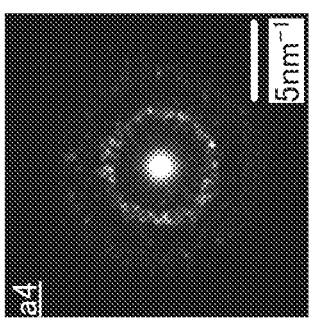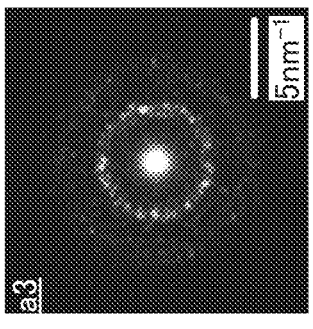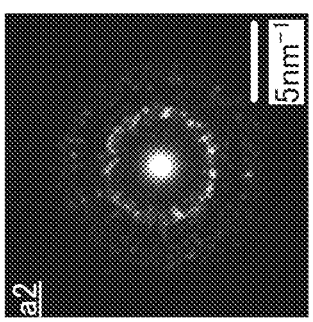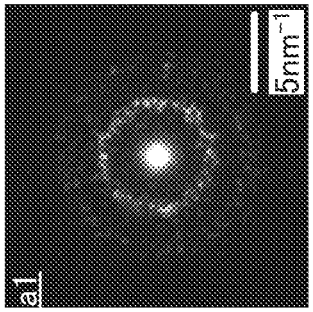
FIG. 25A FIG. 25B FIG. 25C FIG. 25D FIG. 25E FIG. 25F FIG. 25G FIG. 25H FIG. 25I FIG. 25J FIG. 25K FIG. 25L lattice point Voronoi region Voronoi point

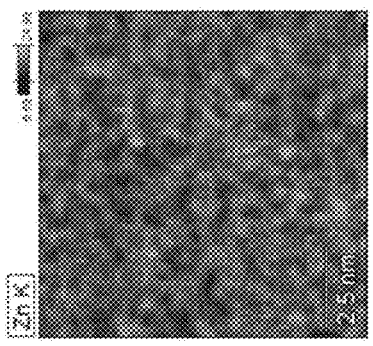
FIG. 30D
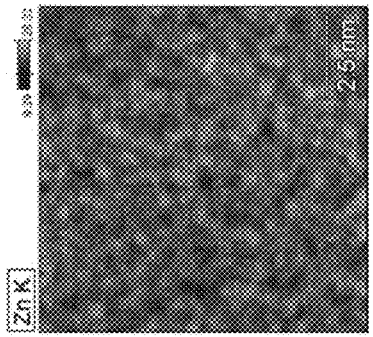
FIG. 30H
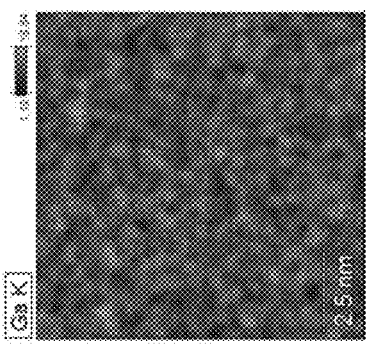
FIG. 30C
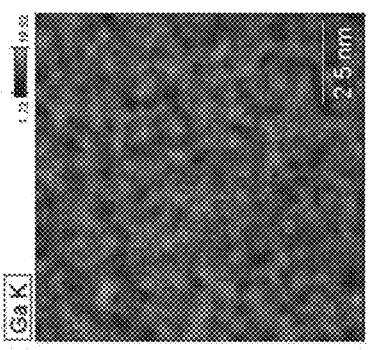
FIG. 30G
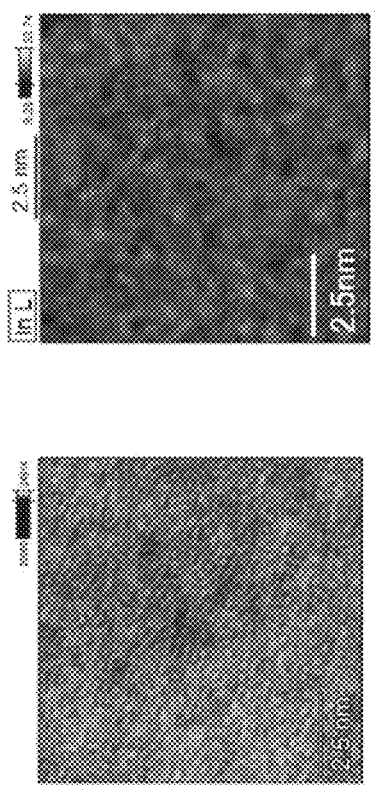
FIG. 30B
FIG. 30F
FIG. 30A
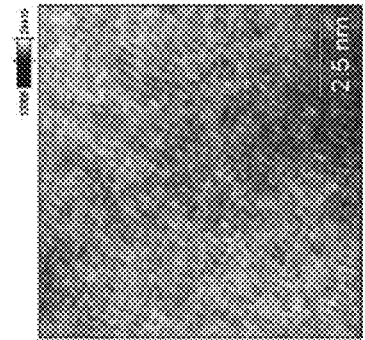
FIG. 30E

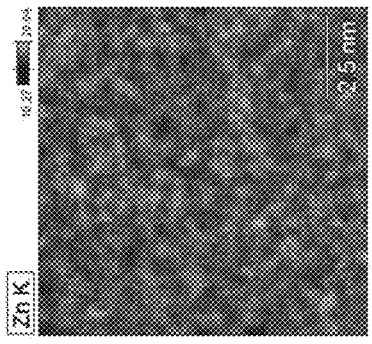
FIG. 31-3D
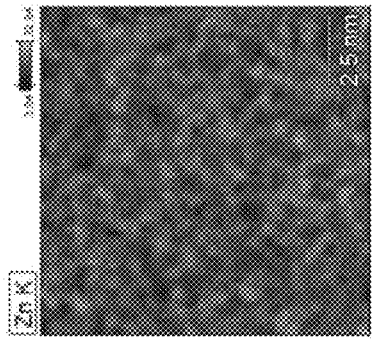
FIG. 31-3H
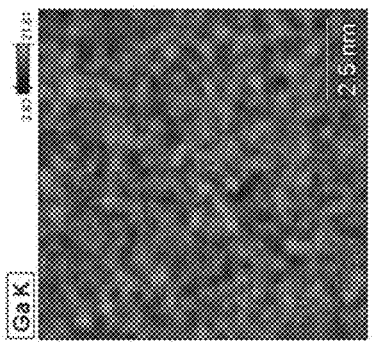
FIG. 31-3C
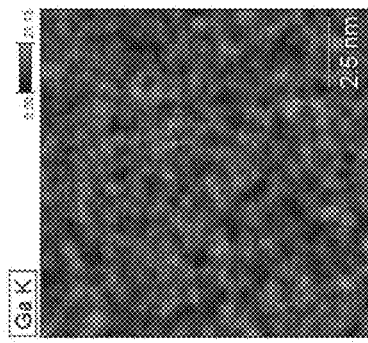
FIG. 31-3G
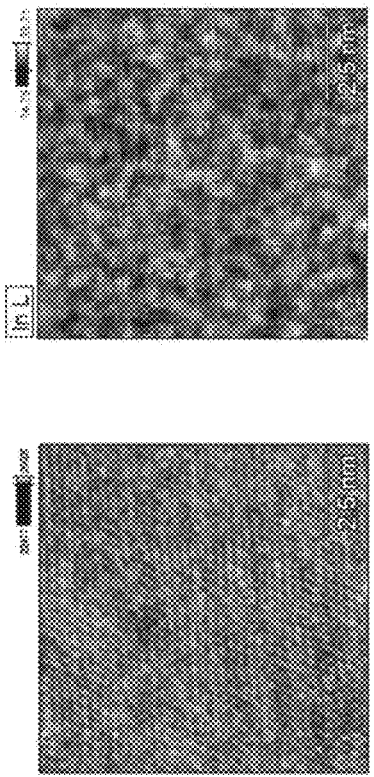
FIG. 31-3B
FIG. 31-3F
FIG. 31-3A
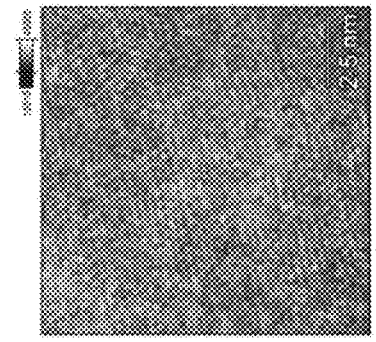
FIG. 31-3E

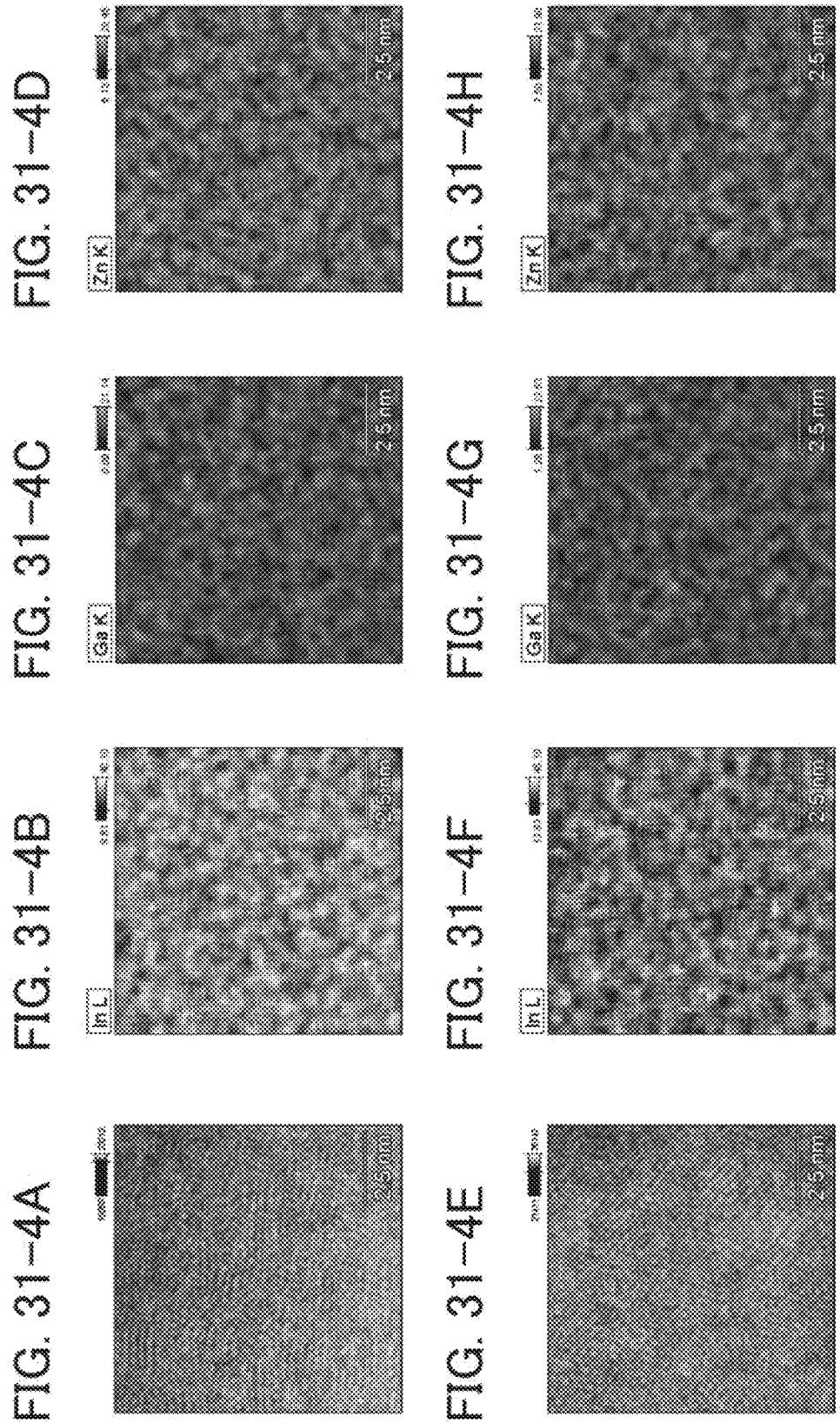

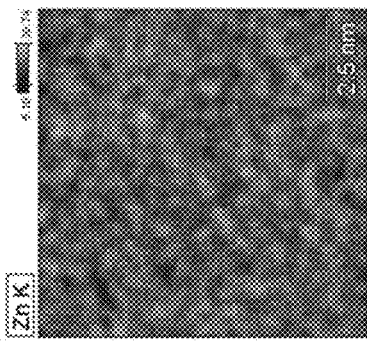
FIG. 31-5A
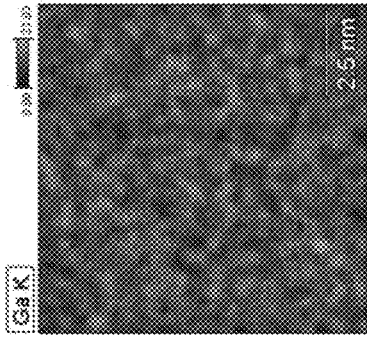
FIG. 31-5B
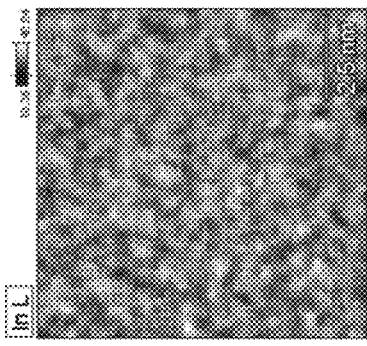
FIG. 31-5C
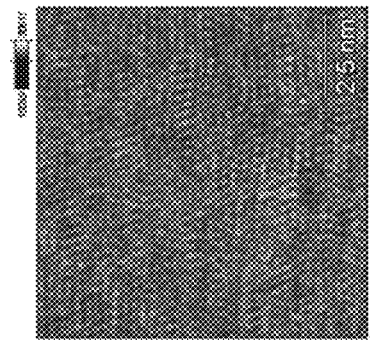
FIG. 31-5D
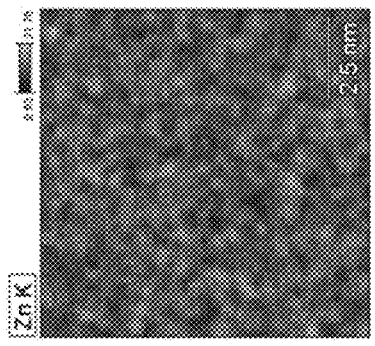
FIG. 31-5E
FIG. 31-5F
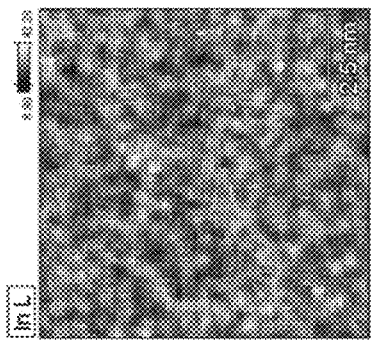
FIG. 31-5G
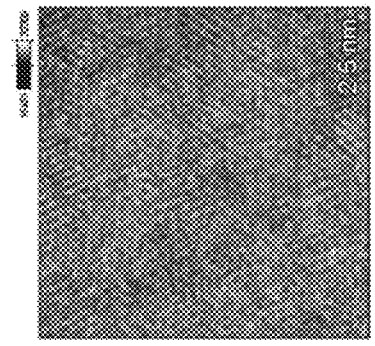
FIG. 31-5H

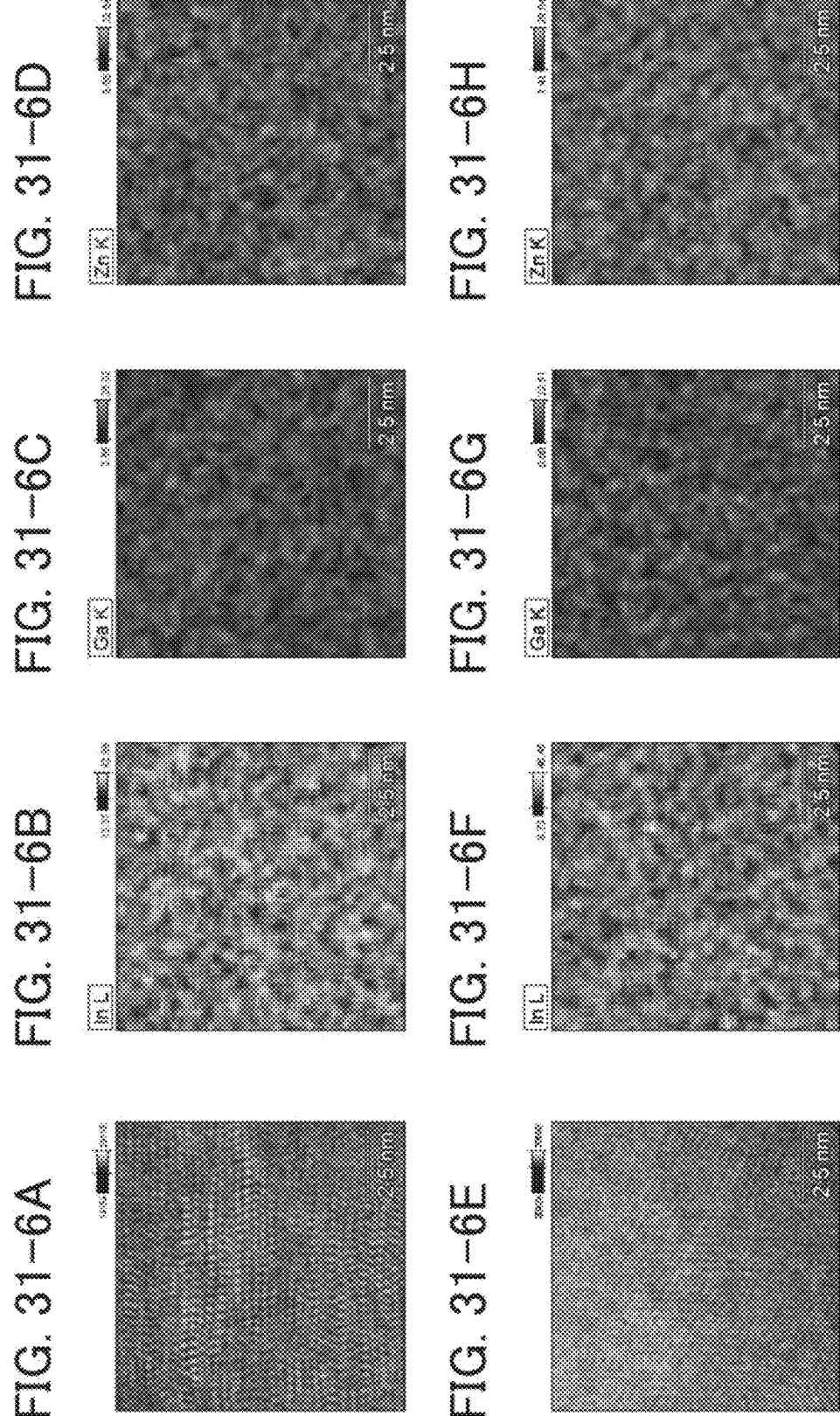

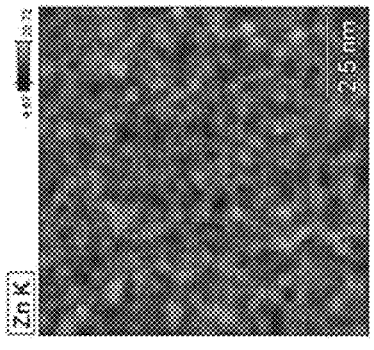
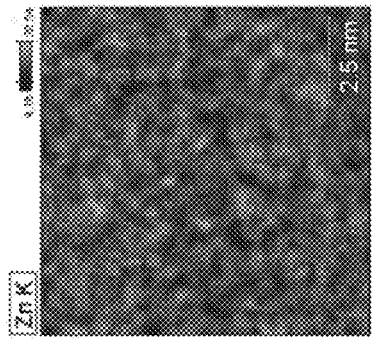
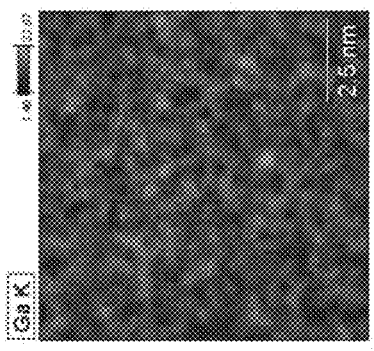
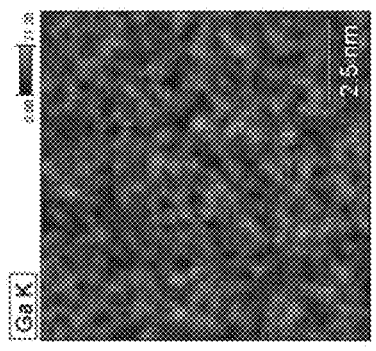
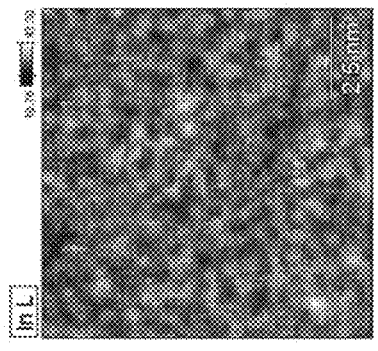
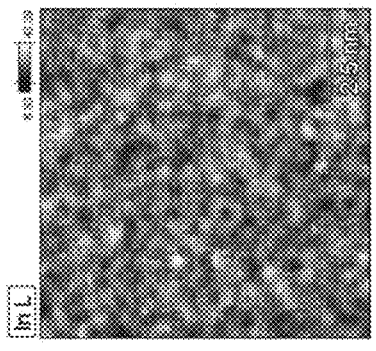
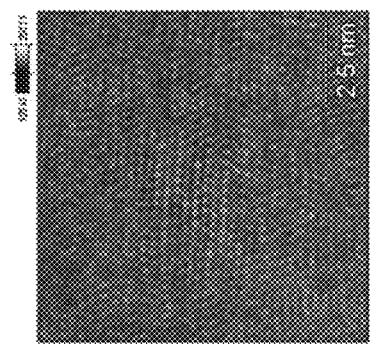
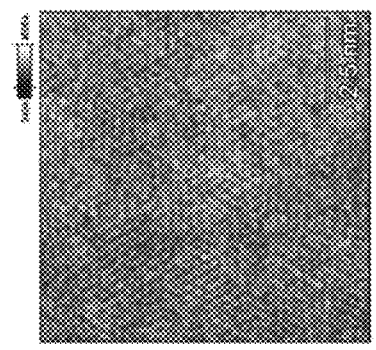

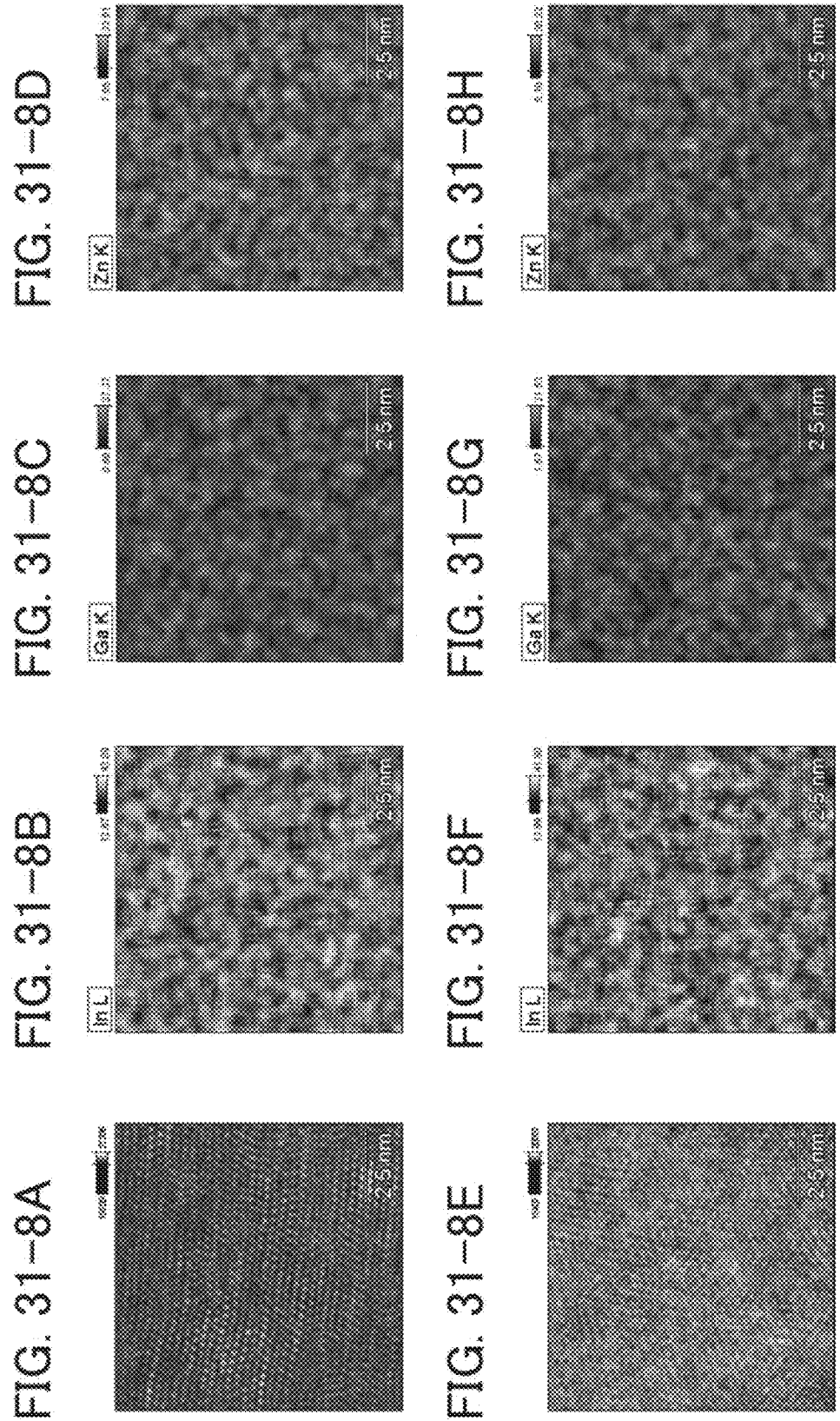

10 nm 10 nm 10 nm 10 nm 10 nm 10 nm

| shapes | proportions [%] |
|---|---|
| pentagon | 23.6% |
| hexagon | 52.5% |
| heptagon | 21.1% |
| others | 2.8% |

| shapes | proportions [%] |
|---|---|
| pentagon | 23.3% |
| hexagon | 53.0% |
| heptagon | 20.7% |
| others | 3.0% |

| shapes | proportions [%] |
|---|---|
| pentagon | 15.9% |
| hexagon | 67.3% |
| heptagon | 14.8% |
| others | 2.0% |

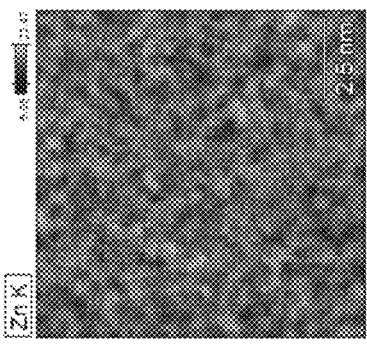
FIG. 39A
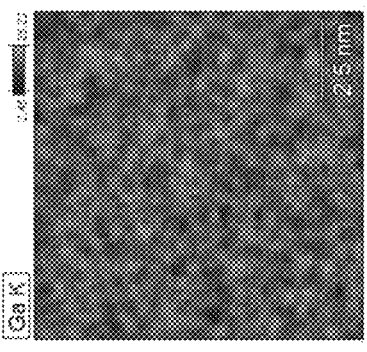
FIG. 39B
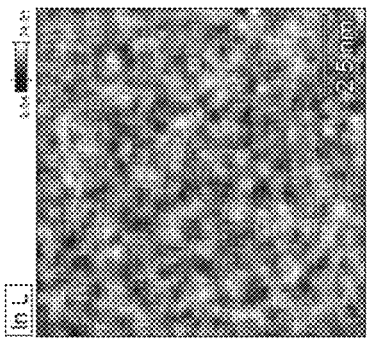
FIG. 39C
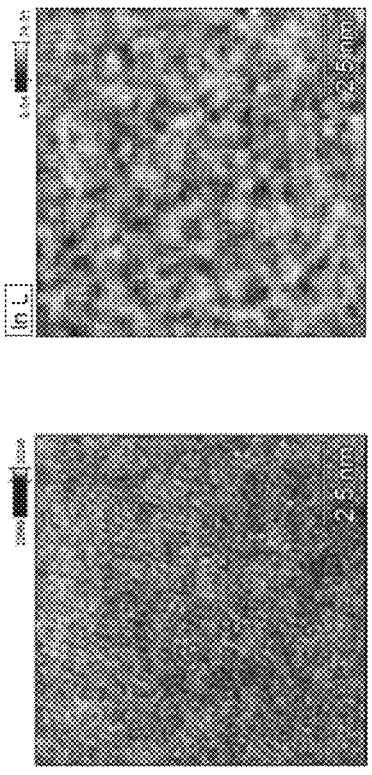
FIG. 39D
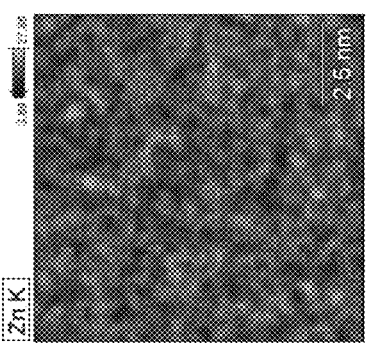
FIG. 39E
FIG. 39F
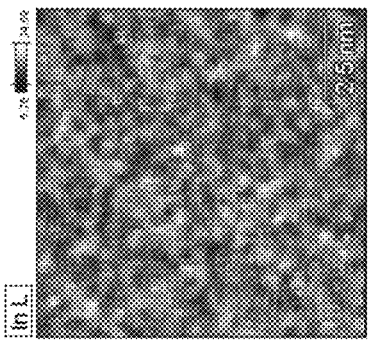
FIG. 39G
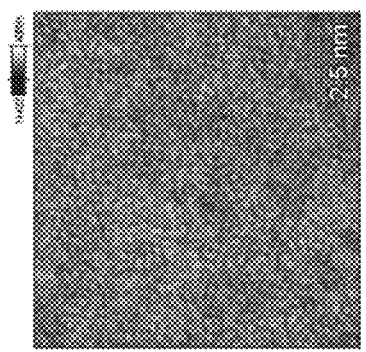
FIG. 39H

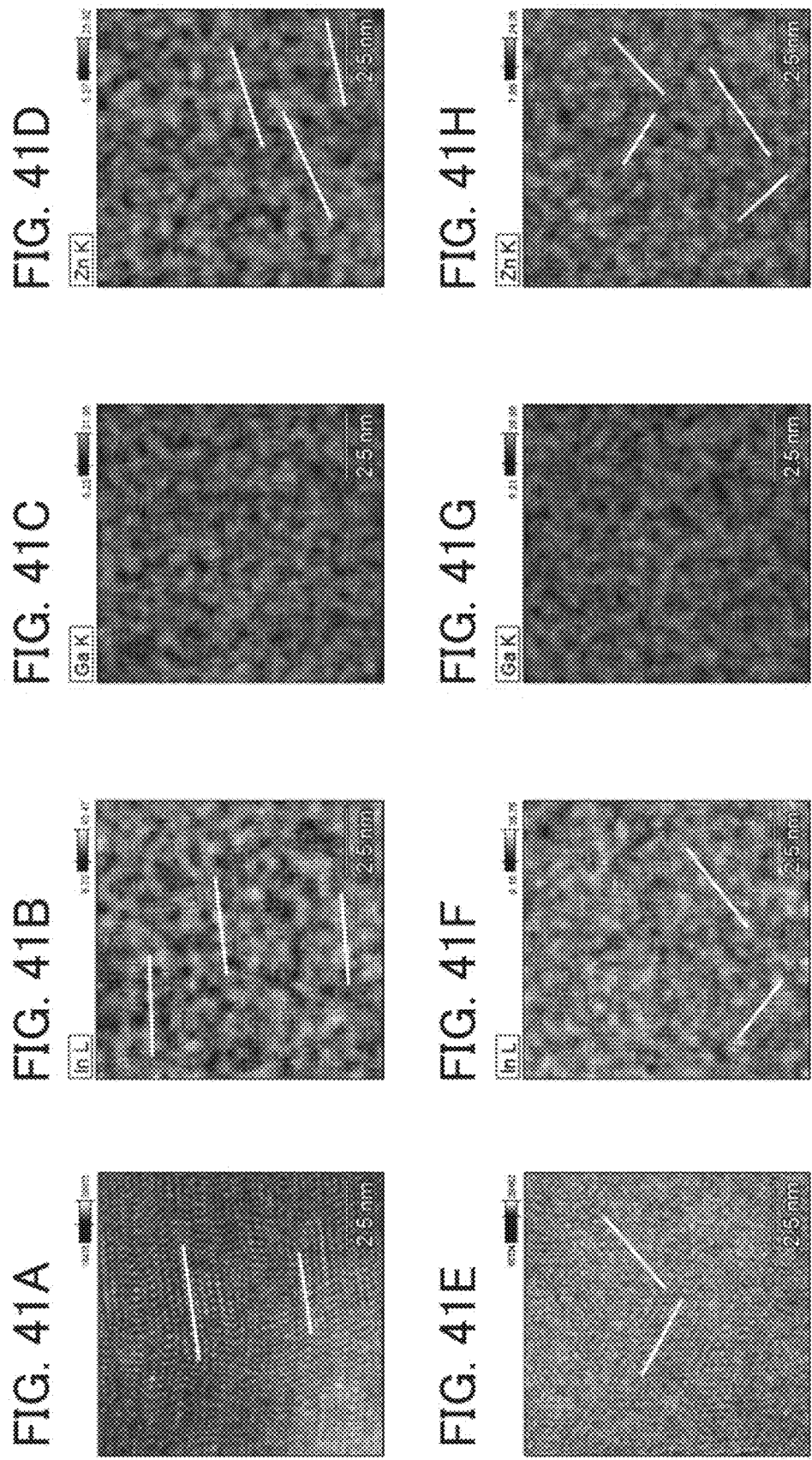

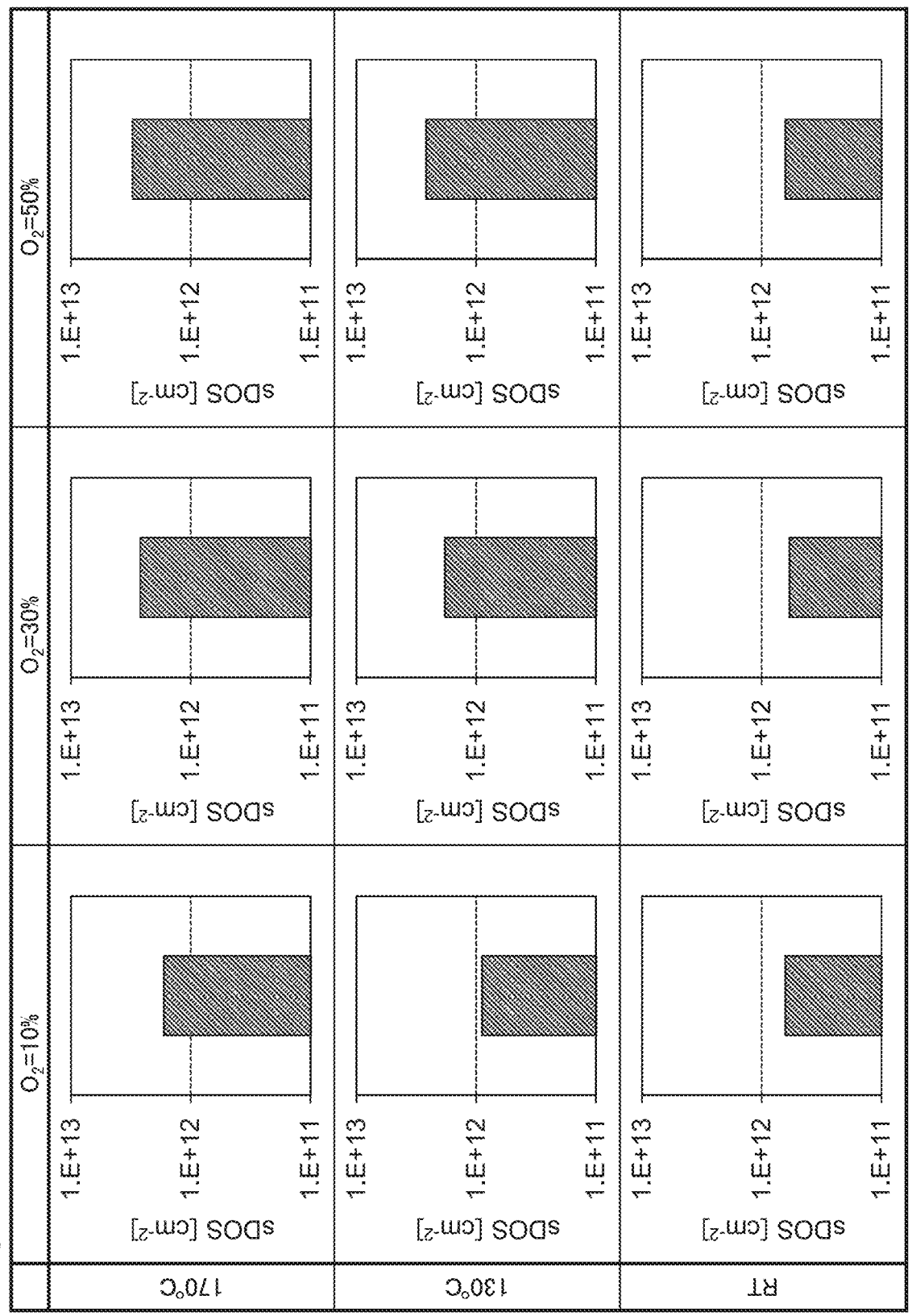

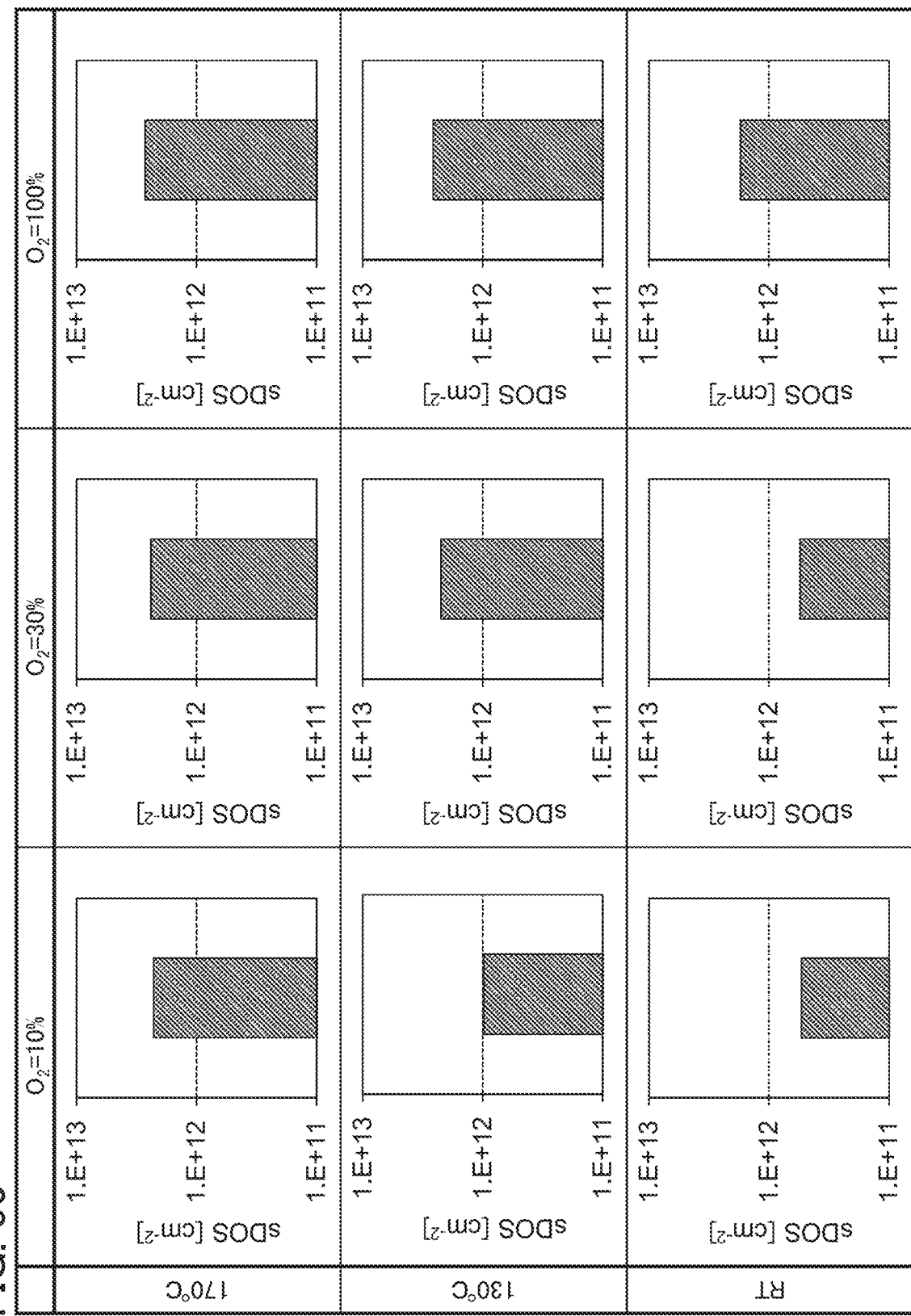

METAL OXIDE AND FIELD-EFFECT TRANSISTOR

TECHNICAL FIELD

The present invention relates to an object, a method, or a manufacturing method. The present invention relates to a process, a machine, manufacture, or a composition of matter. In particular, one embodiment of the present invention relates to a metal oxide or a manufacturing method of the metal oxide. In particular, one embodiment of the present invention relates to a semiconductor device, a display device, a liquid crystal display device, a light-emitting device, a power storage device, a memory device, a method for driving them, or a method for manufacturing them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

BACKGROUND ART

For example, a technique in which a transistor is fabricated using an In—Ga—Zn-based metal oxide is disclosed (for example, see Patent Document 1).

Non-Patent Document 1 discusses a structure in which an active layer of a transistor includes two layers of metal oxides of an In—Zn oxide and an In—Ga—Zn oxide.

REFERENCE

Patent Document

[Patent Document 1] Japanese Published Patent Application No. 2007-096055

Non-Patent Document

[Non-Patent Document 1] John F. Wager, "Oxide TFTs: A Progress Report", Information Display 1/16, SID 2016, January/February 2016, Vol. 32, No. 1, pp. 16-21

DISCLOSURE OF INVENTION

In Non-Patent Document 1, a channel-protective bottom-gate transistor achieves high field-effect mobility ($\mu$=62 $cm^2V^{-1}s^{-1}$). An active layer of the transistor is a two-layer stack of an indium zinc oxide and an IGZO, and the thickness of the indium zinc oxide where a channel is formed is 10 nm. However, the S value (the subthreshold swing (SS)), which is one of transistor characteristics, is as large as 0.41 V/decade. Moreover, the threshold voltage ($V_{th}$), which is also one of transistor characteristics, is −2.9 V, which means that the transistor has a normally-on characteristic.

In view of the above problems, an object of one embodiment of the present invention is to provide a novel metal oxide. Another object of one embodiment of the present invention is to give favorable electrical characteristics to a semiconductor device. Another object of one embodiment of the present invention is to provide a highly reliable semiconductor device. Another object of one embodiment of the present invention is to provide a semiconductor device with a novel structure. Another object of one embodiment of the present invention is to provide a display device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a field-effect transistor including a metal oxide. A channel formation region of the transistor includes a material having at least two different energy band widths. The material includes nano-size particles each with a size of greater than or equal to 0.5 nm and less than or equal to 10 nm. The nano-size particles are dispersed or distributed in a mosaic pattern.

Another embodiment of the present invention is a field-effect transistor including a metal oxide. A channel formation region of the transistor includes a material having at least two different energy band widths. The material includes nano-size particles with a size of greater than or equal to 0.5 nm and less than or equal to 10 nm. The nano-size particles are dispersed or distributed in a mosaic pattern. The channel formation region includes a path through which carriers easily flow from a source to a drain.

In the above embodiment, the material having two different energy band widths preferably includes a first material having a first energy band width and a second material having a second energy band width. The first material preferably includes In or Zn. The second material preferably includes one or more of In, Zn, Al, Ga, Si, B, Y, Ti, Fe, Ni, Ge, Zr, Mo, La, Ce, Nd, Hf, Ta, W, Mg, V, Be, and Cu. The second energy band width is preferably larger than the first energy band width.

In the above embodiment, the first material preferably includes In and Zn, and the second material preferably includes In, Ga, and Zn.

In the above embodiment, the first energy band width is preferably 2.4 eV or a value in the vicinity thereof, and the second energy band width is preferably greater than or equal to 3.0 eV and less than or equal to 4.0 eV.

In the above embodiment, the second material preferably includes more Ga, Al, or Si than the first material.

In the above embodiment, the second material preferably includes more Ga than the first material.

Another embodiment of the present invention is a field-effect transistor including a metal oxide. A channel formation region of the transistor includes a material having at least two different energy band widths. The material includes nano-size particles each with a size of greater than or equal to 0.5 nm and less than or equal to 10 nm. The nano-size particles are dispersed or distributed in a mosaic pattern. In the case where a gate voltage is applied to the transistor in the forward direction, the material having at least two different energy band widths has a first function of allowing each carrier to flow from a source to a drain. In the case where a gate voltage is applied to the transistor in the reverse direction, the material having at least two different energy band widths has a second function of preventing each carrier from flowing from the source to the drain.

In the above embodiment, the first function preferably makes the material having at least two different energy band widths each narrower than an energy band width in the case where the gate voltage is held at 0 V, and the second function preferably makes the material having at least two different energy band widths each wider than an energy band width in the case where the gate voltage is held at 0 V.

In the above embodiment, the nano-size particles preferably include a region where their surroundings are blurred like a cloud and overlap with each other.

According to one embodiment of the present invention, a novel metal oxide can be provided. According to one embodiment of the present invention, a semiconductor device with favorable electrical characteristics can be provided. A highly reliable semiconductor device can be provided. A semiconductor device with a novel structure can be provided. A display device with a novel structure can be provided.

Note that the descriptions of these effects do not preclude the existence of other effects. One embodiment of the present invention does not necessarily achieve all the effects listed above. Other effects will be apparent from and can be derived from the descriptions of the specification, the drawings, the claims, and the like.

BRIEF DESCRIPTION OF DRAWINGS

FIGS. 21A to 21D illustrate local structures of models of metal oxides to which impurities are added in one embodiment and their densities of states.

FIG. 23 shows measured XRD spectra of samples of Example.

FIGS. 25A to 25L show a plan-view TEM image, a cross-sectional TEM image, and electron diffraction patterns of a sample of Example.

FIGS. 30A to 30H show a plan-view TEM image, a cross-sectional TEM image, and EDX mapping images of a sample of Example.

FIGS. 31-2A to 31-9H show plan-view TEM images, cross-sectional TEM images, and EDX mapping images of samples of Example.

FIGS. 39A to 39H show a plan-view TEM image, a cross-sectional TEM image, and EDX mapping images of a sample of Example.

FIGS. 41A to 41H show a plan-view TEM image, a cross-sectional TEM image, and EDX mapping images of a sample of Example.

FIG. 49 shows calculation results of a density of defect states.

FIG. 50 shows calculation results of a density of defect states.

BEST MODE FOR CARRYING OUT THE INVENTION

Figure 1:
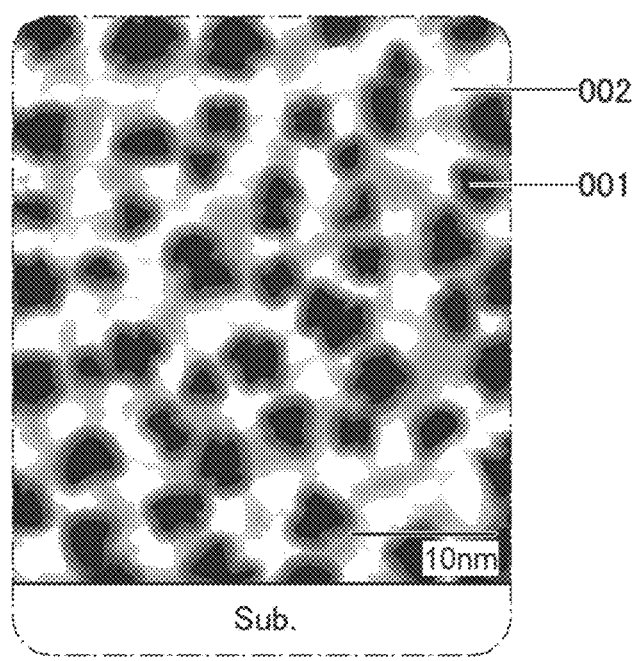
FIG. 1 is a conceptual view of a composition of a metal oxide.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, a "silicon oxynitride film" refers to a film that includes oxygen at a higher proportion than nitrogen, and a "silicon nitride oxide film" refers to a film that includes nitrogen at a higher proportion than oxygen.

In the description of modes of the present invention in this specification and the like with reference to the drawings, the same components in different drawings are commonly denoted by the same reference numeral in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "film" and "layer" can be interchanged with each other depending on the case. For example, the term "conductive layer" can be changed into the term "conductive film" in some cases. Also, the term "insulating film" can be changed into the term "insulating layer" in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 (1≤Ga≤3) and Zn is greater than or equal to 2 and less than or equal to 4 (2≤Zn≤4). "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 (0.1<Ga≤2) and Zn is greater than or equal to 5 and less than or equal to 7 (5≤Zn≤7). "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 (0.1<Ga≤2) and Zn is greater than 0.1 and less than or equal to 2 (0.1<Zn≤2).

Embodiment 1

In this embodiment, a metal oxide of one embodiment of the present invention is described.

The metal oxide of one embodiment of the present invention preferably contains at least indium. In particular, indium and zinc are preferably contained. In addition, an element M (the element M is one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) may be contained.

The metal oxide of one embodiment of the present invention preferably contains nitrogen. Specifically, the nitrogen concentration in the metal oxide of one embodiment of the present invention measured by secondary ion mass spectrometry (SIMS) may be $1\times10^{16}$ atoms/cm$^3$ or higher, preferably $1\times10^{17}$ atoms/cm$^3$ or higher and $2\times10^{22}$ atoms/cm$^3$ or lower. Note that a metal oxide to which nitrogen is added tends to have a smaller band gap and thus have improved conductivity. Thus, in this specification and the like, the metal oxide of one embodiment of the present invention includes a metal oxide to which nitrogen or the like is added. Moreover, a metal oxide containing nitrogen may be referred to as metal oxynitride.

Here, the case where the metal oxide contains indium, the element M, and zinc is considered. The terms of the atomic ratio of indium to the element M and zinc contained in the metal oxide are denoted by [In], [M], and [Zn], respectively.

<Composition of Metal Oxide>

FIG. 1 is a conceptual view of a metal oxide having a cloud-aligned complementary (CAC) composition in the present invention. In this specification, a metal oxide of one embodiment of the present invention having a semiconductor function is defined as a cloud-aligned complementary oxide semiconductor (CAC-OS).

The CAC-OS or the CAC-metal oxide is referred to as a matrix composite or a metal matrix composite in some cases. Thus, CAC-OS may be called a cloud-aligned complementary OS.

For example, in the CAC-OS, as illustrated in FIG. 1, elements included in the metal oxide are unevenly distributed, and regions 001 mainly including an element and regions 002 mainly including another element are formed. The regions 001 and 002 are mixed to form a mosaic pattern. In other words, the CAC-OS has a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

For example, an In-M-Zn oxide having the CAC composition has a composition in which materials are separated into an indium oxide (InO$_{X1}$, where X1 is a real number greater than 0) or an indium zinc oxide (In$_{X2}$Zn$_{Y2}$O$_{Z2}$, where X2, Y2, and Z2 are real numbers greater than 0), an oxide including the element M, and the like, and a mosaic pattern is formed. Then, InO$_{X1}$ or In$_{X2}$Zn$_{Y2}$O$_{Z2}$ forming the mosaic pattern is distributed in the film. Hereinafter, this composition is also referred to as a cloud-like composition.

In other words, the metal oxide of one embodiment of the present invention includes at least two oxides or materials selected from an In oxide, an In-M oxide, an M oxide, an M-Zn oxide, an In—Zn oxide, and an In-M-Zn oxide.

Typically, the metal oxide of one embodiment of the present invention includes at least two or more oxides selected from an In oxide, an In—Zn oxide, an In—Al—Zn oxide, an In—Ga—Zn oxide, an In—Y—Zn oxide, an In—Cu—Zn oxide, an In—V—Zn oxide, an In—Be—Zn oxide, an In—B—Zn oxide, an In—Si—Zn oxide, an In—Ti—Zn oxide, an In—Fe—Zn oxide, an In—Ni—Zn oxide, an In—Ge—Zn oxide, an In—Zr—Zn oxide, an In—Mo—Zn oxide, an In—La—Zn oxide, an In—Ce—Zn oxide, an In—Nd—Zn oxide, an In—Hf—Zn oxide, an In—Ta—Zn oxide, an In—W—Zn oxide, and an In—Mg—Zn oxide. That is, the metal oxide of one embodiment of the present invention can be referred to as a composite metal oxide including a plurality of materials or a plurality of components.

Here, let a concept in FIG. 1 illustrate an In-M-Zn oxide with the CAC composition. In this case, it can be said that the region 001 is a region including an oxide including the element M as a main component and the region 002 is a region including In$_{X2}$Zn$_{Y2}$O$_{Z2}$ or InO$_{X1}$ as a main component. Surrounding portions of the region including an oxide including the element M as a main component, the region including In$_{X2}$Zn$_{Y2}$O$_{Z2}$ or InO$_{X1}$ as a main component, and a region including at least Zn are unclear (blurred), so that boundaries are not clearly observed in some cases.

In other words, an In-M-Zn oxide with the CAC composition is a metal oxide in which a region including an oxide including the element M as a main component and a region including In$_{X2}$Zn$_{Y2}$O$_{Z2}$ or InO$_{X1}$ as a main component are mixed. Accordingly, the metal oxide is referred to as a composite metal oxide in some cases. Note that in this specification, for example, when the atomic ratio of In to the element M in the region 002 is greater than the atomic ratio of In to the element M in the region 001, the region 002 has higher In concentration than the region 001.

Note that in the metal oxide having the CAC composition, a stacked-layer structure including two or more films with different compositions is not included. For example, a two-layer structure of a film including In as a main component and a film including Ga as a main component is not included.

Specifically, of the CAC-OS, an In—Ga—Zn oxide with the CAC composition (such an In—Ga—Zn oxide may be particularly referred to as CAC-IGZO) is described. In the In—Ga—Zn oxide including a CAC-OS, materials are separated into InO$_{X1}$ or In$_{X2}$Zn$_{Y2}$O$_{Z2}$ and an oxide including gallium, for example, and a mosaic pattern is formed. InO$_{X1}$ or In$_{X2}$Zn$_{Y2}$O$_{Z2}$ forming the mosaic pattern is a cloud-like metal oxide.

In other words, an In—Ga—Zn oxide including a CAC-OS is a composite metal oxide having a composition in which a region including an oxide including gallium as a main component and a region including In$_{X2}$Zn$_{Y2}$O$_{Z2}$ or InO$_{X1}$ as a main component are mixed. Surrounding portions of the region including an oxide including gallium as a main component and the region including In$_{X2}$Zn$_{Y2}$O$_{Z2}$ or InO$_{X1}$ as a main component are unclear (blurred), so that boundaries are not clearly observed in some cases.

For example, in the conceptual view in FIG. 1, the region 001 corresponds to the region including an oxide including gallium as a main component and the region 002 corresponds to the region including In$_{X2}$Zn$_{Y2}$O$_{Z2}$ or InO$_{X1}$ as a main component. The region including an oxide including gallium as a main component and the region including In$_{X2}$Zn$_{Y2}$O$_{Z2}$ or InO$_{X1}$ as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

The sizes of the region 001 and the region 002 can be measured with energy dispersive X-ray spectroscopy (EDX) mapping images obtained by EDX. For example, the diameter of the region 001 is greater than or equal to 0.5 nm and less than or equal to 10 nm, or greater than or equal to 1 nm and less than or equal to 2 nm in the EDX mapping image of a cross-sectional photograph in some cases. The density of an element which is a main component is gradually lowered from the central portion of the region toward the surrounding portion. For example, when the number (abundance) of atoms of an element countable in an EDX mapping image gradually changes from the central portion toward the surrounding portion, the surrounding portion of the region is unclear (blurred) in the EDX mapping of the cross-sectional photograph. For example, from the central portion toward the surrounding portion in the region including $InO_{X1}$ as a main component, the number of In atoms gradually reduces and the number of Zn atoms gradually increases, so that the region including $In_{X2}Zn_{Y2}O_{Z2}$ as a main component gradually appears. Accordingly, the surrounding portion of a region including $InO_{X1}$ as a main component is unclear (blurred) in the EDX mapping image.

A crystal structure of the In—Ga—Zn oxide with the CAC composition is not particularly limited. The region 001 and the region 002 may have different crystal structures.

Here, an In—Ga—Zn—O-based metal oxide is referred to as IGZO in some cases, and a compound including In, Ga, Zn, and O is also known as IGZO. A crystalline compound can be given as an example of the In—Ga—Zn—O-based metal oxide. The crystalline compound has a single crystal structure, a polycrystalline structure, or a c-axis aligned crystalline (CAAC) structure. Note that the CAAC structure is a layered crystal structure in which a plurality of IGZO nanocrystals have c-axis alignment and are connected in the a-b plane direction without alignment.

Meanwhile, the crystal structure is a secondary element for the In—Ga—Zn oxide including a CAC-OS. In this specification, CAC-IGZO can be defined as a metal oxide including In, Ga, Zn, and O in the state where a plurality of regions including Ga as a main component and a plurality of regions including In as a main component are each dispersed randomly forming a mosaic pattern.

For example, in the conceptual view in FIG. 1, the region 001 corresponds to the region including Ga as a main component and the region 002 corresponds to the region including In as a main component. The region including Ga as a main component and the region including In as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

The crystallinity of the In—Ga—Zn oxide including a CAC-OS can be analyzed by electron diffraction. For example, a ring-like region with high luminance is observed in an electron diffraction pattern image. Furthermore, a plurality of spots are observed in the ring-shaped region in some cases.

As described above, the In—Ga—Zn oxide including a CAC-OS has a structure different from that of an IGZO compound in which metal elements are evenly distributed, and has characteristics different from those of the IGZO compound. That is, in the In—Ga—Zn oxide including a CAC-OS, regions including an oxide including gallium or the like as a main component and regions including $In_{X2}Zn_{Y2}O_{Z2}$ or $InO_{X1}$ as a main component are separated to form a mosaic pattern.

The conductivity of the region including $In_{X2}Zn_{Y2}O_{Z2}$ or $InO_{X1}$ as a main component is higher than that of the region including an oxide including gallium or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}$ $Zn_{Y2}O_{Z2}$ or $InO_{X1}$ as a main component are distributed in an oxide semiconductor like a cloud, high field-effect mobility ($\mu$) can be achieved. The region including $In_{X2}Zn_{Y2}O_{Z2}$ or $InO_{X1}$ as a main component can be said to be a semiconductor region whose properties are close to those of a conductor.

In contrast, the insulating property of the region including an oxide including gallium or the like as a main component is higher than that of the region including $In_{X2}Zn_{Y2}O_{Z2}$ or $InO_{X1}$ as a main component. In other words, when the regions including an oxide including gallium or the like as a main component are distributed in an oxide semiconductor, leakage current can be suppressed and favorable switching operation can be achieved. The region including $In_aGa_bZn_cO_d$ or the like as a main component can be said to be a semiconductor region whose properties are close to those of an insulator.

Accordingly, when the In—Ga—Zn oxide including a CAC-OS is used for a semiconductor element, the insulating property derived from the oxide including gallium or the like and the conductivity derived from $In_{X2}Zn_{Y2}O_{Z2}$ or $InO_{X1}$ complement each other, whereby high on-state current ($I_{on}$), high field-effect mobility ($\mu$), and low off-state current ($I_{off}$) can be achieved.

A semiconductor element including the In—Ga—Zn oxide including a CAC-OS has high reliability. Thus, the In—Ga—Zn oxide including a CAC-OS is suitably used in a variety of semiconductor devices typified by a display.

<Transistor Including Metal Oxide>

Next, the case where the metal oxide is used as a semiconductor in a transistor is described.

With the use of the metal oxide as a semiconductor in a transistor, the transistor can have high field-effect mobility and high switching characteristics. In addition, the transistor can have high reliability.

Figure 2A:
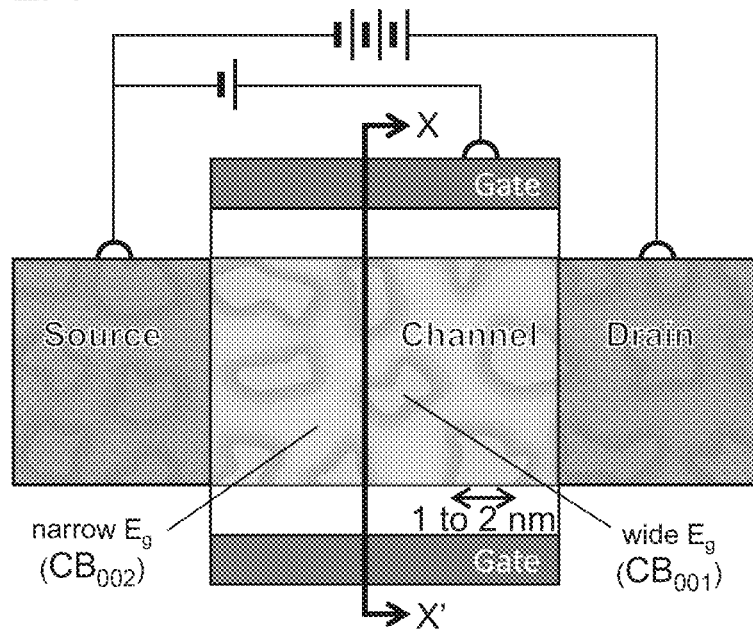
FIG. 2A is a schematic view of a transistor and FIGS. 2B and 2C are schematic views illustrating distribution of energy levels in the transistor.

FIG. 2A is a schematic view of a transistor including the metal oxide in a channel region. The transistor in FIG. 2A includes a source, a drain, a first gate, a second gate, a first gate insulating portion, a second gate insulating portion, and a channel portion. The resistance of a channel portion of a transistor can be controlled by application of a potential to a gate. That is, conduction (the on state of the transistor) or non-conduction (the off state of the transistor) between the source and the drain can be controlled by a potential applied to the first gate or the second gate.

The channel portion includes a CAC-OS in which the regions 001 having a first band gap and the regions 002 having a second band gap are distributed like a cloud. The first band gap is larger than the second band gap.

For example, the case where the In—Ga—Zn oxide with the CAC composition is used as the CAC-OS in the channel portion is described. The In—Ga—Zn oxide with the CAC composition has a composition in which materials are separated into, as the region 001, a region including $In_aGa_bZn_cO_d$ as a main component and having higher Ga concentration than the region 002, and, as the region 002, a region including $In_{X2}Zn_{Y2}O_{Z2}$ or $InO_{X1}$ as a main component and having higher In concentration than the region 001, and a mosaic pattern is formed. Then, $InO_{X1}$ or $In_{X2}Zn_{Y2}O_{Z2}$ is distributed in the film. This composition is also referred to as a cloud-like composition. The region 001 including $In_aGa_bZn_cO_d$ as a main component has a band gap larger than that of the region 002 including $In_{X2}Zn_{Y2}O_{Z2}$ or $InO_{X1}$ as a main component.

Figure 2B:
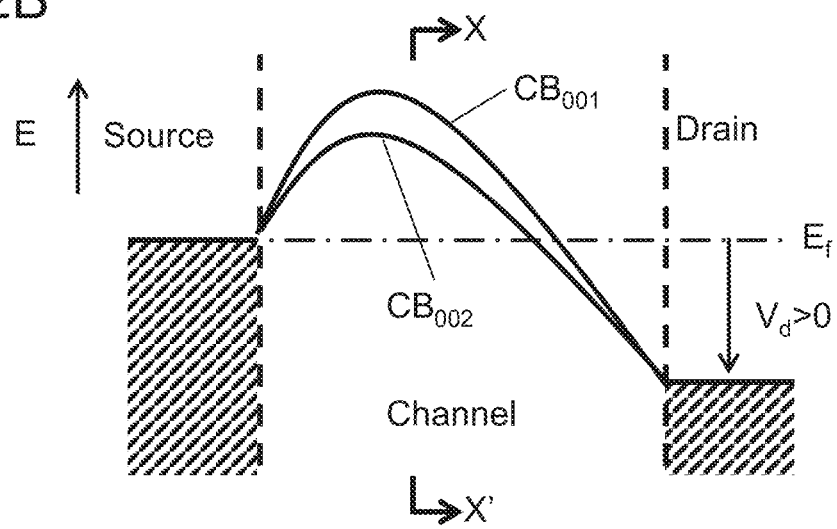
Figure 2C:
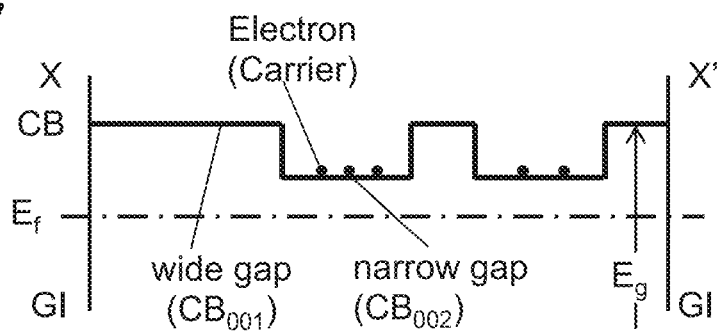

A conduction model of the transistor including the CAC-OS in the channel portion illustrated in FIG. 2A is described. FIG. 2B is a schematic view showing distribution of energy levels between the source and the drain of the transistor illustrated in FIG. 2A. FIG. 2C is a conduction band diagram on solid line X-X' in the transistor illustrated in FIG. 2A. Note that in each conduction band diagram, a solid line indicates the energy of the conduction band minimum. A dashed line $E_f$ indicates the energy of the quasi-Fermi level of electrons. Here, a negative voltage is applied between the gate and the source as a first gate voltage and a drain voltage ($V_d$>0) is applied between the source and the drain.

When a negative gate voltage is applied to the transistor illustrated in FIG. 2A, an energy of a conduction band minimum $CB_{001}$ derived from the region 001 and an energy of a conduction band minimum $CB_{002}$ derived from the region 002 are formed between the source and the drain as illustrated in FIG. 2B. Since the first band gap is larger than the second band gap, the potential barrier of the energy of the conduction band minimum $CB_{001}$ is higher than the potential barrier of the energy of the conduction band minimum $CB_{002}$. That is, the maximum value of the potential barrier in the channel portion is a value derived from the region 001. Thus, the use of the CAC-OS in the channel portion in a transistor can suppress leakage current and achieve high switching characteristics.

As illustrated in FIG. 2C, the band gap of the region 001 having the first band gap is relatively wider than the band gap of the region 002 having the second band gap; thus, the Ec edge of the region 001 having the first band gap can exist at a relatively higher level than the Ec edge of the region 002 having the second band gap.

For example, it is assumed that a component of the region 001 having the first band gap is derived from the In—Ga—Zn oxide (In:Ga:Zn=1:1:1 [atomic ratio]), and a component of the region 002 having the second band gap is derived from an In—Zn oxide (In:Zn=2:3 [atomic ratio]). In this case, the first band gap is 3.3 eV or a value in the vicinity thereof, and the second band gap is 2.4 eV or a value in the vicinity thereof. Values obtained by measurement of single films of respective materials with an ellipsometer are used as the values of the band gaps.

In the above assumption, the difference between the first band gap and the second band gap is 0.9 eV. In one embodiment of the present invention, the difference between the first band gap and the second band gap is at least 0.1 eV or more. Note that the position of the valence band maximum derived from the region 001 having the first band gap is different from the position of the valence band maximum derived from the region 002 having the second band gap in some cases; thus, the difference between the first band gap and the second band gap is preferably 0.3 eV or more, further preferably 0.4 eV or more.

In the above assumption, carriers flow through the CAC-OS owing to an In—Zn oxide which has the second band gap, i.e., a narrow band gap. At this time, the carriers overflow the second band gap into the In—Ga—Zn oxide side which has the first band gap, i.e., a wide band gap. In other words, carriers are easily generated in an In—Zn oxide which has a narrow band gap, and the carriers move to an In—Ga—Zn oxide which has a wide band gap.

In the metal oxide where the channel portion is formed, the regions 001 and the regions 002 form a mosaic pattern and are irregularly unevenly distributed. For this reason, the conduction band diagram on solid line X-X' is merely an example.

Figure 3A:
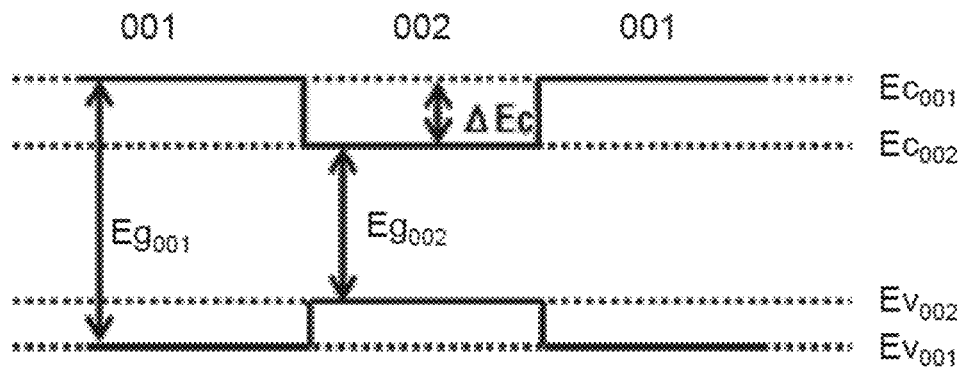
FIGS. 3A to 3C each show a model of a schematic band diagram of a transistor.

It is basically acceptable as long as a band in which the region 002 is between the regions 001 is formed as shown in FIG. 3A. Alternatively, a band in which the region 001 is between the regions 002 is formed.

Figure 3B:
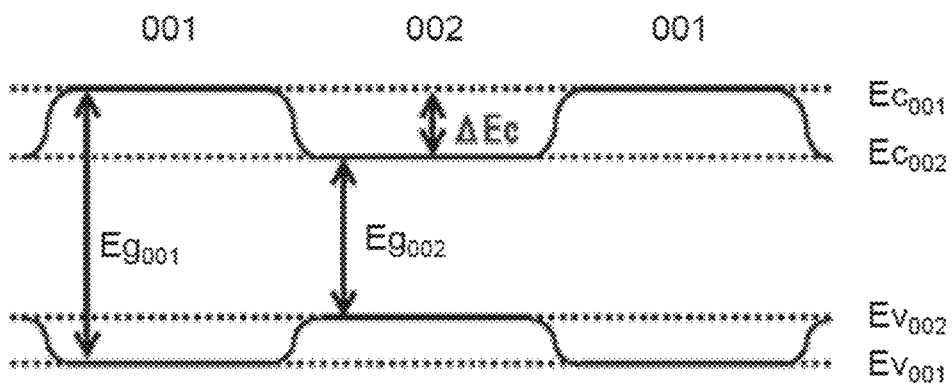
Figure 3C:
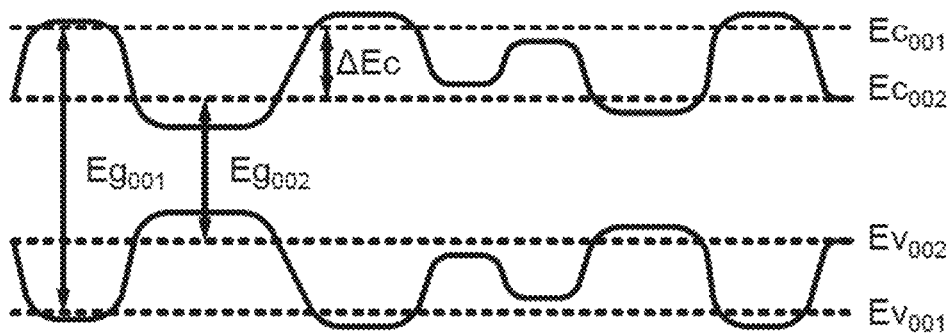

In a connection portion of the region 001 having the first band gap and the region 002 having the second band gap in the CAC-OS, fluctuations in an aggregation state and the composition of the regions occur. Accordingly, as illustrated in FIGS. 3B and 3C, the bands change not discontinuously but continuously in some cases. In other words, the first band gap and the second band gap work together when carriers flow through the CAC-OS.

Figure 4A:
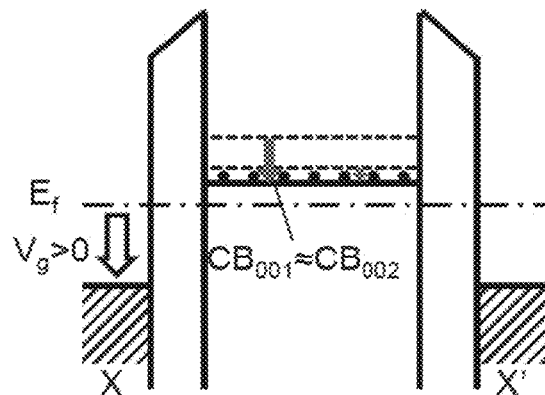
FIGS. 4A to 4C each show a model of a schematic band diagram of a transistor.
Figure 4B:
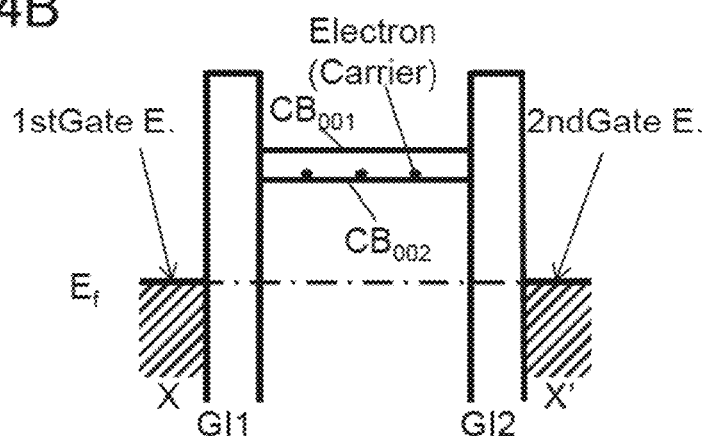
Figure 4C:
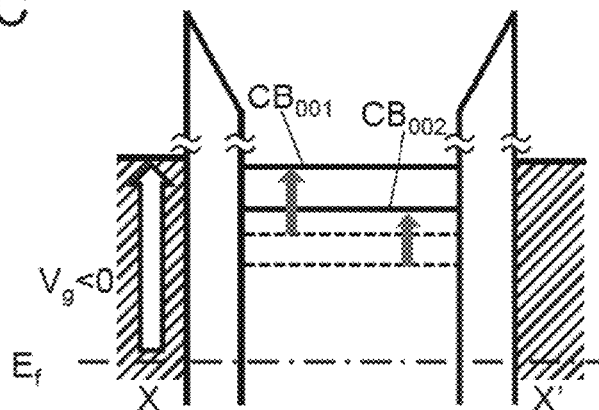

FIGS. 4A to 4C each show a model of a schematic band diagram of the transistor in a direction along X-X' in FIG. 2A, which corresponds to the schematic view in FIG. 2B. When a voltage is applied to the first gate electrode, the same voltage is simultaneously applied to the second gate electrode. FIG. 4A shows a state (on state) in which, as a first gate voltage $V_g$, a positive voltage ($V_g$>0) is applied between each of the gates and the source. FIG. 4B shows a state in which the first gate voltage $V_g$ is not applied ($V_g$=0). FIG. 4C shows a state (off state) in which, as the first gate voltage $V_g$, a negative voltage ($V_g$<0) is applied between each of the gates and the source. Note that in a channel portion, a dashed line indicates the energy of the conduction band minimum in the case where no voltage is applied, and a solid line indicates the energy of the conduction band minimum in the case where a voltage is applied. A dashed-dotted line $E_f$ indicates the energy of the quasi-Fermi level of electrons.

In a transistor including the CAC-OS in a channel portion, the region 001 having the first band gap and the region 002 having the second band gap electrically interact with each other. In other words, the region 001 having the first band gap and the region 002 having the second band gap function complementarily.

In other words, in the case where a forward voltage is applied as shown in FIG. 4A, the conduction band of the region 001 is lower than the conduction band of the region 002. Accordingly, carriers flow in not only the conduction band of the region 002 but also the conduction band of the region 001, so that a high on-state current can be obtained. Meanwhile, in the case where a reverse voltage is applied as shown in FIGS. 4B and 4C, the conduction bands of the regions 001 and 002 become higher, which probably causes a significant reduction in the current flowing between the source and the drain.

Figure 5A:
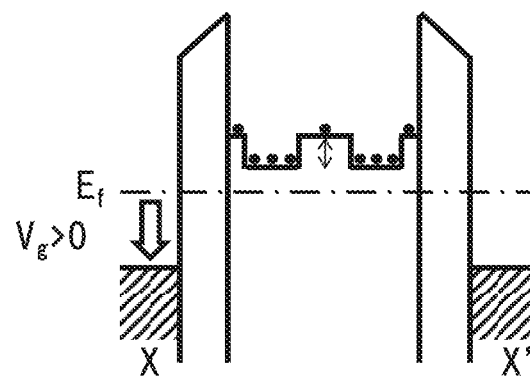
FIGS. 5A to 5C each show a model of a schematic band diagram of a transistor.
Figure 5B:
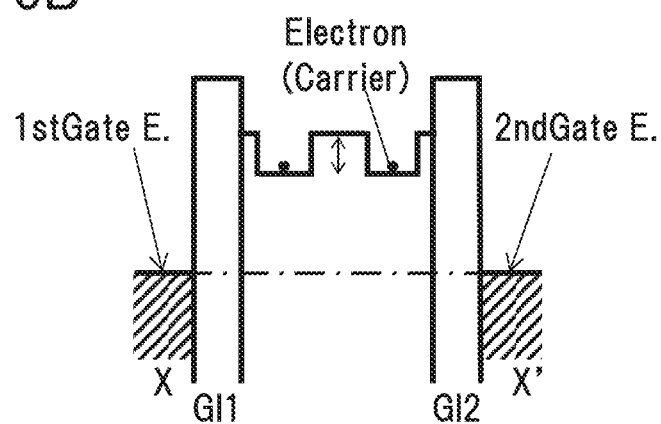
Figure 5C:
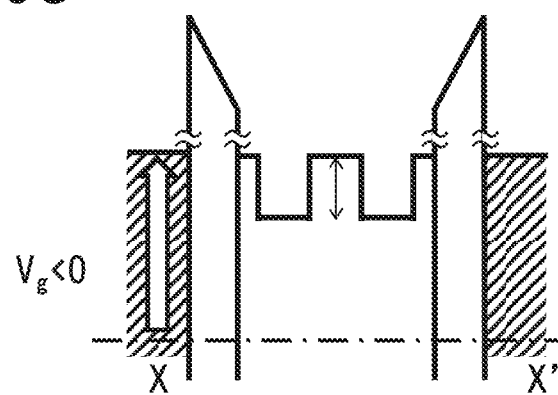

FIGS. 5A to 5C show a model of a schematic band diagram of the transistor in a direction along X-X' in FIG. 2A, which corresponds to the schematic view in FIG. 2C. When a voltage is applied to the first gate electrode, the same voltage is simultaneously applied to the second gate electrode. FIG. 5A shows a state (on state) in which, as a first gate voltage $V_g$, a positive voltage ($V_g$>0) is applied between each of the gates and the source. FIG. 5B shows a state in which the first gate voltage $V_g$ is not applied ($V_g$=0). FIG. 5C shows a state (off state) in which, as the first gate voltage $V_g$, a negative voltage ($V_g$<0) is applied between each of the gates and the source. Note that in a channel portion, a solid line indicates the energy of the conduction band minimum. A dashed-dotted line $E_f$ indicates the energy of the quasi-Fermi level of electrons. Here, the energy difference between the conduction band minimum of the region 001 and the conduction band minimum of the region 002 is represented as $\Delta Ec$. "$\Delta Ec$ ($V_g$=0)" indicates $\Delta Ec$ when a voltage is not applied ($V_g$=0), "$\Delta Ec$ ($V_g$>0)" indicates $\Delta Ec$ when a voltage at which the transistor is turned on ($V_g$>0) is applied, and "$\Delta Ec$ ($V_g$<0)" indicates $\Delta Ec$ when a negative voltage ($V_g$<0) is applied.

As illustrated in FIG. 5A, when a potential at which the transistor is turned on ($V_g$>0) is applied to the first gate electrode, $\Delta Ec\ (V_g>0)<\Delta Ec\ (V_g=0)$ is satisfied. Thus, electrons flow in the region 002 having the second band gap with the low Ec edge and serving as a main conduction path. At the same time, electrons also flow in the region 001 having the first band gap. This enables high current drive capability in the on state of the transistor, i.e., high on-state current and high field-effect mobility.

In contrast, as illustrated in FIGS. 5B and 5C, when a voltage lower than the threshold voltage ($V_g \le 0$) is applied to the first gate electrode, the region 001 having the first band gap serves as a dielectric (insulator), so that the conduction path in the region 001 is blocked. The region 002 having the second band gap is in contact with the region 001 having the first band gap. Consequently, the region 001 having the first band gap electrically interacts with the region 002 having the second band gap in addition to itself, and thus, even the conduction path in the region 002 having the second band gap is blocked. Accordingly, the whole channel portion is brought into a non-conductive state, and the transistor is turned off. Therefore, $\Delta Ec\ (V_g=0)<\Delta Ec\ (V_g<0)$ is satisfied.

As described above, with the use of the CAC-OS in a transistor, it is possible to reduce or prevent leakage current between a gate and a source or a drain, which is generated when the transistor operates, for example, when a potential difference is generated between the gate and the source or the drain.

A metal oxide with a low carrier density is preferably used in a transistor. A highly purified intrinsic or substantially highly purified intrinsic metal oxide has few carrier generation sources and thus can have a low carrier density. The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. Examples of impurities include hydrogen alkali metal, alkaline earth metal, iron, nickel, and silicon.

Here, the influence of impurities in the metal oxide will be described.

When silicon or carbon that is a Group 14 element is contained in the metal oxide, defect states are formed in the metal oxide. Thus, the concentration of silicon or carbon (measured by secondary ion mass spectrometry (SIMS)) is set to be lower than or equal to $2 \times 10^{18}$ atoms/cm$^3$, preferably lower than or equal to $2 \times 10^{17}$ atoms/cm$^3$ in the metal oxide or around an interface with the metal oxide.

When the metal oxide contains an alkali metal or an alkaline earth metal, defect states are formed and carriers are generated, in some cases. Thus, a transistor including a metal oxide that contains an alkali metal or an alkaline earth metal is likely to be normally on. Therefore, it is preferable to reduce the concentration of an alkali metal or an alkaline earth metal in the metal oxide. Specifically, the concentration of an alkali metal or an alkaline earth metal in the metal oxide measured by SIMS is set to be lower than or equal to $1 \times 10^{18}$ atoms/cm$^3$, preferably lower than or equal to $2 \times 10^{16}$ atoms/cm$^3$.

Hydrogen included in the metal oxide reacts with oxygen bonded to a metal atom to be water, and thus causes an oxygen vacancy ($V_o$) in some cases. Due to entry of hydrogen into the oxygen vacancy ($V_o$), an electron serving as a carrier is generated in some cases.

Furthermore, in some cases, bonding of part of hydrogen to oxygen bonded to a metal atom causes generation of an electron serving as a carrier. Thus, a transistor including the metal oxide that includes hydrogen is likely to be normally on. Accordingly, hydrogen in the metal oxide is preferably reduced as much as possible. Specifically, the hydrogen concentration of the metal oxide, which is measured by SIMS, is set to be lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

The oxygen vacancies ($V_o$) in the metal oxide can be reduced by introduction of oxygen into the metal oxide. That is, the oxygen vacancies ($V_o$) in the metal oxide disappear when the oxygen vacancies ($V_o$) are filled with oxygen. Accordingly, diffusion of oxygen in the metal oxide can reduce the oxygen vacancies ($V_o$) in a transistor and improve the reliability of the transistor.

As a method for introducing oxygen into the metal oxide, for example, an oxide in which oxygen content is higher than that in the stoichiometric composition is provided in contact with the metal oxide. That is, in the oxide, a region including oxygen in excess of that in the stoichiometric composition (hereinafter also referred to as an excess oxygen region) is preferably formed. In particular, in the case of using a metal oxide in a transistor, an oxide including an excess oxygen region is provided in a base film, an interlayer film, or the like in the vicinity of the transistor, whereby oxygen vacancies in the transistor are reduced, and the reliability can be improved.

When a metal oxide with sufficiently reduced impurity concentration is used for a channel formation region in a transistor, the transistor can have stable electrical characteristics.

<Method for Forming Metal Oxide>

An example of a method for forming the metal oxide is described below.

The metal oxide is preferably deposited at a temperature higher than or equal to room temperature and lower than 140° C. Note that room temperature includes not only the case where temperature control is not performed but also the case where temperature control is performed, e.g., the case where a substrate is cooled.

As a sputtering gas, a rare gas (typically argon), oxygen, or a mixed gas of a rare gas and oxygen is used as appropriate. When the mixed gas is used, the proportion of the oxygen gas in the whole deposition gas is higher than or equal to 0% and lower than or equal to 30%, preferably higher than or equal to 5% and lower than or equal to 20%.

When the sputtering gas contains oxygen, oxygen can be added to a film under the metal oxide and an excess oxygen region can be provided at the same time as the deposition of the metal oxide. In addition, increasing the purity of a sputtering gas is necessary. For example, an oxygen gas or an argon gas used for a sputtering gas is highly purified to have a dew point of −40° C. or lower, preferably −80° C. or lower, further preferably −100° C. or lower, still further preferably −120° C. or lower, whereby entry of moisture or the like into the metal oxide can be minimized.

In the case where the metal oxide is deposited by a sputtering method, a chamber in a sputtering apparatus is preferably evacuated to a high vacuum (to the degree of approximately $5\times10^{-7}$ Pa to $1\times10^{-4}$ Pa) with an adsorption vacuum pump such as a cryopump in order to remove water or the like, which serves as an impurity for the metal oxide, as much as possible. Alternatively, a turbo molecular pump and a cold trap are preferably combined so as to prevent a backflow of a gas, especially a gas containing carbon or hydrogen from an exhaust system to the inside of the chamber.

As a target, an In—Ga—Zn metal oxide target can be used. For example, a metal oxide target having an atomic ratio of [In]:[Ga]:[Zn]=4:2:4.1, [In]:[Ga]:[Zn]=5:1:7, or in the neighborhood thereof is preferably used.

In the sputtering apparatus, the target may be rotated or moved. For example, the magnet unit is oscillated vertically and/or horizontally during the deposition, whereby the composite metal oxide of the present invention can be formed. For example, the target may be rotated or oscillated with a beat (also referred to as rhythm, pulse, frequency, period, cycle, or the like) greater than or equal to 0.1 Hz and less than or equal to 1 kHz. Alternatively, the magnet unit may be oscillated with a beat of greater than or equal to 0.1 Hz and less than or equal to 1 kHz.

The metal oxide of the present invention can be formed, for example, in the following manner: a mixed gas of oxygen and a rare gas in which the proportion of oxygen is approximately 10% is used; the substrate temperature is 130° C.; and an In—Ga—Zn metal oxide target having an atomic ratio of [In]:[Ga]:[Zn]=4:2:4.1 is oscillated during the deposition.

The structure described in this embodiment can be used in appropriate combination with any of the structures described in the other embodiments or examples.

Embodiment 2

In this embodiment, semiconductor devices of embodiments of the present invention, and manufacturing methods thereof will be described with reference to FIGS. 6A to 6C, FIGS. 7A to 7C, FIGS. 8A and 8B, FIGS. 9A to 9D, FIGS. 10A to 10C, FIGS. 11A to 11C, FIGS. 12A to 12C, FIGS. 13A to 13C, FIGS. 14A to 14C, and FIGS. 15A to 15C.

<2-1. Structure Example 1 of Transistor>

Figure 6A:
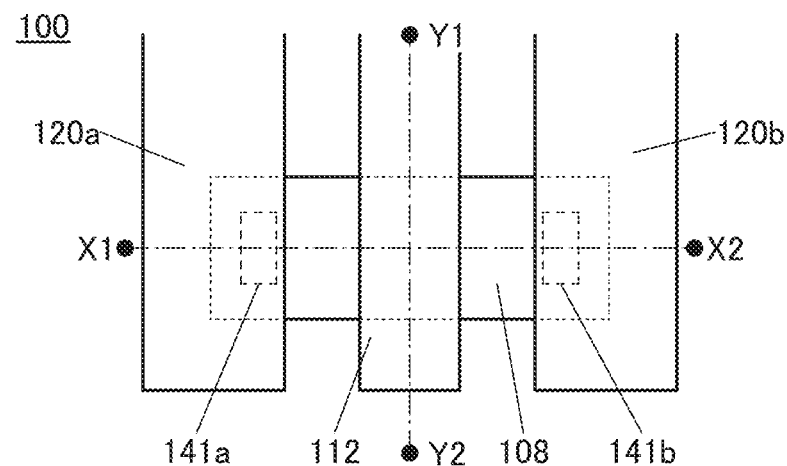
FIGS. 6A to 6C are a top view and cross-sectional views illustrating a semiconductor device.
Figure 6B:
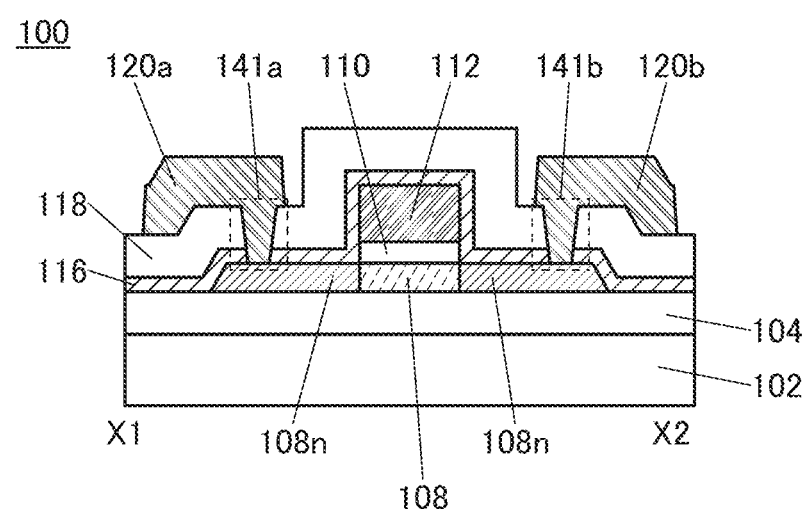
Figure 6C:
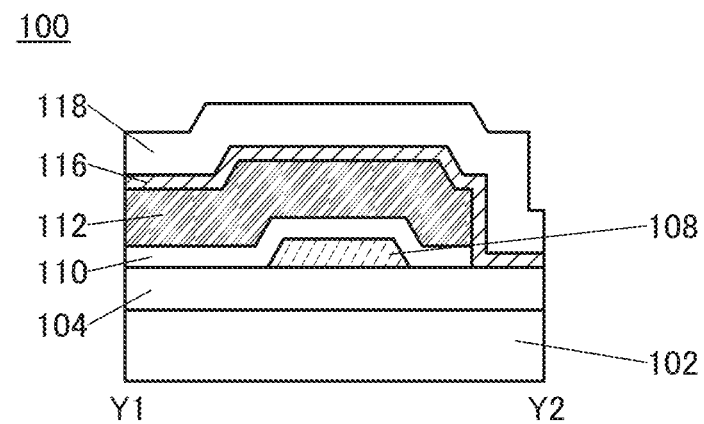

FIG. 6A is a top view of a transistor 100 that is a semiconductor device of one embodiment of the present invention. FIG. 6B is a cross-sectional view taken along dashed-dotted line X1-X2 in FIG. 6A. FIG. 6C is a cross-sectional view taken along dashed-dotted line Y1-Y2 in FIG. 6A. Note that in FIG. 6A, some components of the transistor 100 (e.g., an insulating film functioning as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 6A, some components are not illustrated in some cases in top views of transistors described below.

The transistor 100 illustrated in FIGS. 6A to 6C is what is called a top-gate transistor.

The transistor 100 includes an insulating film 104 over a substrate 102, a metal oxide 108 over the insulating film 104, an insulating film 110 over the metal oxide 108, a conductive film 112 over the insulating film 110, and an insulating film 116 over the insulating film 104, the metal oxide 108, and the conductive film 112.

In a region which overlaps with the conductive film 112, the metal oxide 108 is provided over the insulating film 104. For example, the metal oxide 108 preferably contains In, M (M is Al, Ga, Y, or Sn), and Zn.

The metal oxide 108 includes regions 108n which do not overlap with the conductive film 112 and are in contact with the insulating film 116. The regions 108n are n-type regions in the metal oxide 108 described above. The insulating film 116 contains nitrogen or hydrogen. Nitrogen or hydrogen in the insulating film 116 is added to the regions 108n to increase the carrier density, thereby making the regions 108n n-type.

The metal oxide 108 preferably includes a region in which the atomic proportion of In is larger than the atomic proportion of M. For example, the atomic ratio of In to M and Zn in the metal oxide 108 is preferably In:M:Zn=4:2:3 or in the neighborhood thereof.

Note that the composition of the metal oxide 108 is not limited to the above. For example, the atomic ratio of In to M and Zn in the metal oxide 108 is preferably In:M:Zn=5:1:6 or in the neighborhood thereof. The term "neighborhood" includes the following: when In is 5, M is greater than or equal to 0.5 and less than or equal to 1.5, and Zn is greater than or equal to 5 and less than or equal to 7.

When the metal oxide 108 has a region in which the atomic proportion of In is larger than the atomic proportion of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows the display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Even when the metal oxide 108 includes a region in which the atomic proportion of In is higher than the atomic proportion of M, the field-effect mobility might be low if the metal oxide 108 has high crystallinity.

Note that the crystallinity of the metal oxide 108 can be determined by analysis by X-ray diffraction (XRD) or with a transmission electron microscope (TEM), for example.

First, oxygen vacancies that might be formed in the metal oxide 108 will be described.

Oxygen vacancies formed in the metal oxide 108 adversely affect the transistor characteristics and therefore cause a problem. For example, hydrogen is trapped in oxygen vacancies formed in the metal oxide 108 to serve as a carrier supply source. The carrier supply source generated in the metal oxide 108 causes a change in the electrical characteristics, typically, shift in the threshold voltage, of the transistor 100 including the metal oxide 108. Therefore, it is preferable that the amount of oxygen vacancies in the metal oxide 108 be as small as possible.

In one embodiment of the present invention, the insulating film in the vicinity of the metal oxide 108 contains excess oxygen. Specifically, one or both of the insulating film 110 which is formed over the metal oxide 108 and the insulating film 104 which is formed below the metal oxide 108 contain excess oxygen. Oxygen or excess oxygen is transferred from the insulating film 104 and/or the insulating film 110 to the metal oxide 108, whereby oxygen vacancies in the metal oxide can be reduced.

Impurities such as hydrogen and moisture entering the metal oxide 108 adversely affect the transistor characteristics and therefore cause a problem. Thus, it is preferable that the amount of impurities such as hydrogen and moisture in the metal oxide 108 be as small as possible.

Note that it is preferable to use, as the metal oxide 108, a metal oxide in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic metal oxide has few carrier generation sources, and thus can have a low carrier density. Thus, a transistor in which a channel region is formed in the metal oxide rarely has a negative threshold voltage (is rarely normally on). A highly purified intrinsic or substantially highly purified intrinsic metal oxide has a low density of defect states and accordingly has a low density of trap states in some cases. Furthermore, the highly purified intrinsic or substantially highly purified intrinsic metal oxide has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

As illustrated in FIGS. 6A to 6C, the transistor 100 may further include an insulating film 118 over the insulating film 116, a conductive film 120a electrically connected to the region 108n through an opening 141a formed in the insulating films 116 and 118; and a conductive film 120b electrically connected to the region 108n through an opening 141b formed in the insulating films 116 and 118.

Note that in this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive films 112, 120a, and 120b function as a gate electrode, a source electrode, and a drain electrode, respectively.

The insulating film 110 functions as a gate insulating film. The insulating film 110 includes an excess oxygen region. Since the insulating film 110 includes the excess oxygen region, excess oxygen can be supplied to the metal oxide 108. As a result, oxygen vacancies that might be formed in the metal oxide 108 can be filled with excess oxygen, and the semiconductor device can have high reliability.

To supply excess oxygen to the metal oxide 108, excess oxygen may be supplied to the insulating film 104 that is formed below the metal oxide 108. In that case, excess oxygen contained in the insulating film 104 might also be supplied to the regions 108n, which is not desirable because the resistance of the regions 108n might be increased. In contrast, in the structure in which the insulating film 110 formed over the metal oxide 108 contains excess oxygen, excess oxygen can be selectively supplied only to a region overlapping with the conductive film 112.

<2-2. Components of Semiconductor Device>

Next, components of the semiconductor device in this embodiment will be described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure including an oxide insulating film and/or a nitride insulating film. To improve the properties of the interface with the metal oxide 108, at least a region of the insulating film 104 which is in contact with the metal oxide 108 is preferably formed using an oxide insulating film. When the insulating film 104 is formed using an oxide insulating film from which oxygen is released by heating, oxygen contained in the insulating film 104 can be moved to the metal oxide 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased. In addition, interface states at the interface between the insulating film 104 and the metal oxide 108 and oxygen vacancies included in the metal oxide 108 can be reduced.

For example, the insulating film 104 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the metal oxide 108.

[Conductive Film]

The conductive film 112 functioning as a gate electrode and the conductive films 120a and 120b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or a metal oxide, such as an oxide including indium and tin (In—Sn oxide), an oxide including indium and tungsten (In-W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in a metal oxide, and then hydrogen is added to the oxygen vacancies, so that a donor level is formed in the vicinity of the conduction band. This increases the conductivity of the metal oxide; accordingly, the metal oxide becomes a conductor. The metal oxide having become a conductor can be referred to as an oxide conductor. Metal oxides generally transmit visible light because of their large energy gap. Since an oxide conductor is a metal oxide having a donor level in the vicinity of the conduction band, the influence of absorption due to the donor level is small in an oxide conductor, and an oxide conductor has a visible light transmitting property comparable to that of a metal oxide.

It is particularly preferred to use the oxide conductor described above for the conductive film 112, in which case excess oxygen can be added to the insulating film 110.

A Cu—X alloy film (X is Mn, Ni, Cr, Fe, Co, Mo, Ta, or Ti) may be used as the conductive films 112, 120a, and 120b. The use of a Cu—X alloy film results in lower fabrication costs because the film can be processed by wet etching.

Among the above-mentioned metal elements, any one or more elements selected from titanium, tungsten, tantalum, and molybdenum are preferably included in the conductive films 112, 120a, and 120b. A tantalum nitride film is particularly preferable as each of the conductive films 112, 120a, and 120b. A tantalum nitride film has conductivity and a high barrier property against copper or hydrogen. Because a tantalum nitride film releases little hydrogen from itself, it can be favorably used as the conductive film in contact with the metal oxide 108 or the conductive film in the vicinity of the metal oxide 108.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Second Insulating Film]

As the insulating film 110 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 110 may have a two-layer structure or a stacked-layer structure including three or more layers.

The insulating film 110 that is in contact with the metal oxide 108 functioning as a channel region of the transistor 100 is preferably an oxide insulating film and preferably includes a region including oxygen in excess of the stoichiometric composition (excess oxygen region). In other words, the insulating film 110 is an insulating film capable of releasing oxygen. In order to provide the excess oxygen region in the insulating film 110, the insulating film 110 is formed in an oxygen atmosphere, or the deposited insulating film 110 is subjected to heat treatment in an oxygen atmosphere, for example.

In the case of using hafnium oxide for the insulating film 110, the following effects are attained. Hafnium oxide has higher dielectric constant than silicon oxide and silicon oxynitride. Therefore, by using hafnium oxide, the thickness of the insulating film 110 can be made large as compared with the case of using silicon oxide; thus, leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

[Metal Oxide]

As the metal oxide 108, the metal oxide described above can be used.

<Atomic Ratio>

Preferred ranges of the atomic ratio of indium, the element M, and zinc contained in the metal oxide according to the present invention are described with reference to FIGS. 16A to 16C. Note that the proportion of oxygen atoms is not illustrated in FIGS. 16A to 16C. The terms of the atomic ratio of indium, the element M, and zinc contained in the metal oxide are denoted by [In], [M], and [Zn], respectively.

Figure 16A:
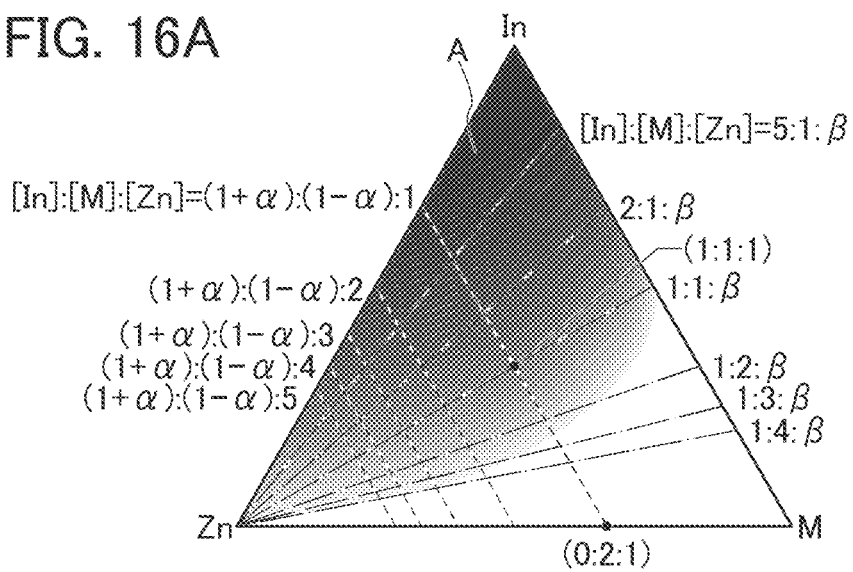
FIGS. 16A to 16C each illustrate an atomic ratio range of a metal oxide of the present invention.
Figure 16B:
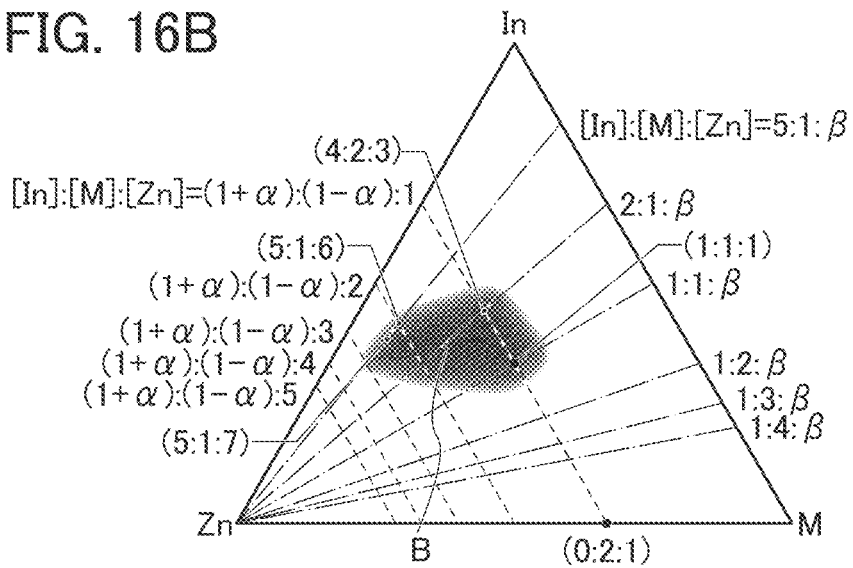
Figure 16C:
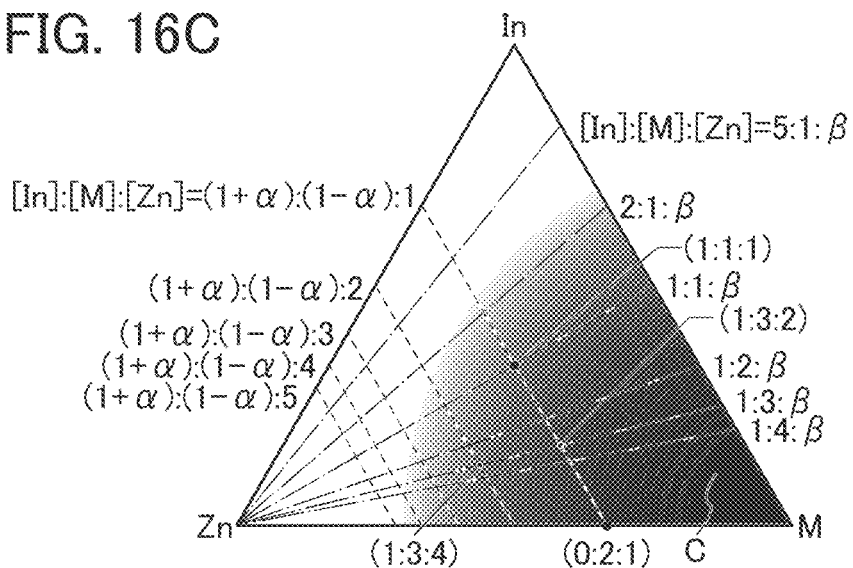

In FIGS. 16A to 16C, dashed lines indicate a line representing the atomic ratio of [In]:[M]:[Zn]=(1+α):(1−α):1 where α is a real number greater than or equal to −1 and less than or equal to 1, a line representing the atomic ratio of [In]:[M]:[Zn]=(1+α):(1−α):2, a line representing the atomic ratio of [In]:[M]:[Zn]=(1+α):(1−α):3, a line representing the atomic ratio of [In]:[M]:[Zn]=(1+α):(1−α):4, and a line representing the atomic ratio of [In]:[M]:[Zn]=(1+α):(1−α):5.

Dashed-dotted lines correspond to a line representing the atomic ratio of [In]:[M]:[Zn]=5:1:β where β is a real number greater than or equal to 0, a line representing the atomic ratio of [In]:[M]:[Zn]=2:1:β, a line representing the atomic ratio of [In]:[M]:[Zn]=1:1:β, a line representing the atomic ratio of [In]:[M]:[Zn]=1:2:β, a line representing the atomic ratio of [In]:[M]:[Zn]=1:3:β, and a line representing the atomic ratio of [In]:[M]:[Zn]=1:4:β.

A metal oxide having the atomic ratio of [In]:[M]:[Zn]=0:2:1 or in the neighborhood thereof in FIGS. 16A to 16C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 16A shows an example of the preferred ranges of the atomic ratio of indium to the element M and zinc contained in a metal oxide.

In addition, the metal oxide containing indium in a higher proportion can have high carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 16C), insulation performance becomes better.

Accordingly, the metal oxide of one embodiment of the present invention preferably has an atomic ratio represented by the region A in FIG. 16A. With the atomic ratio, high carrier mobility is obtained.

A metal oxide having an atomic ratio in the region A, particularly in a region B in FIG. 16B, has high carrier mobility and high reliability and is excellent.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

In the case where the metal oxide 108 is formed of In-M-Zn oxide, it is preferable to use a target including polycrystalline In-M-Zn oxide as the sputtering target. Note that the atomic ratio of metal elements in the formed metal oxide 108 varies from the above atomic ratios of metal elements of the sputtering targets in a range of ±40%. For example, when a sputtering target used for the metal oxide 108 has an atomic ratio of In:Ga:Zn=4:2:4.1, the atomic ratio of the metal oxide 108 may be 4:2:3 or in the neighborhood thereof. When a sputtering target used for the metal oxide 108 has an atomic ratio of In:Ga:Zn=5:1:7, the atomic ratio of the metal oxide 108 may be 5:1:6 or in the neighborhood thereof.

The energy gap of the metal oxide 108 is 2 eV or more, preferably 2.5 eV or more. With the use of a metal oxide having such a wide energy gap, the off-state current of the transistor 100 can be reduced.

Furthermore, the metal oxide 108 may have a non-single-crystal structure. Examples of the non-single-crystal structure include a c-axis-aligned crystalline oxide semiconductor (CAAC-OS) which will be described later, a polycrystalline structure, a microcrystalline structure, and an amorphous structure. Among the non-single-crystal structures, an amorphous structure has the highest density of defect states.

[Third Insulating Film]

The insulating film 116 contains nitrogen or hydrogen. A nitride insulating film can be used as the insulating film 116, for example. The nitride insulating film can be formed using silicon nitride, silicon nitride oxide, silicon oxynitride, or the like. The hydrogen concentration in the insulating film 116 is preferably higher than or equal to $1 \times 10^{22}$ atoms/cm$^3$. The insulating film 116 is in contact with the region 108n of the metal oxide 108. Thus, the concentration of an impurity (e.g., hydrogen) in the region 108n in contact with the insulating film 116 is increased, leading to an increase in the carrier density of the region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

<2-3. Structure Example 2 of Transistor>

Next, a structure of a transistor different from that in FIGS. 6A to 6C will be described with reference to FIGS. 7A to 7C.

Figure 7A:
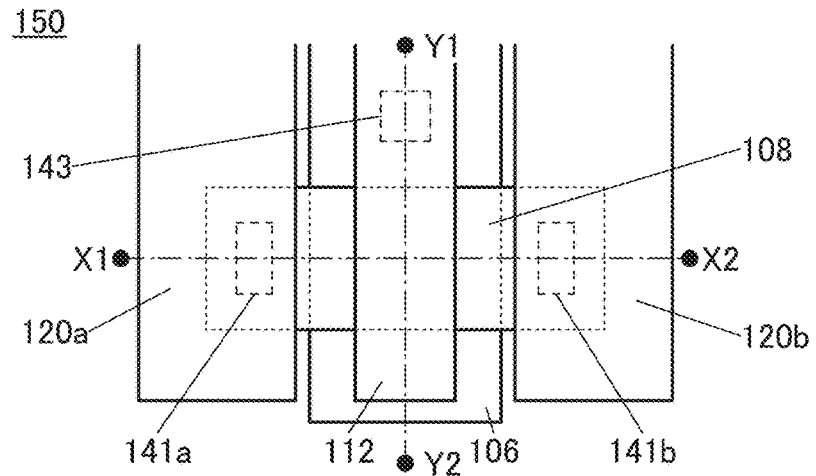
FIGS. 7A to 7C are a top view and cross-sectional views of a semiconductor device.

FIG. 7A is a top view of the transistor 150. FIG. 7B is a cross-sectional view taken along dashed-dotted line X1-X2 in FIG. 7A. FIG. 7C is a cross-sectional view taken along dashed-dotted line Y1-Y2 in FIG. 7A.

Figure 7B:
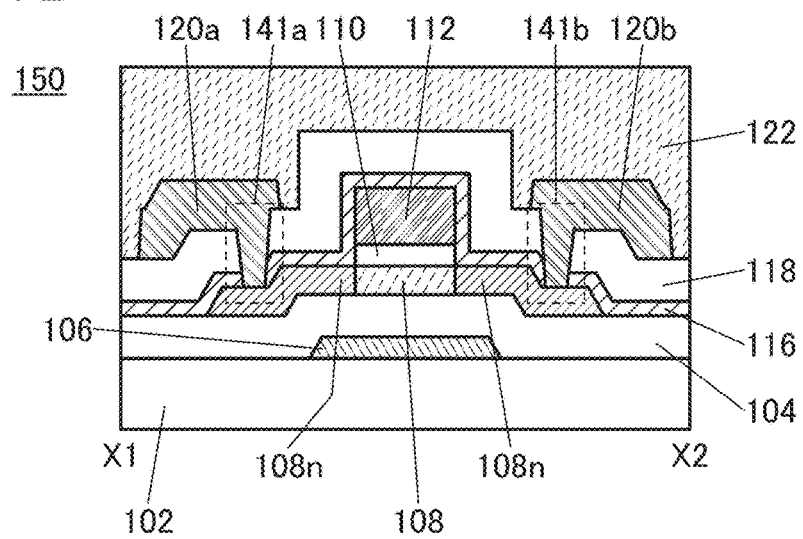
Figure 7C:
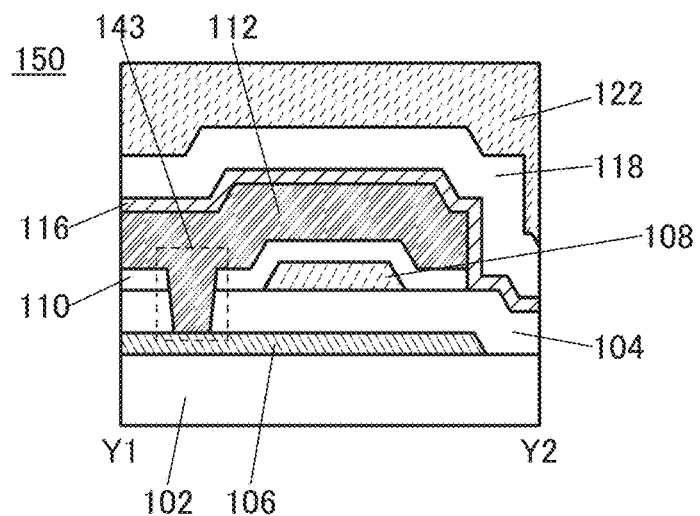

The transistor 150 illustrated in FIGS. 7A to 7C includes the conductive film 106 over the substrate 102; the insulating film 104 over the conductive film 106; the metal oxide 108 over the insulating film 104; the insulating film 110 over the metal oxide 108; the conductive film 112 over the insulating film 110; and the insulating film 116 over the insulating film 104, the metal oxide 108, and the conductive film 112.

Note that the metal oxide 108 has a structure similar that in the transistor 100 shown in FIGS. 6A to 6C. The transistor 150 shown in FIGS. 7A to 7C includes the conductive film 106 and an opening 143 in addition to the components of the transistor 100 described above.

The opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light from the bottom that irradiates a second region can be reduced.

In the case of the structure of the transistor 150, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120*a*, and 120*b*. It is particularly suitable to use a material containing copper as the conductive film 106 because the resistance can be reduced. It is favorable that, for example, each of the conductive films 106, 120*a*, and 120*b* has a stacked-layer structure in which a copper film is over a titanium nitride film, a tantalum nitride film, or a tungsten film. In that case, by using the transistor 150 as a pixel transistor and/or a driving transistor of a display device, parasitic capacitance generated between the conductive films 106 and 120*a* and between the conductive films 106 and 120*b* can be reduced. Thus, the conductive films 106, 120*a*, and 120*b* can be used not only as the first gate electrode, the source electrode, and the drain electrode of the transistor 150, but also as power supply wirings, signal supply wirings, connection wirings, or the like of the display device.

In this manner, unlike the transistor 100 described above, the transistor 150 in FIGS. 7A to 7C has a structure in which a conductive film functioning as a gate electrode is provided over and under the metal oxide 108. As in the transistor 150, a semiconductor device of one embodiment of the present invention may have a plurality of gate electrodes.

As illustrated in FIGS. 7B and 7C, the metal oxide 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the metal oxide 108 in the channel width direction. In the channel width direction, the whole metal oxide 108 is covered with the conductive film 112 with the insulating film 110 placed therebetween. Since the conductive film 112 is connected to the conductive film 106 through the opening 143 provided in the insulating films 104 and 110, a side surface of the metal oxide 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the metal oxide 108.

Such a structure enables the metal oxide 108 included in the transistor 150 to be electrically surrounded by electric fields of the conductive film 106 functioning as a first gate electrode and the conductive film 112 functioning as a second gate electrode. A device structure of a transistor, like that of the transistor 150, in which electric fields of the first gate electrode and the second gate electrode electrically surround the metal oxide 108 in which a channel region is formed can be referred to as a surrounded channel (S-channel) structure.

Since the transistor 150 has the S-channel structure, an electric field for inducing a channel can be effectively applied to the metal oxide 108 by the conductive film 106 or the conductive film 112; thus, the current drive capability of the transistor 150 can be improved and high on-state current characteristics can be obtained. As a result of the high on-state current, it is possible to reduce the size of the transistor 150. Furthermore, since the transistor 150 has a structure in which the metal oxide 108 is surrounded by the conductive film 106 and the conductive film 112, the mechanical strength of the transistor 150 can be increased.

When seen in the channel width direction of the transistor 150, an opening different from the opening 143 may be formed on the side of the metal oxide 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential Vb. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_g$s is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_g$s is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3−V4) may be larger than the potential amplitude of the signal A (V1−V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 150 are similar to those of the transistor 100 described above and have similar effects.

An insulating film may further be formed over the transistor 150. The transistor 150 illustrated in FIGS. 7A to 7C includes an insulating film 122 over the conductive films 120a and 120b and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

<2-4. Structure Example 3 of Transistor>

Next, a structure of a transistor different from that of the transistor 150 in FIGS. 7A to 7C will be described with reference to FIGS. 8A and 8B.

Figure 8A:
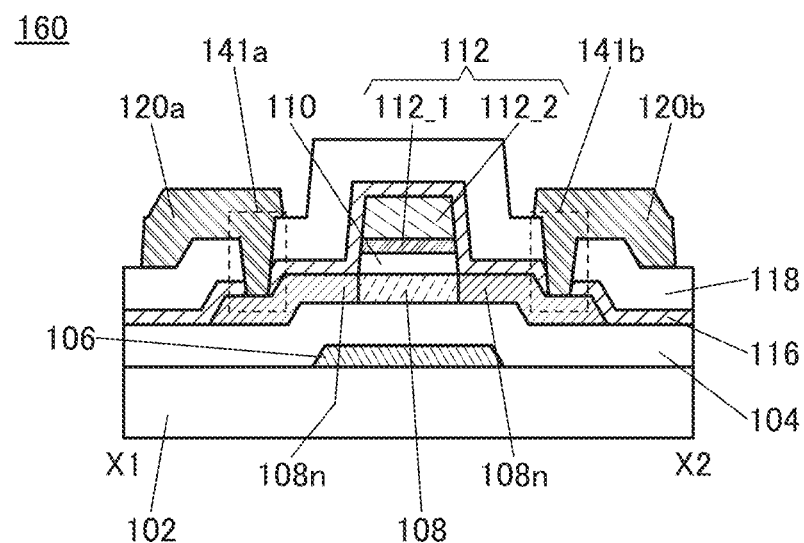
FIGS. 8A and 8B are cross-sectional views illustrating a semiconductor device.
Figure 8B:
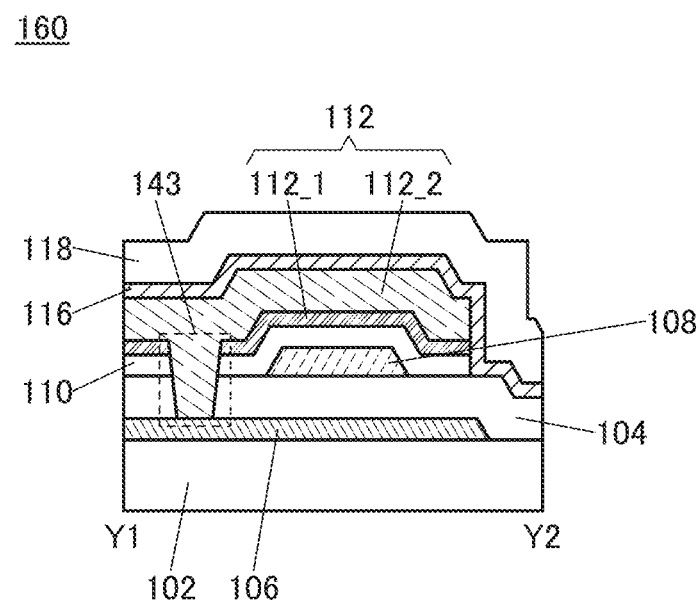

FIGS. 8A and 8B are cross-sectional views of a transistor 160. The top view of the transistor 160 is not illustrated because it is similar to that of the transistor 150 in FIG. 7A.

The transistor 160 illustrated in FIGS. 8A and 8B is different from the transistor 150 in the stacked-layer structure of the conductive film 112, the shape of the conductive film 112, and the shape of the insulating film 110.

The conductive film 112 in the transistor 160 includes a conductive film 112_1 over the insulating film 110 and a conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc, or the like can be used, for example.

As illustrated in FIG. 8B, the conductive film 1122 is connected to the conductive film 106 through the opening 143. By forming the opening 143 after a conductive film to be the conductive film 112_1 is formed, the shape illustrated in FIG. 8B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 160 have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

As compared with the transistor 160 in which the conductive film 112 and the insulating film 110 have a rectangular shape, the transistor 160 in which the conductive film 112 and the insulating film 110 have a tapered shape is favorable because of better coverage with the insulating film 116.

The other components of the transistor 160 are similar to those of the transistor 150 described above and have similar effects.

<2-5. Method for Manufacturing Semiconductor Device>

Next, a method for manufacturing the transistor 150 illustrated in FIGS. 7A to 7C will be described with reference to FIGS. 9A to 9D, FIGS. 10A to 10C, and FIGS. 11A to 11C. Note that FIGS. 9A to 9D, FIGS. 10A to 10C, and FIGS. 11A to 11C are cross-sectional views in the channel length direction and the channel width direction illustrating the method for manufacturing the transistor 150.

First, the conductive film 106 is formed over the substrate 102. Next, the insulating film 104 is formed over the substrate 102 and the conductive film 106, and a metal oxide film is formed over the insulating film 104. Then, the metal oxide film is processed into an island shape, whereby a metal oxide 108a is formed (see FIG. 9A).

The conductive film 106 can be formed using a material selected from the above-mentioned materials. In this embodiment, for the conductive film 106, a stack including a 50-nm-thick tungsten film and a 400-nm-thick copper film is formed with a sputtering apparatus.

To process a conductive film to be the conductive film 106, a wet etching method and/or a dry etching method can be used. In this embodiment, in the processing of the conductive film into the conductive film 106, the copper film is etched by a wet etching method, and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

In forming the metal oxide 108a, an inert gas (such as a helium gas, an argon gas, or a xenon gas) may be mixed into the oxygen gas. Note that the proportion of the oxygen gas in the whole deposition gas (hereinafter also referred to as an oxygen flow rate ratio) in forming the metal oxide 108a is higher than or equal to 0% and lower than or equal to 30%, preferably higher than or equal to 5% and lower than or equal to 20%.

The metal oxide 108a is formed at a substrate temperature higher than or equal to room temperature and lower than or equal to 180° C., preferably higher than or equal to room temperature and lower than or equal to 140° C. The substrate temperature when the metal oxide 108a is formed is preferably, for example, higher than or equal to room temperature and lower than 140° C. because the productivity is increased.

The thickness of the metal oxide 108a is greater than or equal to 3 nm and less than or equal to 200 nm, preferably greater than or equal to 3 nm and less than or equal to 100 nm, further preferably greater than or equal to 3 nm and less than or equal to 60 nm.

In the case where a large-sized glass substrate (e.g., the 6th generation to the 10th generation) is used as the substrate 102 and the metal oxide 108a is formed at a substrate temperature higher than or equal to 200° C. and lower than or equal to 300° C., the substrate 102 might be changed in shape (distorted or warped). Therefore, in the case where a large-sized glass substrate is used, the change in the shape of the glass substrate can be suppressed by forming the metal oxide 108a at a substrate temperature higher than or equal to room temperature and lower than 200° C.

In addition, increasing the purity of the sputtering gas is necessary. For example, when a gas which is highly purified to have a dew point of −40° C. or lower, preferably −80° C. or lower, further preferably −100° C. or lower, still further preferably −120° C. or lower, is used as the sputtering gas, i.e., the oxygen gas or the argon gas, entry of moisture or the like into the metal oxide can be minimized.

In the case where the metal oxide is deposited by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the metal oxide, as much as possible. In particular, the partial pressure of gas molecules corresponding to $H_2O$ (gas molecules corresponding to m/z=18) in the chamber in the standby mode of the sputtering apparatus is preferably lower than or equal to $1 \times 10^{-4}$ Pa, further preferably lower than or equal to $5 \times 10^{-5}$ Pa.

In this embodiment, the metal oxide 108a is formed in the following conditions.

The metal oxide 108a is formed by a sputtering method using an In—Ga—Zn metal oxide target. The substrate temperature and the oxygen flow rate at the time of formation of the metal oxide 108a can be set as appropriate. The pressure in a chamber is 0.6 Pa, and an AC power of 2500 W is supplied to the metal oxide target provided in the sputtering apparatus.

To process the metal oxide into the metal oxide 108a, a wet etching method and/or a dry etching method can be used.

After the metal oxide 108a is formed, the metal oxide 108a may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere not contain hydrogen, water, or the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the metal oxide while it is heated or by performing heat treatment after the deposition of the metal oxide, the hydrogen concentration in the metal oxide, which is measured by SIMS, can be $5 \times 10^{19}$ atoms/cm$^3$ or lower, $1 \times 10^{19}$ atoms/cm$^3$ or lower, $5 \times 10^{18}$ atoms/cm$^3$ or lower, $1 \times 10^{18}$ atoms/cm$^3$ or lower, $5 \times 10^{17}$ atoms/cm$^3$ or lower, or $1 \times 10^{16}$ atoms/cm$^3$ or lower.

Figure 9A:
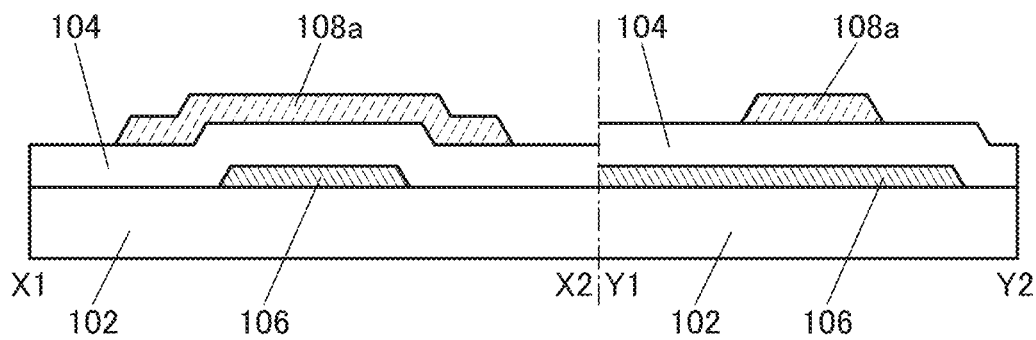
FIGS. 9A to 9D are cross-sectional views illustrating a method for manufacturing a semiconductor device.
Figure 9B:
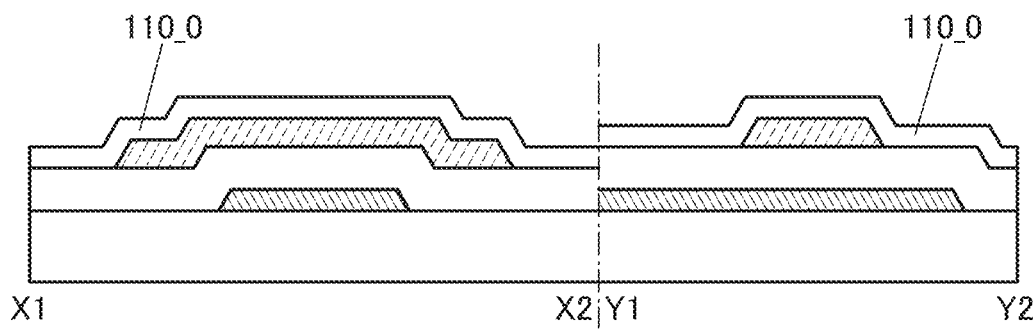

Next, an insulating film 110_0 is formed over the insulating film 104 and the metal oxide 108a (see FIG. 9B).

For the insulating film 110_0, a silicon oxide film or a silicon oxynitride film can be formed with a plasma-enhanced chemical vapor deposition apparatus (also referred to as as a PECVD apparatus or simply a plasma CVD apparatus). In this case, a deposition gas containing silicon and an oxidizing gas are preferably used as a source gas. Typical examples of the deposition gas containing silicon include silane, disilane, trisilane, and silane fluoride.

Examples of the oxidizing gas include oxygen, ozone, dinitrogen monoxide, and nitrogen dioxide.

A silicon oxynitride film having few defects can be formed as the insulating film 110_0 with the PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 110_0, a dense silicon oxide film or a dense silicon oxynitride film can be formed under the following conditions: the substrate placed in a vacuum-evacuated treatment chamber of the PECVD apparatus is held at a temperature higher than or equal to 280° C. and lower than or equal to 400° C.; the pressure in the treatment chamber into which a source gas is introduced is set to be higher than or equal to 20 Pa and lower than or equal to 250 Pa, preferably higher than or equal to 100 Pa and lower than or equal to 250 Pa; and a high-frequency power is supplied to an electrode provided in the treatment chamber.

The insulating film 110_0 may be formed by a PECVD method using a microwave. A microwave refers to a wave in the frequency range of 300 MHz to 300 GHz. In the case of using a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane (SiH $(OC_2H_5)_3$); trisdimethylaminosilane $(SiH(N(CH_3)_2)_3)$; or the like. The insulating film 110_0 having high coverage can be formed by a CVD method using an organosilane gas.

In this embodiment, as the insulating film 110_0, a 100-nm-thick silicon oxynitride film is formed with the PECVD apparatus.

Subsequently, a mask is formed by lithography in a desired position over the insulating film 110_0, and then the insulating film 110_0 and the insulating film 104 are partly etched, so that the opening 143 reaching the conductive film 106 is formed (see FIG. 9C).

To form the opening 143, a wet etching method and/or a dry etching method can be used. In this embodiment, the opening 143 is formed by a dry etching method.

Next, a conductive film 112_0 is formed over the conductive film 106 and the insulating film 110_0 so as to cover the opening 143. In the case where a metal oxide film is used as the conductive film 112_0, for example, oxygen might be added to the insulating film 110_0 during the formation of the conductive film 112_0 (see FIG. 9D).

Figure 9C:
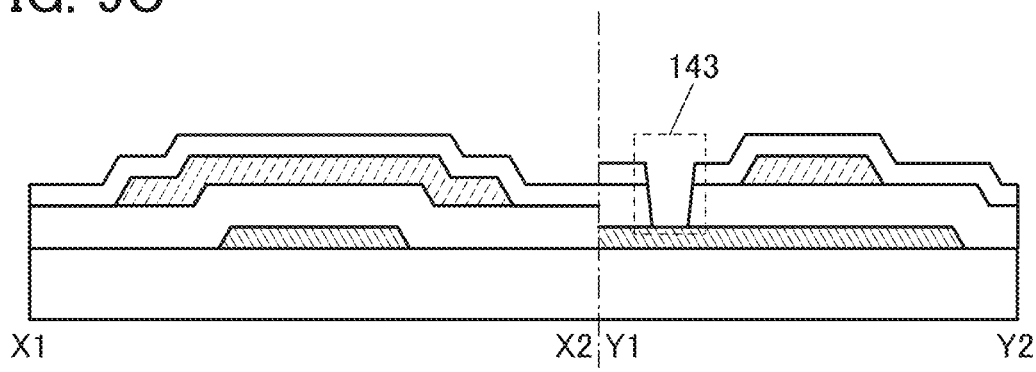
Figure 9D:
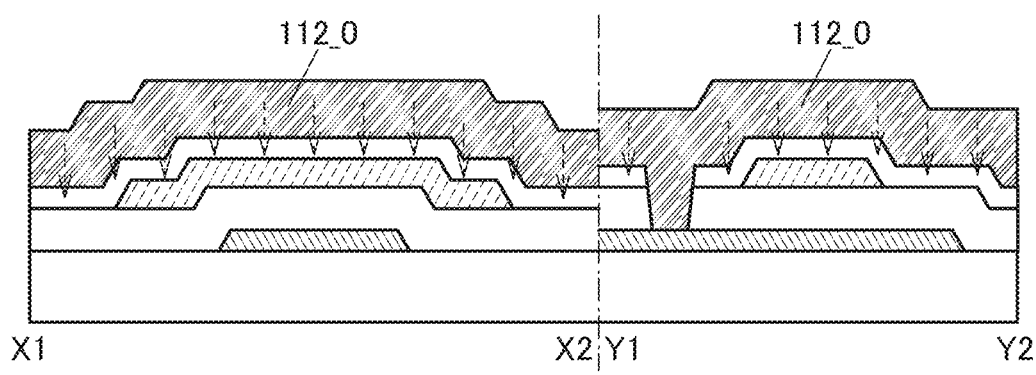

In FIG. 9D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 1120, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and another method such as an ALD method may be used.

In this embodiment, a 100-nm-thick IGZO film containing an In—Ga—Zn oxide (In:Ga:Zn=4:2:4.1 (atomic ratio)) is formed as the conductive film 112_0 by a sputtering method. Oxygen addition treatment may be performed on the insulating film 110_0 before or after the formation of the conductive film 112_0. The oxygen addition treatment can be performed in a manner similar to that of the oxygen addition treatment that can be performed after the formation of the insulating film 104.

Figure 10A:
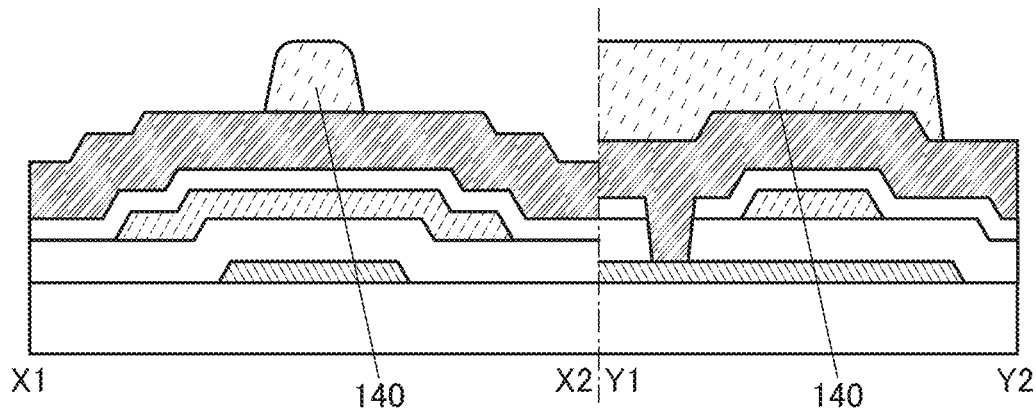
FIGS. 10A to 10C are cross-sectional views illustrating a method for manufacturing a semiconductor device.
Figure 10B:
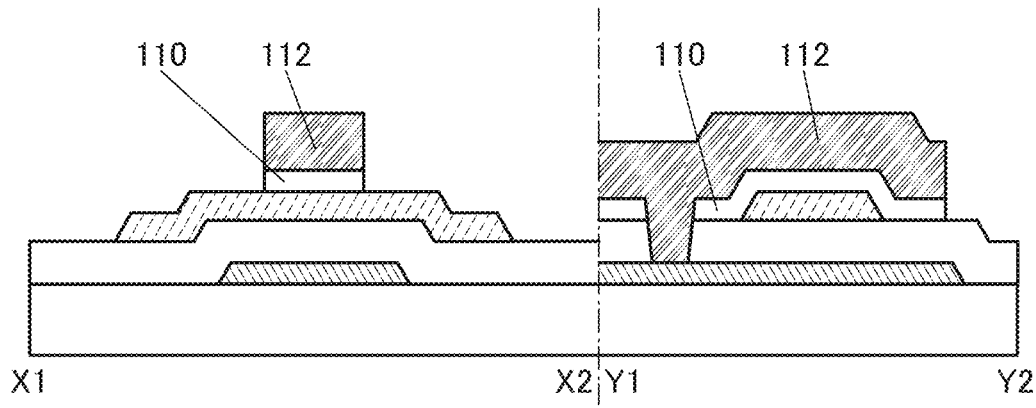
Figure 10C:
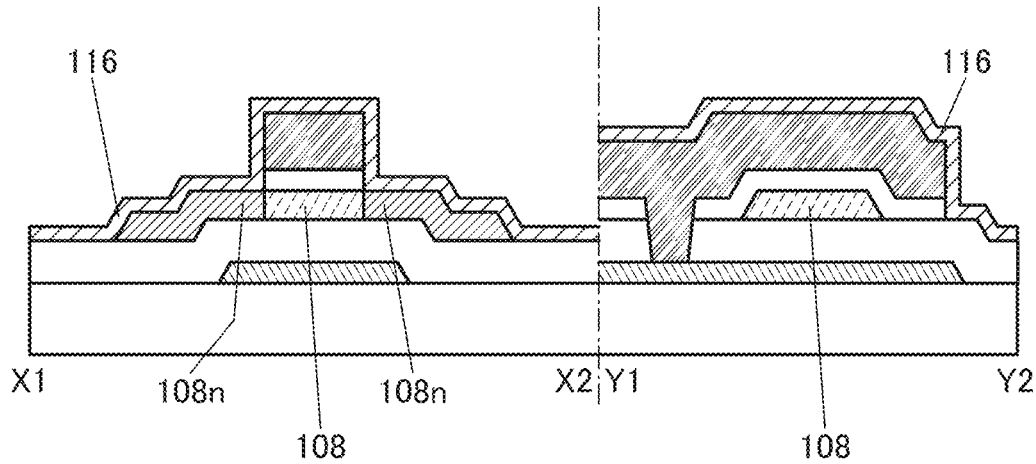

Subsequently, a mask 140 is formed by a lithography process in a desired position over the conductive film 112_0 (see FIG. 10A).

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 10B).

In this embodiment, the conductive film 112_0 and the insulating film 110_0 are processed by a dry etching method.

In the processing of the conductive film 112_0 and the insulating film 110_0, the thickness of the metal oxide 108a in a region not overlapping with the conductive film 112 is decreased in some cases. In other cases, in the processing of the conductive film 112_0 and the insulating film 110_0, the thickness of the insulating film 104 in a region not overlapping with the metal oxide 108a is decreased. In the processing of the conductive film 112_0 and the insulating film 110_0, an etchant or an etching gas (e.g., chlorine) might be added to the metal oxide 108a or the constituent element of the conductive film 112_0 or the insulating film 110_0 might be added to the metal oxide 108.

Next, the insulating film 116 is formed over the insulating film 104, the metal oxide 108, and the conductive film 112. By the formation of the insulating film 116, part of the metal oxide 108a that is in contact with the insulating film 116 becomes the regions 108n. Here, the metal oxide 108a overlapping with the conductive film 112 is the metal oxide 108 (see FIG. 10C).

The insulating film 116 can be formed using a material selected from the above-mentioned materials. In this embodiment, as the insulating film 116, a 100-nm-thick silicon nitride oxide film is formed with a PECVD apparatus. In the formation of the silicon nitride oxide film, two steps, i.e., plasma treatment and deposition treatment, are performed at a temperature of 220° C. The plasma treatment is performed under the following conditions: an argon gas at a flow rate of 100 sccm and a nitrogen gas at a flow rate of 1000 sccm are introduced into a chamber before deposition; the pressure in the chamber is set to 40 Pa; and a power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and a power of 1000 W is supplied to the RF power source (27.12 MHz).

When a silicon nitride oxide film is used as the insulating film 116, nitrogen or hydrogen in the silicon nitride oxide film can be supplied to the regions 108n in contact with the insulating film 116. In addition, when the formation temperature of the insulating film 116 is the above temperature, release of excess oxygen contained in the insulating film 110 to the outside can be suppressed.

Figure 11A:
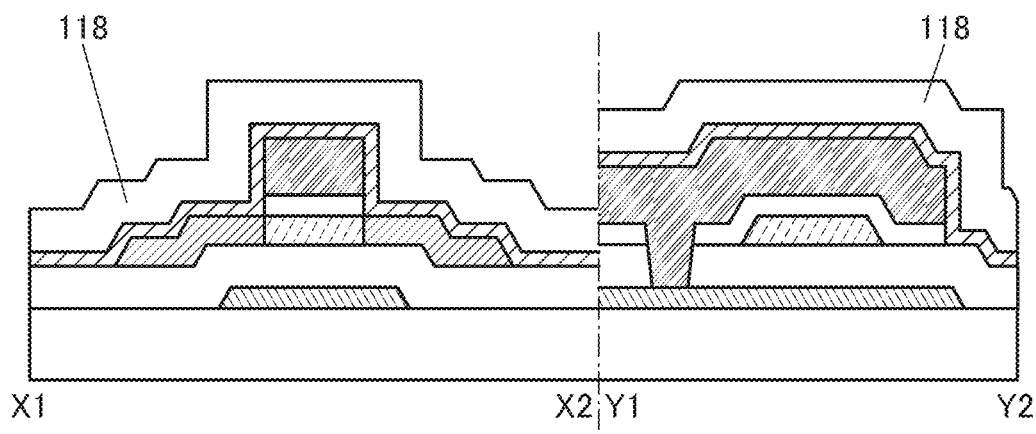
FIGS. 11A to 11C are cross-sectional views illustrating a method for manufacturing a semiconductor device.

Next, the insulating film 118 is formed over the insulating film 116 (see FIG. 11A).

The insulating film 118 can be formed using a material selected from the above-mentioned materials. In this embodiment, as the insulating film 118, a 300-nm-thick silicon oxynitride film is formed with a PECVD apparatus.

Figure 11B:
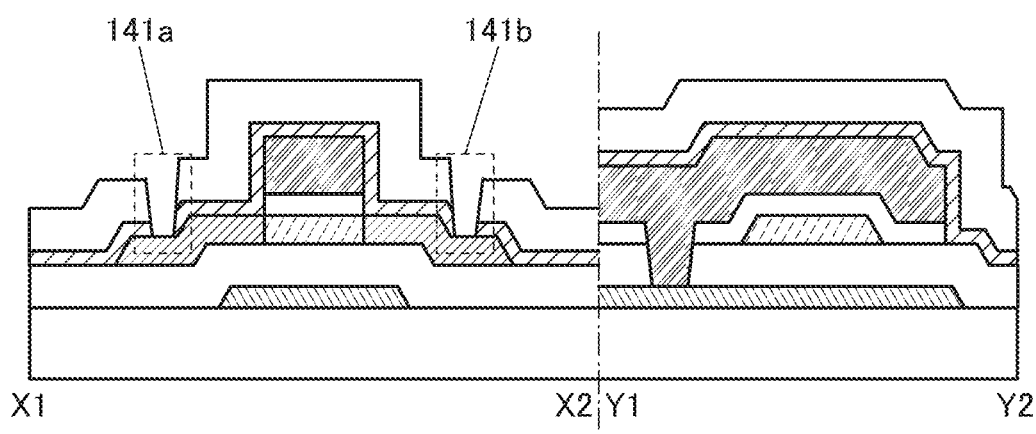

Subsequently, a mask is formed by lithography in a desired position over the insulating film 118, and then the insulating film 118 and the insulating film 116 are partly etched, so that the opening 141a and the opening 141b reaching the regions 108n are formed (see FIG. 11B).

To etch the insulating film 118 and the insulating film 116, a wet etching method and/or a dry etching method can be used. In this embodiment, the insulating film 118 and the insulating film 116 are processed by a dry etching method.

Figure 11C:
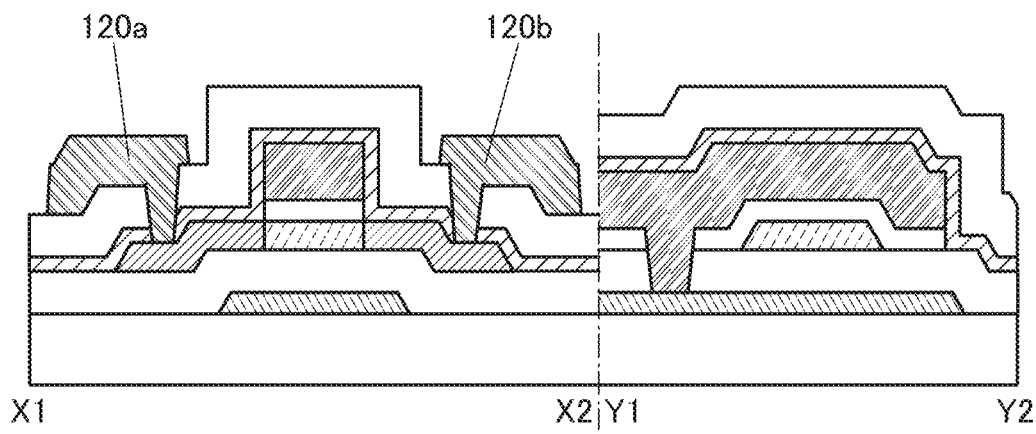

Next, a conductive film is formed over the regions 108n and the insulating film 118 so as to cover the openings 141a and 141b, and the conductive film is processed into a desired shape, whereby the conductive films 120a and 120b are formed (see FIG. 11C).

The conductive films 120a and 120b can be formed using a material selected from the above-mentioned materials. In this embodiment, for the conductive films 120a and 120b, a stack including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method, and then the tungsten film is etched by a dry etching method.

Then, the insulating film 122 is formed to cover the conductive films 120a and 120b and the insulating film 118.

Through the above steps, the transistor 150 in FIGS. 7A to 7C can be manufactured.

Note that the films included in the transistor 150 (the insulating film, the metal oxide film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although a sputtering method and a PECVD method are typical examples of the deposition method, a thermal CVD method may be used. As an example of a thermal CVD method, a metal organic chemical vapor deposition (MOCVD) method can be given.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

The films such as the conductive films, the insulating films, and the metal oxide films that are described above can be formed by a thermal CVD method such as an MOCVD method.

For example, in the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide)hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

In the case where a metal oxide such as an In—Ga—Zn—O film is formed with a deposition apparatus employing an ALD method, an $In(CH_3)_3$ gas and an $O_3$ gas) are used to form an In—O layer, a $Ga(CH_3)_3$ gas and an $O_3$ gas) are used to form a Ga—O layer, and then, a $Zn(CH_3)_2$ gas and an $O_3$ gas) are used to form a Zn—O layer. Note that the order of these layers is not limited to this example. A mixed compound layer such as an In-Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas), it is preferable to use an $O_3$ gas), which does not contain H.

<2-6. Structure Example 4 of Transistor>

Figure 12A:
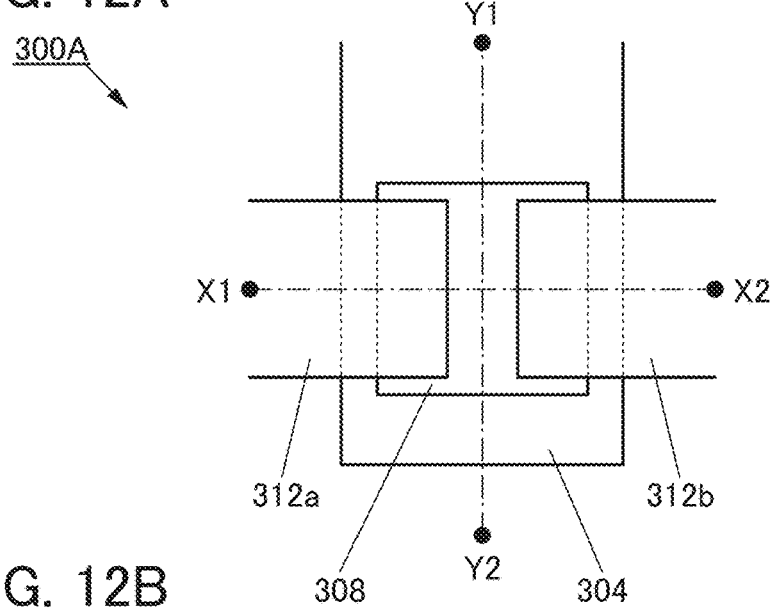
FIGS. 12A to 12C are a top view and cross-sectional views illustrating a semiconductor device.
Figure 12B:
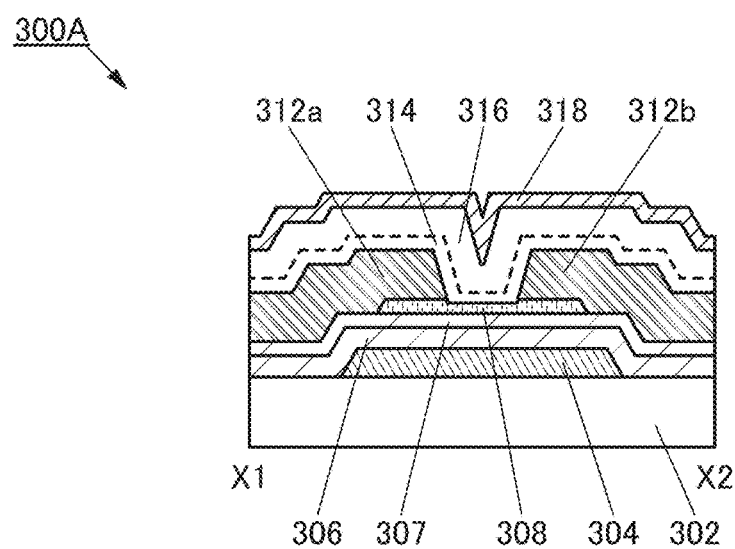
Figure 12C:
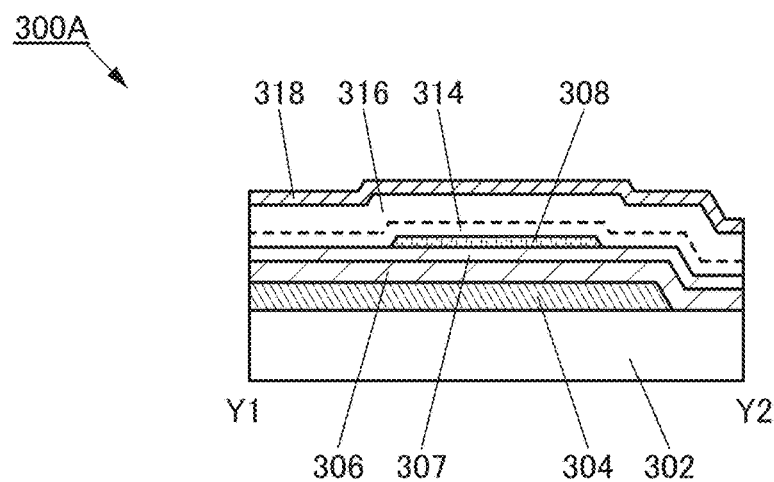

FIG. 12A is a top view of a transistor 300A. FIG. 12B is a cross-sectional view taken along dashed-dotted line X1-X2 in FIG. 12A. FIG. 12C is a cross-sectional view taken along dashed-dotted line Y1-Y2 in FIG. 12A. Note that in FIG. 12A, some components of the transistor 300A (e.g., an insulating film functioning as a gate insulating film) are not illustrated to avoid complexity. The direction of the dashed-dotted line X1-X2 may be referred to as a channel length direction, and the direction of the dashed-dotted line Y1-Y2 may be referred to as a channel width direction. As in FIG. 12A, some components are not illustrated in some cases in top views of transistors described below.

The transistor 300A illustrated in FIGS. 12A to 12C includes a conductive film 304 over a substrate 302, an insulating film 306 over the substrate 302 and the conductive film 304, an insulating film 307 over the insulating film 306, a metal oxide 308 over the insulating film 307, a conductive film 312a over the metal oxide 308, and a conductive film 312b over the metal oxide 308. Over the transistor 300A, specifically, over the conductive films 312a and 312b and the metal oxide 308, an insulating film 314, an insulating film 316, and an insulating film 318 are provided.

In the transistor 300A, the insulating films 306 and 307 function as the gate insulating films of the transistor 300A, and the insulating films 314, 316, and 318 function as protective insulating films of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 12A to 12C is a channel-etched transistor. The metal oxide of one embodiment of the present invention is suitable for a channel-etched transistor.

<2-7. Structure Example 5 of Transistor>

Figure 13A:
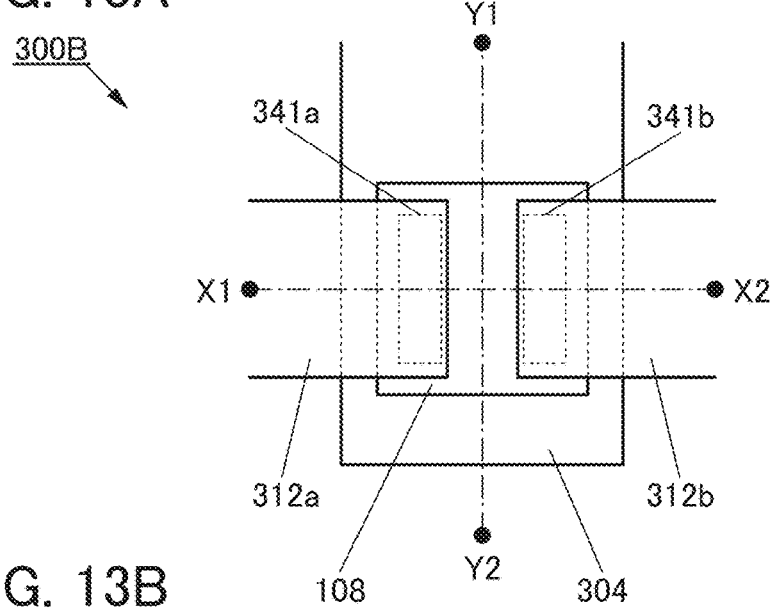
FIGS. 13A to 13C are a top view and cross-sectional views illustrating a semiconductor device.
Figure 13B:
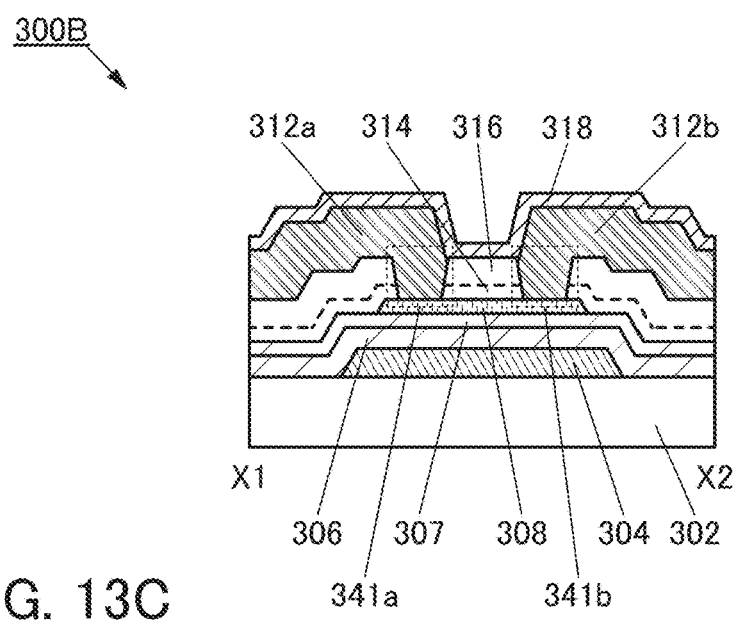
Figure 13C:
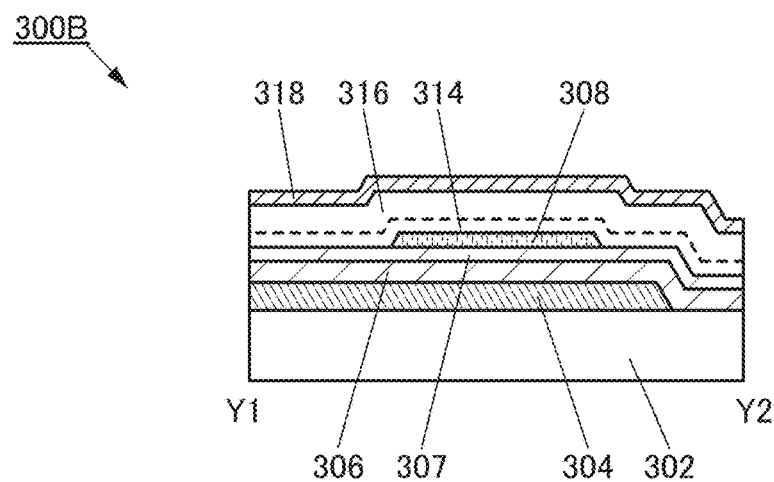

FIG. 13A is a top view of a transistor 300B. FIG. 13B is a cross-sectional view taken along dashed-dotted line X1-X2 in FIG. 13A. FIG. 13C is a cross-sectional view taken along dashed-dotted line Y1-Y2 in FIG. 13A.

The transistor 300B illustrated in FIGS. 13A to 13C includes the conductive film 304 over the substrate 302, the insulating film 306 over the substrate 302 and the conductive film 304, the insulating film 307 over the insulating film 306, the metal oxide 308 over the insulating film 307, the insulating film 314 over the metal oxide 308, the insulating film 316 over the insulating film 314, the conductive film 312a electrically connected to the metal oxide 308 through an opening 341a provided in the insulating films 314 and 316, and the conductive film 312b electrically connected to the metal oxide 308 through an opening 341b provided in the insulating films 314 and 316. Over the transistor 300B, specifically, over the conductive films 312a and 312b and the insulating film 316, the insulating film 318 is provided.

In the transistor 300B, the insulating films 306 and 307 each function as a gate insulating film of the transistor 300B, the insulating films 314 and 316 each function as a protective insulating film of the metal oxide 308, and the insulating film 318 functions as a protective insulating film of the transistor 300B. Moreover, in the transistor 300B, the conductive film 304 functions as a gate electrode, the conductive film 312a functions as a source electrode, and the conductive film 312b functions as a drain electrode.

The transistor 300A illustrated in FIGS. 12A to 12C has a channel-etched structure, whereas the transistor 300B in FIGS. 13A to 13C has a channel-protective structure. The metal oxide of one embodiment of the present invention is suitable for a channel-protective transistor as well.

<2-8. Structure Example 6 of Transistor>

Figure 14A:
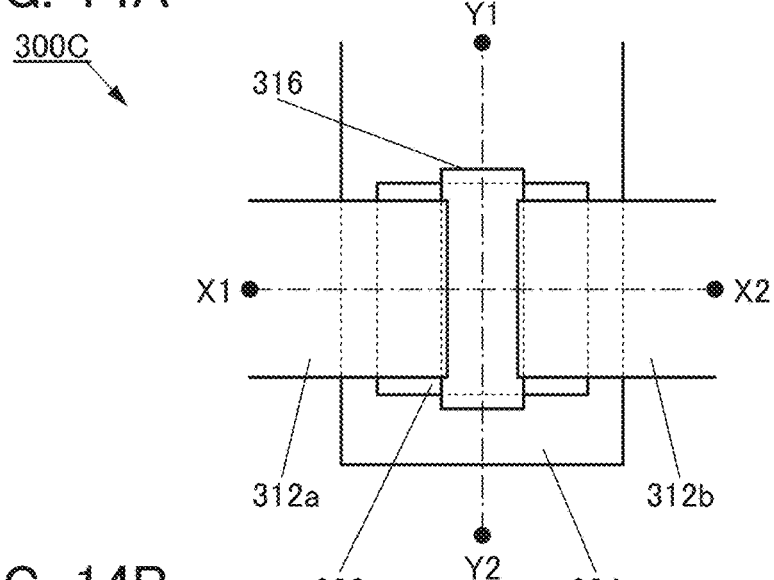
FIGS. 14A to 14C are a top view and cross-sectional views illustrating a semiconductor device.
Figure 14B:
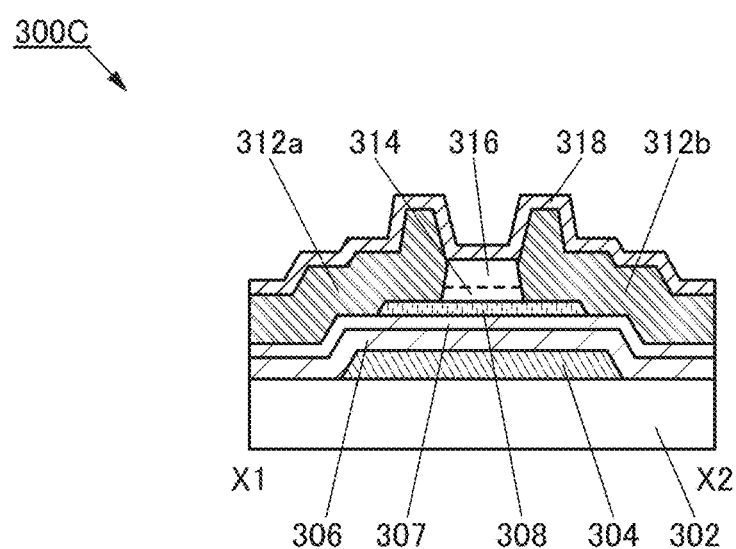
Figure 14C:
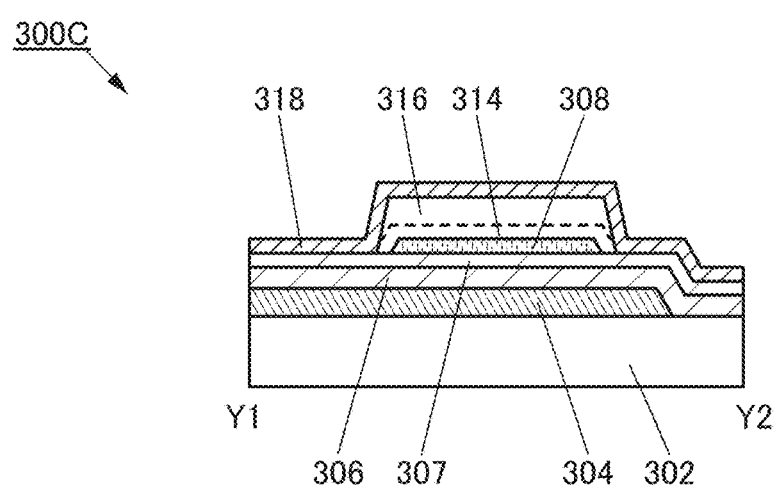

FIG. 14A is a top view of a transistor 300C. FIG. 14B is a cross-sectional view taken along dashed-dotted line X1-X2 in FIG. 14A. FIG. 14C is a cross-sectional view taken along dashed-dotted line Y1-Y2 in FIG. 14A.

The transistor 300C illustrated in FIGS. 14A to 14C is different from the transistor 300B in FIGS. 13A to 13C in the shapes of the insulating films 314 and 316. Specifically, the insulating films 314 and 316 of the transistor 300C have island shapes and are provided over a channel region of the metal oxide 308. Other components are similar to those of the transistor 300B.

<2-9. Structure Example 7 of Transistor>

Figure 15A:
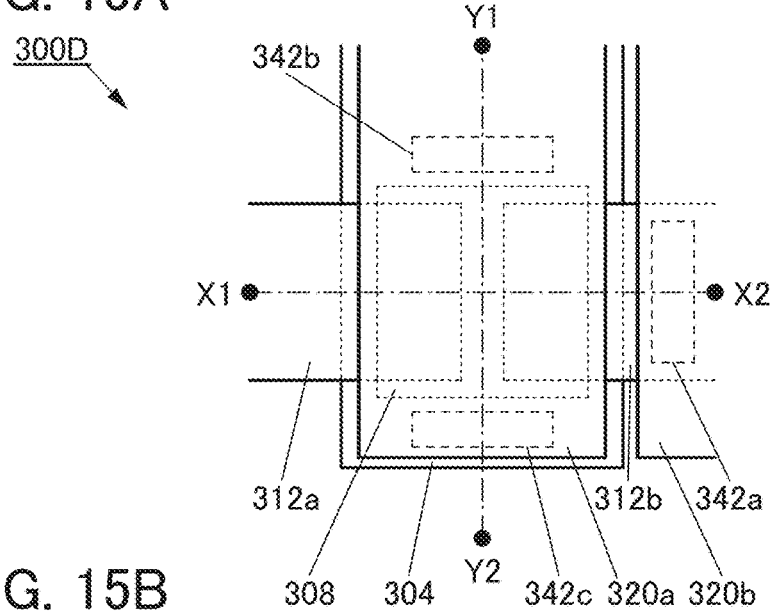
FIGS. 15A to 15C are a top view and cross-sectional views illustrating a semiconductor device.
Figure 15B:
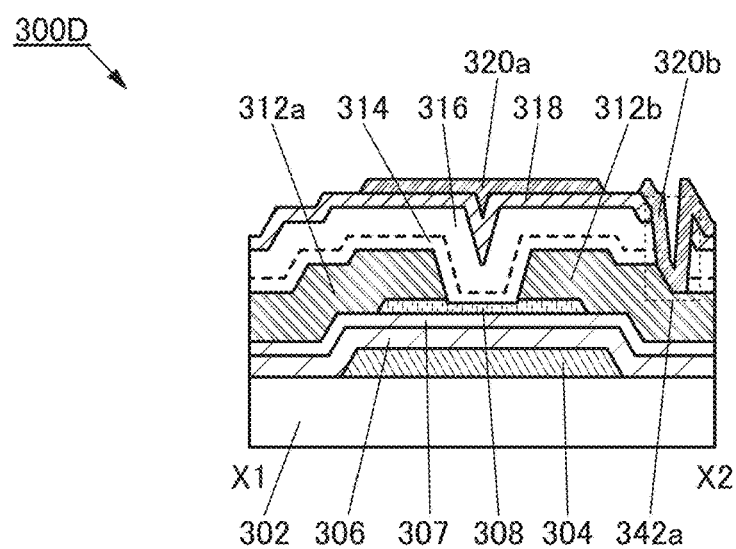
Figure 15C:
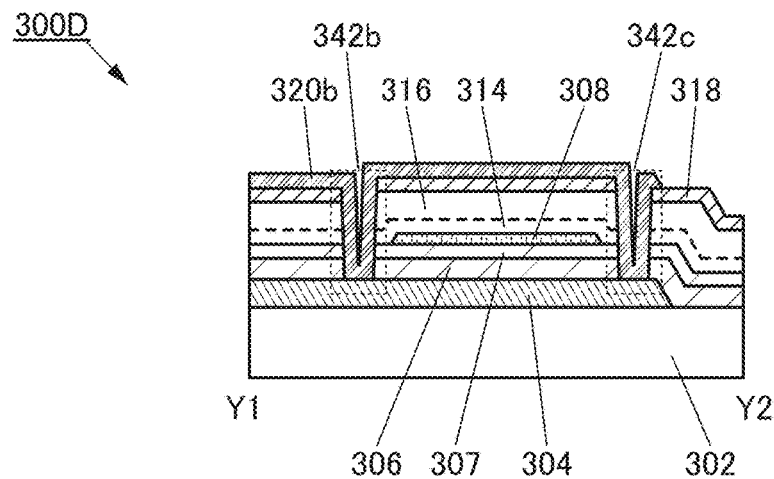

FIG. 15A is a top view of a transistor 300D. FIG. 15B is a cross-sectional view taken along dashed-dotted line X1-X2 in FIG. 15A. FIG. 15C is a cross-sectional view taken along dashed-dotted line Y1-Y2 in FIG. 15A.

The transistor 300D illustrated in FIGS. 15A to 15C includes the conductive film 304 over the substrate 302, the insulating film 306 over the substrate 302 and the conductive film 304, the insulating film 307 over the insulating film 306, the metal oxide 308 over the insulating film 307, the conductive film 312a over the metal oxide 308, the conductive film 312b over the metal oxide 308, the insulating film 314 over the metal oxide 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 function as first gate insulating films of the transistor 300D, and the insulating films 314, 316, and 318 function as second gate insulating films of the transistor 300D. Furthermore, in the transistor 300D, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 15C, the conductive film 320b is connected to the conductive film 304 in an opening 342b and an opening 342c provided in the insulating films 306, 307, 314, 316, and 318. Thus, the same potential is applied to the conductive film 320b and the conductive film 304.

The structure of the transistor 300D is not limited to that described above, in which the openings 342b and 342c are provided so that the conductive film 320b is connected to the conductive film 304. For example, a structure in which only one of the openings 342b and 342c is provided so that the conductive film 320b is connected to the conductive film 304, or a structure in which the conductive film 320b is not connected to the conductive film 304 without providing the openings 342b and 342c may be employed. Note that in the case where the conductive film 320b is not connected to the conductive film 304, it is possible to apply different potentials to the conductive film 320b and the conductive film 304.

The conductive film 320b is connected to the conductive film 312b through an opening 342a provided in the insulating films 314, 316, and 318.

Note that the transistor 300D has the S-channel structure described above.

At least part of this embodiment can be implemented in combination with any of the other embodiments described in this specification as appropriate.

Embodiment 3

In this embodiment, an example of a display panel which can be used for a display portion or the like in a display device including the semiconductor device of one embodiment of the present invention is described with reference to FIG. 17 and FIG. 18. The display panel described below as an example includes both a reflective liquid crystal element and a light-emitting element and can display an image in both the transmissive mode and the reflective mode. Note that the metal oxide of one embodiment of the present invention and a transistor including the metal oxide can be preferably used in a transistor in a pixel of a display device, a driver for driving the display device, an LSI supplying data to the display device, or the like.

<Structure Example of Display Panel>

Figure 17:
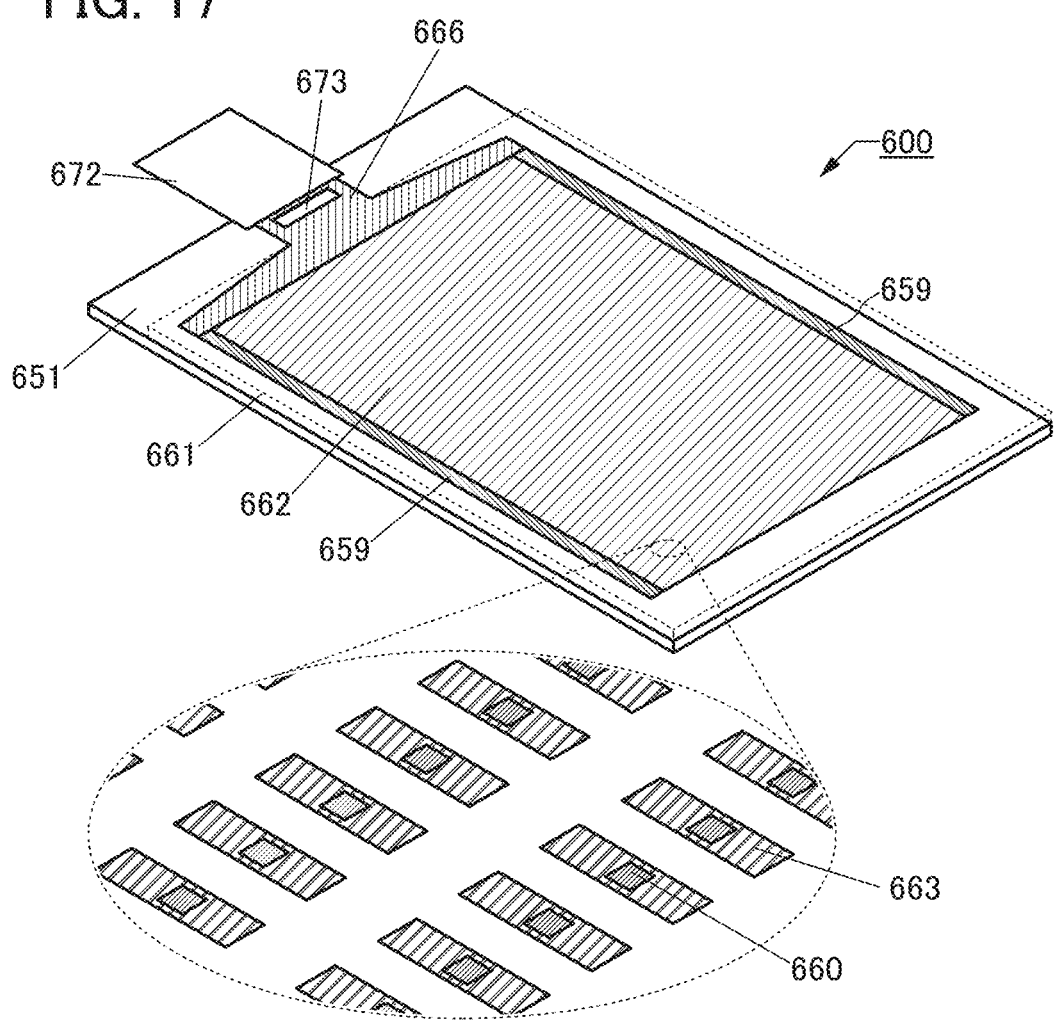
FIG. 17 illustrates a structure example of a display panel.

FIG. 17 is a schematic perspective view illustrating a display panel 600 of one embodiment of the present invention. In the display panel 600, a substrate 651 and a substrate 661 are attached to each other. In FIG. 17, the substrate 661 is denoted by a dashed line.

The display panel 600 includes a display portion 662, a circuit 659, a wiring 666, and the like. The substrate 651 is provided with the circuit 659, the wiring 666, a conductive film 663 that serves as a pixel electrode, and the like. In FIG. 17, an IC 673 and an FPC 672 are mounted on the substrate 651. Thus, the structure illustrated in FIG. 17 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion 662 or the circuit 659. The signal or electric power is input to the wiring 666 from the outside through the FPC 672 or from the IC 673.

FIG. 17 shows an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 17 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 17, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<Cross-Sectional Structure Example>

Figure 18:
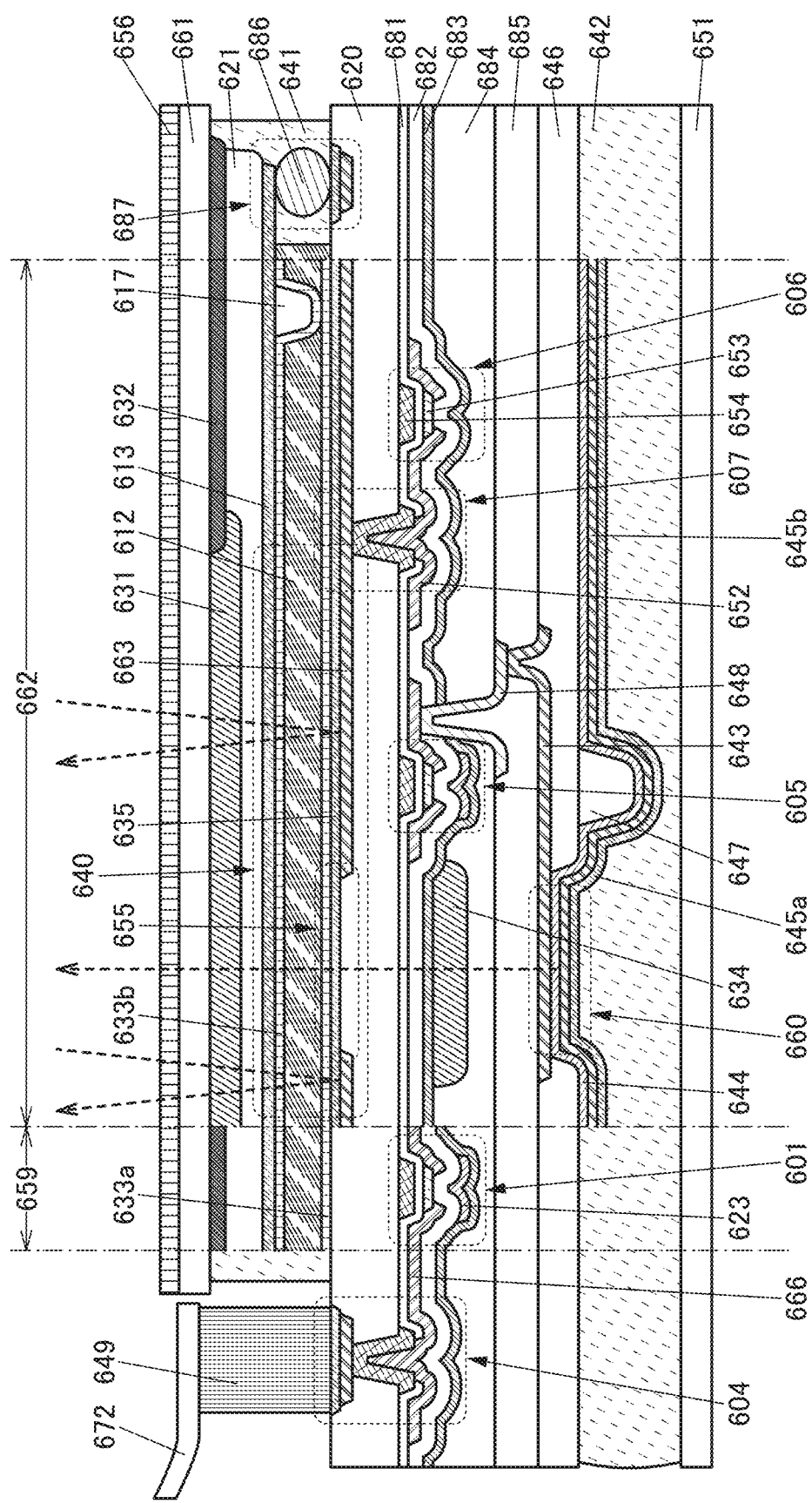
FIG. 18 illustrates a structure example of a display panel.

FIG. 18 shows an example of cross sections of part of a region including the FPC 672, part of a region including the circuit 659, and part of a region including the display portion 662 of the display panel illustrated in FIG. 17.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633a is provided between the liquid crystal layer 612 and the conductive film 635 and the alignment film 633b is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive films 663 and 635, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645b are stacked in this order from the insulating film 620 side. In addition, a conductive film 645a is provided to cover the conductive film 645b. The conductive film 645*b* contains a material reflecting visible light, and the conductive films 643 and 645*a* contain a material transmitting visible light. Light is emitted from the light-emitting element 660 to the substrate 661 side through the coloring layer 634, the insulating film 620, the opening 655, the conductive film 613, and the like.

Here, as illustrated in FIG. 18, the conductive film 635 transmitting visible light is preferably provided for the opening 655. Accordingly, the liquid crystal is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645*a* is formed using a blocking mask (metal mask), the insulating film 647 may have a function of preventing the blocking mask from being in contact with a surface on which the EL layer 644 or the conductive film 645*a* is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrate 651 and the substrate 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 18, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 18 illustrates an example of the circuit 659 in which the transistor 601 is provided.

The structure in which the semiconductor film 653 where a channel is formed is provided between two gates is used as an example of the transistors 601 and 605 in FIG. 18. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in this order over a support substrate provided with a separation layer, and the transistor 605, the transistor 606, the light-emitting element 660, and the like are formed.

Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, the liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide or a metal nitride is preferably used. In the case of using a metal oxide, a material in which at least one of the concentrations of hydrogen, boron, phosphorus, nitrogen, and other impurities and the number of oxygen vacancies is made to be higher than those in a semiconductor layer of a transistor is used for the conductive film 635.

<Components>

The above components will be described below. Note that descriptions of structures having functions similar to those in the above embodiments are omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or a light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

<Manufacturing Method Example>

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 µm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

At least part of this embodiment can be implemented in combination with any of the other embodiments described in this specification as appropriate.

Embodiment 4

In this embodiment, a metal oxide of one embodiment of the present invention is described.

The metal oxide of one embodiment of the present invention includes indium (In), M(M is Al, Ga, Y, or Sn), and zinc (Zn). Specifically, M is preferably gallium (Ga). In the following description, Ga is used as M.

Here, the case where silicon (Si), boron (B), or carbon (C) exists as an impurity in an In—Ga—Zn oxide is described.
<Calculation Model and Calculation Method>

First, calculations were performed using a reference model of an In—Ga—Zn oxide in an amorphous state which has no impurities, a model in which one Si atom is added to the reference model, a model in which one B atom is added to the reference model, and a model in which one C atom is added to the reference model.

Figure 19A:
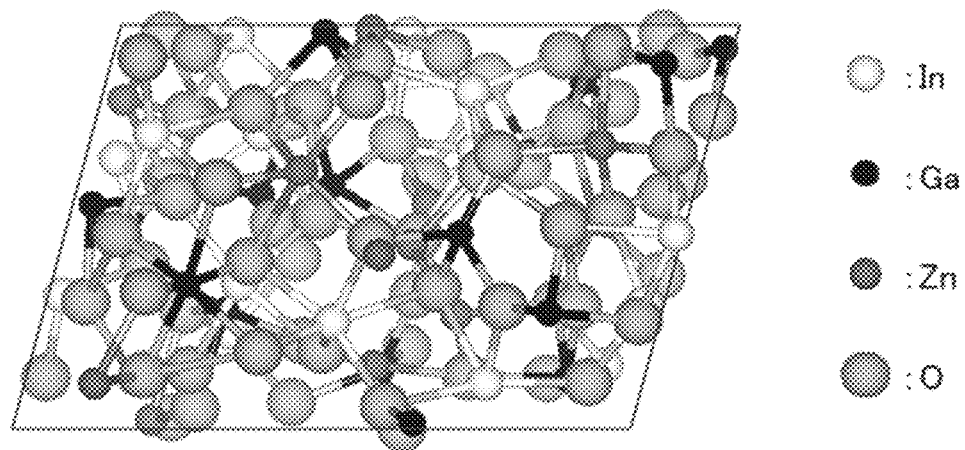
FIGS. 19A and 19B illustrate a model of a metal oxide of one embodiment and its density of states.

Specifically, a model 700 with [In]:[Ga]:[Zn]:[O]=1:1:1:4 shown in FIG. 19A was used as the reference crystal model. Note that the model 700 includes 112 atoms.

Strictly, an In-M-Zn oxide having a CAC composition is not in an amorphous state. On the other hand, the In-M-Zn oxide having the CAC composition has lower crystallinity than an In-M-Zn oxide having a CAAC structure. Accordingly, a model in an amorphous state was used for convenience to reduce influence of the crystal structure and observe the bonding state.

In the model 700, a Si atom, a B atom, or a C atom was assumed to exist as an impurity, and one Si atom, one B atom, or one C atom was located in an interstitial site of the model 700. Note that one impurity was added to the model 700 including the 112 atoms. Accordingly, the impurity concentration of the model is approximately $7 \times 10^{20}/cm^3$.

Figure 20A:
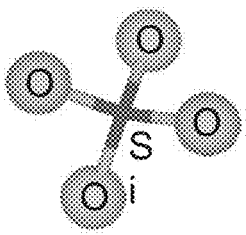
FIGS. 20A to 20D illustrate local structures of models of metal oxides to which impurities are added in one embodiment and their densities of states.
Figure 20B:
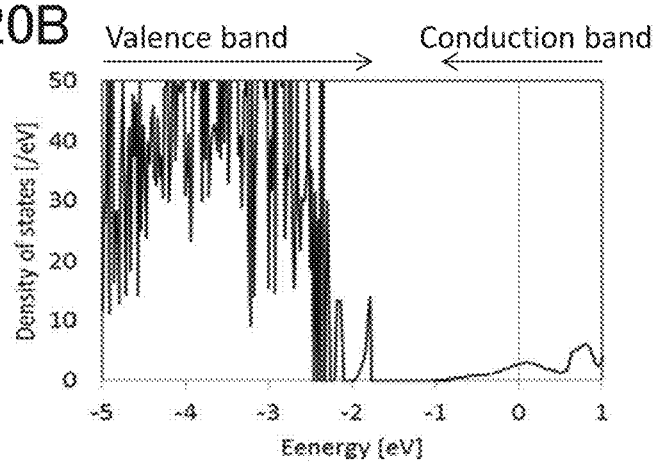
Figure 20C:
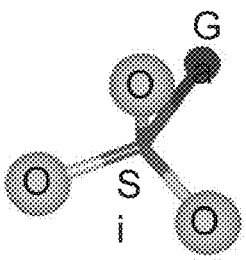

In the case where one Si atom exists as an impurity, a local structure 702 which is the vicinity of the Si atom extracted from a model in which the Si atom is bonded to four O atoms is shown in FIG. 20A, and a local structure 704 which is the vicinity of the Si atom extracted from a model in which the Si atom is bonded to three O atoms and one Ga atom is shown in FIG. 20C.

In the case where one B atom exists as an impurity, a local structure 706 which is the vicinity of the B atom extracted from a model in which the B atom is bonded to three O atoms is shown in FIG. 21A, and a local structure 708 which is the vicinity of the B atom extracted from the model is shown in FIG. 21C.

Figure 22A:
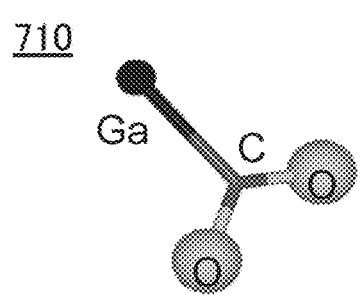
FIGS. 22A to 22D illustrate local structures of models of metal oxides to which impurities are added in one embodiment and their densities of states.
Figure 22B:
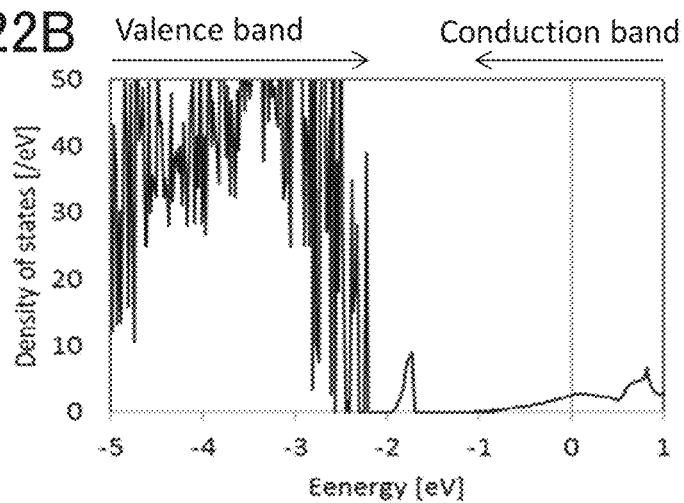
Figure 22C:
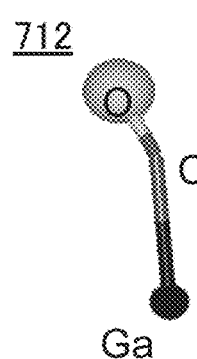

In the case where one C atom exists as an impurity, a local structure 710 which is the vicinity of the C atom extracted from a model in which the C atom is bonded to two O atoms and one Ga atom is shown in FIG. 22A, and a local structure 712 which is the vicinity of the C atom extracted from a model in which the C atom is bonded to one O atom and one Ga atom is shown in FIG. 22C.

The specific calculation is as follows. A first principle electronic state calculation package, Vienna Ab initio Simulation Package (VASP), was used for the atomic relaxation calculation. The calculation conditions are listed in Table 1 below.

TABLE 1

| Software | VASP | |
|---|---|---|
| Exchange-correlation functional | GGA-PBE | |
| Pseudopotential | PAW method | |
| Cut-off energy of plane wave | 800 ev | |
| Sampling point k | Structure optimization | 1 × 1 × 1 |
| | Density of states | 2 × 2 × 2 |

<Density of States>

Figure 19B:
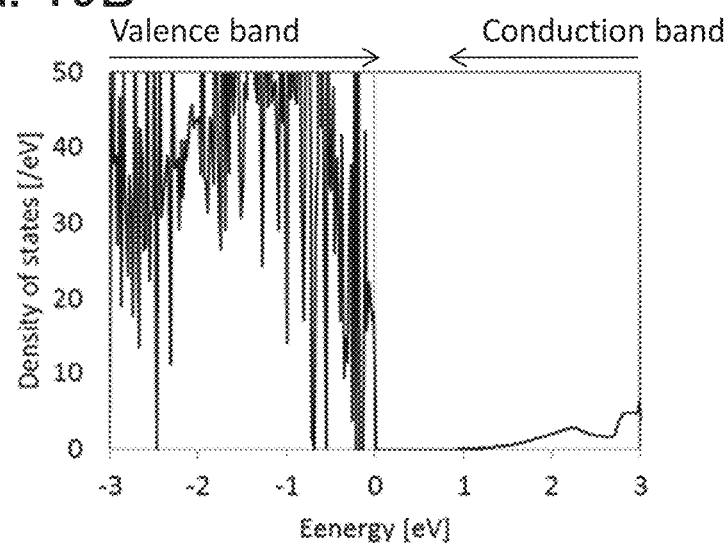

FIG. 19B shows the density of states in FIG. 19A. In FIG. 19B, the Fermi level (the energy of the highest occupied level of electrons) is adjusted to be 0 eV in the horizontal axis. It is found from FIG. 19B that the electrons reach the valence band maximum and the level in the gap does not exist.

Figure 20D:
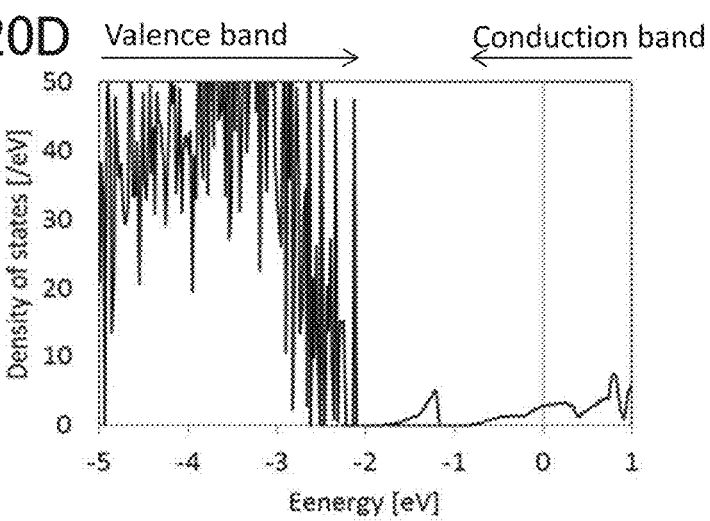

FIGS. 20B and 20D show the density of states in the case where one Si atom is added as an impurity. Note that FIG. 20B shows the density of states in the case where the local structure 702 in FIG. 20A is included. FIG. 20D shows the density of states in the case where the local structure 704 in FIG. 20C is included.

It is found from FIGS. 20B and 20D that when a Si atom exists, the Fermi level is located in the conduction band. This indicates that carriers are generated in an In—Ga—Zn oxide (the In—Ga—Zn oxide is made to be an n-type) owing to Si atoms.

FIGS. 21B and 21D show the density of states in the case where one B atom is added as an impurity. Note that FIG. 21B shows the density of states in the case where the local structure 706 in FIG. 21A is included. FIG. 21D shows the density of states in the case where the local structure 708 in FIG. 21C is included.

It was found from FIGS. 21B and 21D that when a B atom exists, the Fermi level is located in the conduction band. This indicates that carriers are generated in an In—Ga—Zn oxide (the In—Ga—Zn oxide is made to be an n-type) owing to B atoms.

Figure 22D:
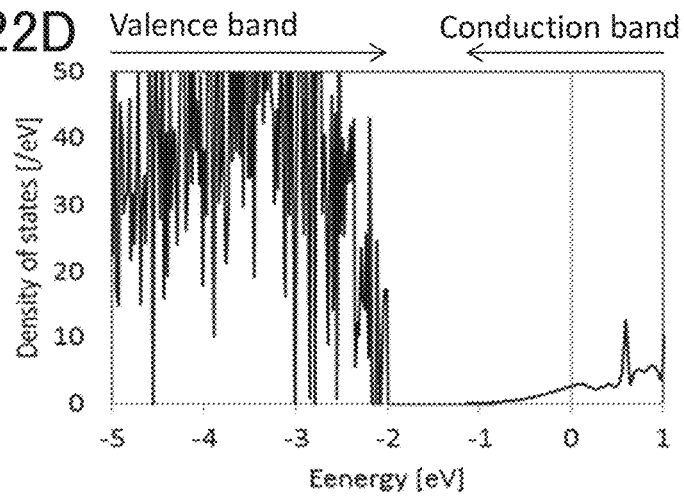

FIGS. 22B and 22D show the density of states in the case where one C atom is added as an impurity. Note that FIG. 22B shows the density of states in the case where the local structure 710 in FIG. 22A is included. FIG. 22D shows the density of states in the case where the local structure 712 in FIG. 22C is included.

It was found from FIGS. 22B and 22D that when a C atom exists, the Fermi level is located in the conduction band. This indicates that carriers are generated in an In—Ga—Zn oxide (the In—Ga—Zn oxide is made to be an n-type) owing to C atoms.

It is highly probable that Si atoms and B atoms exist as cations in an In—Ga—Zn oxide because the electronegativities of Si and B are closer to the electronegativities of In, Ga, and Zn than the electronegativity of O. Thus, it is supposed that carriers are generated.

Although C is bonded to a metal and O because the electronegativity of C is between the electronegativity of O and the electronegativities of In, Ga, and Zn, it is assumed that C is likely to exist as cations basically.

Furthermore, a Si atom, a B atom, and a C atom are more strongly bonded to an O atom than an In atom, a Ga atom, and a Zn atom are. For that reason, by the entry of a Si atom, a B atom, and a C atom, O atoms bonded to an In atom, a Ga atom, and a Zn atom are trapped by the Si atom, the B atom, and the C atom, which probably forms deep levels corresponding to oxygen vacancies.

The structure and method described in this embodiment can be implemented by being combined as appropriate with any of the other structures and methods described in the other embodiments.

Example 1

In this example, measurement results of a metal oxide of one embodiment of the present invention over a substrate are described. A variety of methods were used for the measurement. Note that in this example, Samples 1A, 1B, 1C, 1D, 1E, 1F, 1G, 1H, and 1J were fabricated.

<<Structure of Samples and Fabrication Method Thereof>>

Samples 1A to 1H and 1J relating to one embodiment of the present invention are described below. Samples 1A to 1H and 1J each include a substrate and a metal oxide over the substrate.

Samples 1A to 1H and 1J were fabricated at different temperatures and different oxygen flow rate ratios in formation of the metal oxide. The temperatures and the oxygen flow rate ratios in formation of the metal oxides of Samples 1A to 1H and 1J are shown in Table 2 below.

TABLE 2

| | Flow rate [sccm] | | O₂ ratio | Formation temperature |
|---|---|---|---|---|
| | O₂ | Ar | [%] | [° C.] |
| Sample 1A | 30 | 270 | 10 | RT. |
| Sample 1B | 90 | 210 | 30 | RT. |
| Sample 1C | 300 | 0 | 100 | RT. |
| Sample 1D | 30 | 270 | 10 | 130 |
| Sample 1E | 90 | 210 | 30 | 130 |
| Sample 1F | 300 | 0 | 100 | 130 |
| Sample 1G | 30 | 270 | 10 | 170 |
| Sample 1H | 90 | 210 | 30 | 170 |
| Sample 1J | 300 | 0 | 100 | 170 |

Next, methods for fabricating the samples will be described.

A glass substrate was used as the substrate. Over the substrate, a 100-nm-thick In—Ga—Zn oxide was formed as a metal oxide with a sputtering apparatus. The formation conditions were as follows: the pressure in a chamber was 0.6 Pa; and a metal oxide target (an atomic ratio of In:Ga:Zn=4:2:4.1) was used as a target. The metal oxide target provided in the sputtering apparatus was supplied with an AC power of 2500 W.

The formation temperatures and oxygen flow rate ratios shown in the above table were used as the conditions for forming metal oxides to fabricate Samples 1A to 1H and 1J.

Through the above steps, Samples 1A to 1H and 1J of this example were fabricated.

<Analysis by X-Ray Diffraction>

In this section, results of X-ray diffraction (XRD) measurement performed on the metal oxides over the glass substrates are described. As an XRD apparatus, D8 ADVANCE manufactured by Bruker AXS was used. The conditions were as follows: scanning was performed by an out-of-plane method at θ/2θ; the scanning range was 15 deg. to 50 deg.; the step width was 0.02 deg.; and the scanning speed was 3.0 deg./min.

FIG. 23 shows an XRD spectrum of the samples measured by an out-of-plane method.

In the XRD spectra shown in FIG. 23, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 23, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<TEM Images and Electron Diffraction>

This section describes the observation and analysis results of Samples 1A, 1D, and 1J with a high-angle annular dark-field scanning transmission electron microscope (HAADF-STEM). An image obtained with an HAADF-STEM is also referred to as a TEM image.

This section describes electron diffraction patterns obtained by irradiation of Samples 1A, 1D, and 1J with an electron beam with a probe diameter of 1 nm (also referred to as a nanobeam).

The plan-view TEM images were observed with a spherical aberration corrector function. The HAADF-STEM images were obtained using an atomic resolution analytical electron microscope JEM-ARM200F manufactured by JEOL Ltd. under the following conditions: the acceleration voltage was 200 kV; and irradiation with an electron beam with a diameter of approximately 0.1 nm was performed.

Note that the electron diffraction patterns were observed while an electron beam irradiation was performed in the following manner that the electron beam was moved at a constant rate for 35 seconds.

Figure 24A:
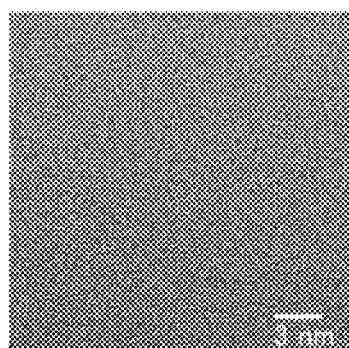
FIGS. 24A to 24F show cross-sectional TEM images and electron diffraction patterns of samples of Example.
Figure 24B:
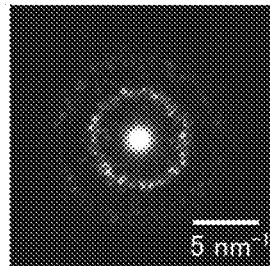
Figure 24C:
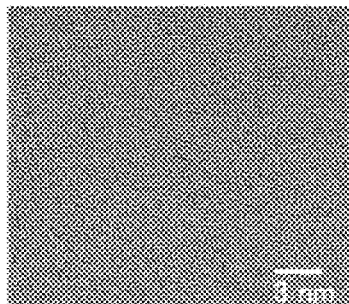
Figure 24D:
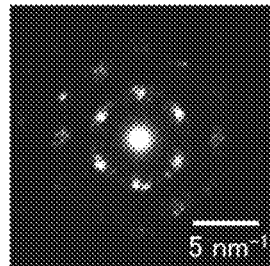
Figure 24E:
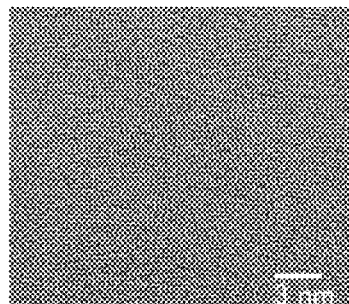
Figure 24F:
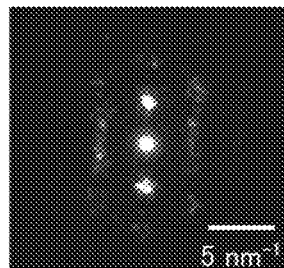

FIG. 24A shows a cross-sectional TEM image of Sample 1A, and FIG. 24B shows an electron diffraction pattern of Sample 1A. FIG. 24C shows a cross-sectional TEM image of Sample 1D, and FIG. 24D shows an electron diffraction pattern of Sample 1D. FIG. 24E shows a cross-sectional TEM image of Sample 1J, and FIG. 24F shows an electron diffraction pattern of Sample 1J.

It is known that, for example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when a metal oxide including a nanocrystal (in particular, in the case where such a metal oxide has a function similar to that of a semiconductor, it is referred to as a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the metal oxide including a nanocrystal obtained using an electron beam with a small probe diameter (e.g., smaller than 50 nm). Furthermore, in a nanobeam electron diffraction pattern of the metal oxide including a nanocrystal, regions with high luminance in a circular (ring) pattern are shown in some cases. Also in a nanobeam electron diffraction pattern of the metal oxide including a nanocrystal, a plurality of bright spots are shown in a ring-like shape in some cases.

A nanocrystal (hereinafter, also referred to as nc) is found in Sample 1A from the result of the cross-sectional TEM observation in FIG. 24A. As shown in FIG. 24B, the observed electron diffraction pattern of Sample 1A has a region with high luminance in a circular (ring) pattern. Furthermore, a plurality of spots are shown in the ring-shaped region.

Sample 1D is found to have a CAAC structure and a nanocrystal from the result of the cross-sectional TEM observation in FIG. 24C. As shown in FIG. 24D, the observed electron diffraction pattern of Sample 1D has a region with high luminance in a circular (ring) pattern. Furthermore, a plurality of spots are shown in the ring-shaped region. In the diffraction pattern, spots derived from the (009) plane are slightly observed.

Sample 1J is clearly found to have layered arrangement of a CAAC structure from the result of the cross-sectional TEM observation in FIG. 24E. Furthermore, spots derived from the (009) plane are clearly observed from the result of the electron diffraction pattern of Sample 1J in FIG. 24F.

The features observed in the cross-sectional TEM images and the plan-view TEM images are one aspect of a structure of a metal oxide.

Next, electron diffraction patterns obtained by irradiation of Sample 1A with an electron beam with a probe diameter of 1 nm (also referred to as a nanobeam) are shown in FIGS. 25A to 25L.

Electron diffraction patterns of points indicated by black dots a1, a2, a3, a4, and a5 in the plan-view TEM image of Sample 1A in FIG. 25A are observed. Note that the electron diffraction patterns are observed while electron beam irradiation is performed in the following manner that the electron beam was moved at a constant rate for 35 seconds. FIGS. 25C, 25D, 25E, 25F, and 25G show the results of the points indicated by the black dots a1, a2, a3, a4, and a5, respectively.

In FIGS. 25C, 25D, 25E, 25F, and 25G, regions with high luminance in a ring pattern were shown. Furthermore, a plurality of spots are shown in the ring-shaped regions.

Electron diffraction patterns of points indicated by black dots b1, b2, b3, b4, and b5 in the cross-sectional TEM image of Sample 1A in FIG. 25B are observed. FIGS. 25H, 25I, 25J, 25K, and 25L show the results of the points indicated by the black dots b1, b2, b3, b4, and b5, respectively.

In FIGS. 25H, 25I, 25J, 25K, and 25L, regions with high luminance in a ring pattern are shown. Furthermore, a plurality of spots are shown in the ring-shaped regions.

That is, it is found that Sample 1A has an nc structure and has characteristics distinctly different from those of a metal oxide having an amorphous structure and those of a metal oxide having a single crystal structure.

According to the above description, the electron diffraction patterns of Sample 1A and Sample 1D each have a region with high luminance in a ring pattern and a plurality of bright spots appear in the ring-shaped region. Accordingly, Sample 1A exhibits an electron diffraction pattern of the metal oxide including nanocrystals and does not show alignment in the plane direction and the cross-sectional direction. Sample 1D is found to be a mixed material of the nc structure and the CAAC structure.

In the electron diffraction pattern of Sample 1J, spots derived from the (009) plane of an InGaZnO$_4$ crystal are included. Thus, Sample 1J has c-axis alignment and the c-axes are aligned in the direction substantially perpendicular to the formation surface or the top surface of Sample 1J.

<Analysis of TEM Image>

This section describes the observation and analysis results of Samples 1A, 1C, 1D, 1F, and 1G with an HAADF-STEM.

The results of image analysis of plan-view TEM images are described. The plan-view TEM images were obtained with a spherical aberration corrector function. The plan-view TEM images were obtained using an atomic resolution analytical electron microscope JEM-ARM200F manufactured by JEOL Ltd. under the following conditions: the acceleration voltage was 200 kV; and irradiation with an electron beam with a diameter of approximately 0.1 nm was performed.

Figure 26:
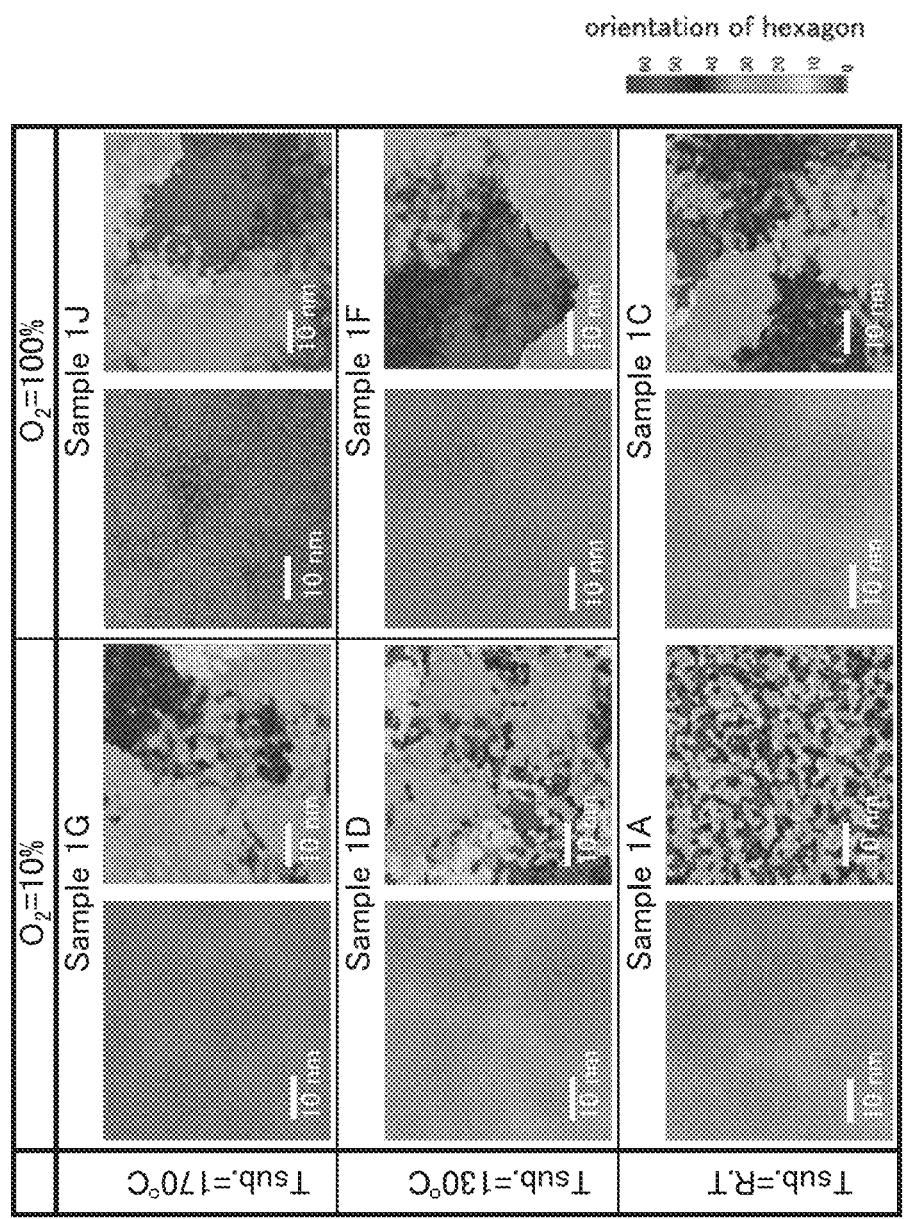
FIG. 26 shows plan-view TEM images of samples of Example and images obtained through analysis thereof.

In FIG. 26, the plan-view TEM images of Samples 1A, 1C, 1D, 1F, 1G, and 1J and images obtained through image processing of the plan-view TEM images are shown. Note that in a table in FIG. 26, left views are the plan-view TEM images and right views are the images obtained through image processing of the plan-view TEM images on the left side.

Image processing and image analyzing methods are described. Image processing was performed as follows. The plan-view TEM image in FIG. 26 was subjected to fast Fourier transform (FFT), so that an FFT image was obtained. Then, the obtained FFT image was subjected to mask processing except for a range from 2.8 nm$^{-1}$ to 5.0 nm$^{-1}$. After that, the FFT image subjected to mask processing was subjected to inverse fast Fourier transform (IFFT) to obtain an FFT filtering image.

To conduct the image analysis, lattice points were extracted from the FFT filtering image in the following manner. First, noise in the FFT filtering image was removed. To remove the noise, the luminance of a region within a 0.05-nm radius was smoothed using Formula 1.

[Formula 1]

$$S\_Int(x, y) = \sum_{r \leq 0.05} \frac{Int(x', y')}{r} \quad (1)$$

Note that S_Int(x,y) represents the smoothed luminance at the coordinates (x,y), r represents the distance between the coordinates (x,y) and the coordinates (x',y'), and Int(x',y') represents the luminance at the coordinates (x',y'). In the calculation, r is regarded as 1 when it is 0.

Then, a search for lattice points was conducted. The coordinates with the highest luminance among candidate lattice points within a 0.22-nm radius were regarded as the lattice point. At this point, a candidate lattice point was extracted. Within a 0.22-nm radius, detection errors of lattice points due to noise can be less frequent. Note that adjacent lattice points are a certain distance away from each other in the TEM image; thus, two or more lattice points are unlikely to be observed within a 0.22-nm radius.

Subsequently, coordinates with the highest luminance within a 0.22-nm radius from the extracted candidate lattice point were extracted to redetermine a candidate lattice point. The extraction of a candidate lattice point was repeated in this manner until no new candidate lattice point appeared; the coordinates at that point were determined as a lattice point. Similarly, determination of another lattice point was performed at a position 0.22 nm or more away from the determined lattice point; thus, lattice points were determined in the entire region. The determined lattice points are collectively called a lattice point group.

Figure 27A:
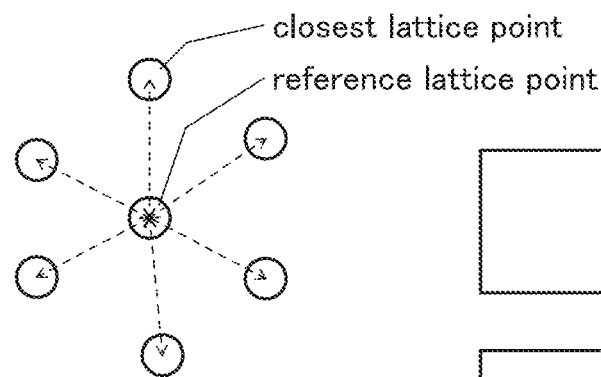
FIGS. 27A to 27D illustrate a method for deriving a rotation angle of a hexagon.
Figure 27B:
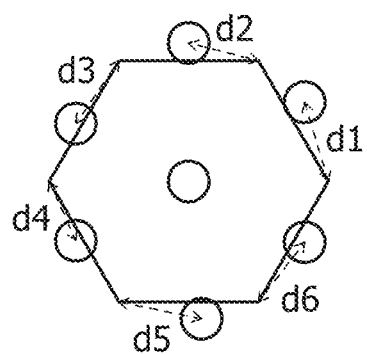
Figure 27C:
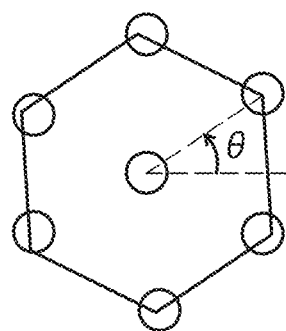
Figure 27D:
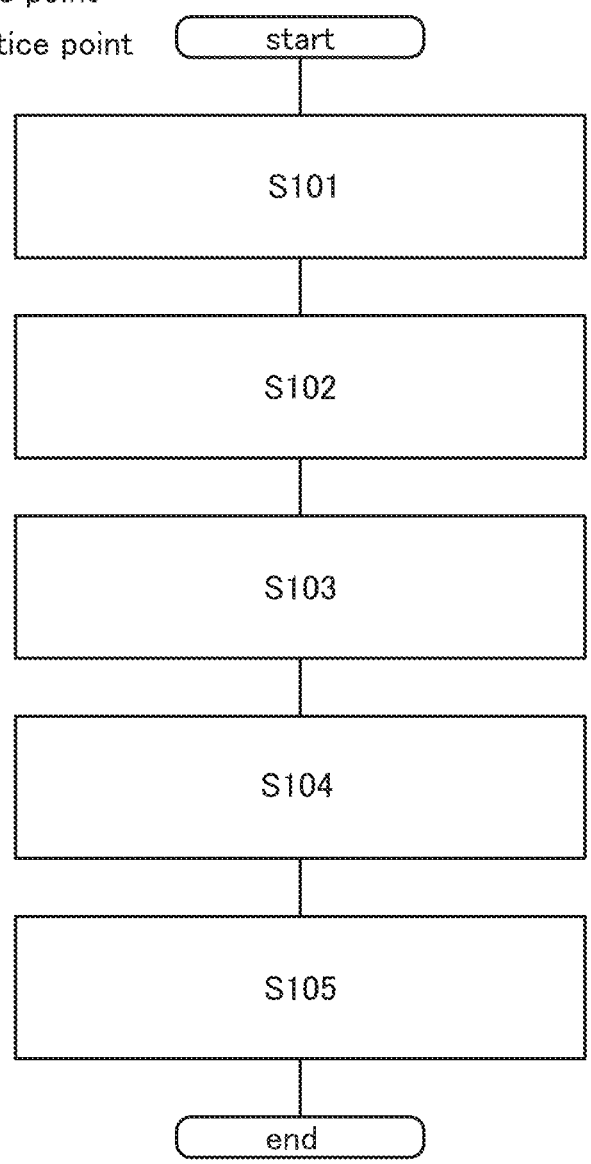

Here, a method for deriving an orientation of a hexagonal lattice from the extracted lattice point group is described with reference to schematic diagrams in FIGS. 27A to 27C and a flow chart in FIG. 27D. First, a reference lattice point was determined and the six closest lattice points to the reference lattice point were connected to form a hexagonal lattice (see FIG. 27A and Step S101 in FIG. 27D). After that, an average distance R between the reference lattice point, which was the center point of the hexagonal lattice, and each of the lattice points, which is a vertex, was calculated. Then, a regular hexagon was formed with the use of the reference lattice point as the center point and the calculated distance R as the distance from the center point to each vertex (see Step S102 in FIG. 27D). The distances from the vertices of the regular hexagon to their respective closest lattice points were regarded as a distance d1, a distance d2, a distance d3, a distance d4, a distance d5, and a distance d6 (see FIG. 27B and Step S103 in FIG. 27D). Next, the regular hexagon was rotated around the center point through 60° by 0.1°, and the average deviation between the hexagonal lattice and the rotated regular hexagon [D=(d1+d2+d3+d4+d5+d6)/6] was calculated (see Step S104 in FIG. 27D). Then, a rotation angle 19 of the regular hexagon when the average deviation D becomes minimum was calculated as the orientation of the hexagonal lattice (see FIG. 27C and Step S105 in FIG. 27D).

Next, an observation area of the plan-view TEM image was adjusted so that hexagonal lattices whose orientations were 30° account for the highest percentage. In such a condition, the average orientation of hexagonal lattice within a 1-nm radius was calculated. The plan-view TEM image obtained through image processing was shown where color or gradation changes in accordance with the angle of the hexagonal lattice in the region. The image obtained through image processing of the plan-view TEM image in FIG. 26 is an image obtained by performing image analysis on the plan-view TEM image in FIG. 26 by the above method and applying color in accordance with the angle of the hexagonal lattice. In other words, the image obtained through the image processing of the plan-view TEM image is an image in which the orientations of lattice points in certain wavenumber ranges are extracted by color-coding the certain wavenumber ranges in an FFT filtering image of the plan-view TEM image.

As shown in FIG. 26, in Samples 1A and 1D in which nc is observed, the hexagons are oriented randomly and distributed in a mosaic pattern. In Sample 1J in which a layered structure is observed in the cross-sectional TEM image, regions with uniformly oriented hexagons exist in a large area of several tens of nanometers. In Sample 1D, it is found that an nc region in a random mosaic pattern and a large-area region with uniformly oriented hexagons as in Sample 1J are included.

It is found from FIG. 26 that as the substrate temperature at the time of formation is lower or the oxygen gas flow rate ratio at the time of formation is lower, regions in which the hexagons are oriented randomly and distributed in a mosaic pattern are likely to exist.

Through the analysis of a plan-view TEM image of a CAAC-OS, a boundary portion where angles of hexagonal lattices change can be examined.

Next, Voronoi diagrams were formed using lattice point groups in Sample 1A. A Voronoi diagram is an image partitioned by regions including a lattice point group. Each lattice point is closer to regions surrounding the lattice point than to any other lattice point. A method for forming a Voronoi diagram is described below in detail using schematic diagrams in FIGS. 28A to 28D and a flow chart in FIG. 28E.

Figure 28A:
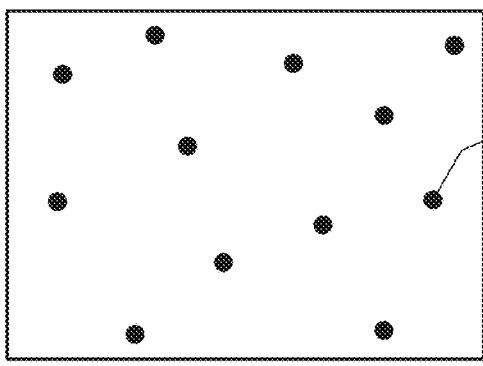
FIGS. 28A to 28E illustrate a method for forming a Voronoi diagram.
Figure 28B:
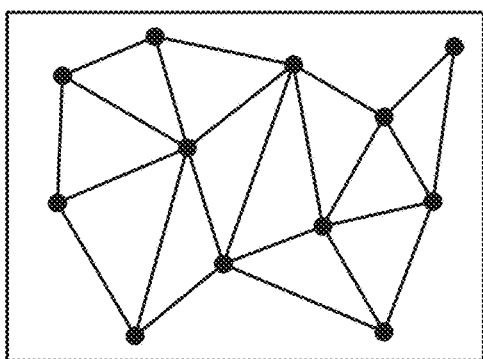
Figure 28C:
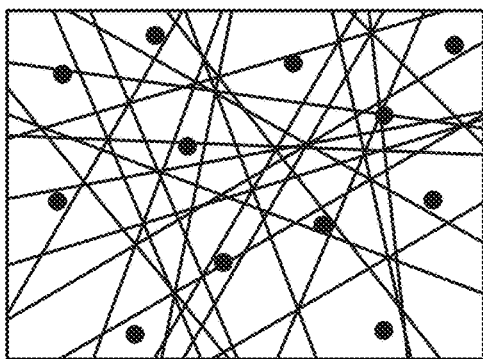
Figure 28D:
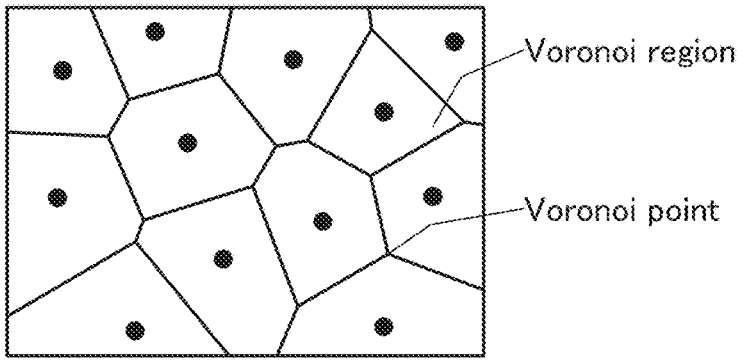
Figure 28E:
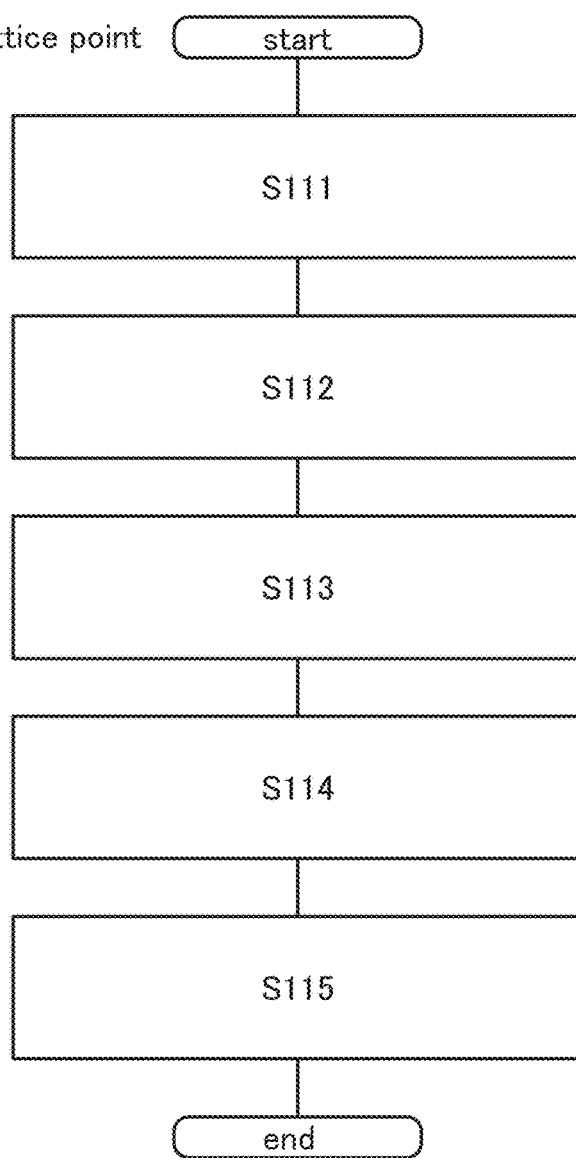

First, a lattice point group was extracted by the method described using FIGS. 27A to 27D or the like (see FIG. 28A and Step S111 in FIG. 28E). Next, adjacent lattice points were connected with segments (see FIG. 28B and Step S112 in FIG. 28E). Then, perpendicular bisectors of the segments were drawn (see FIG. 28C and Step S113 in FIG. 28E). Subsequently, points where three perpendicular bisectors intersect were extracted (see Step S114 in FIG. 28E). The points are called Voronoi points. After that, adjacent Voronoi points were connected with segments (see FIG. 28D and Step S115 in FIG. 28E). A polygonal region surrounded by the segments at this point is called a Voronoi region. In the above method, a Voronoi diagram was formed.

Figure 29:
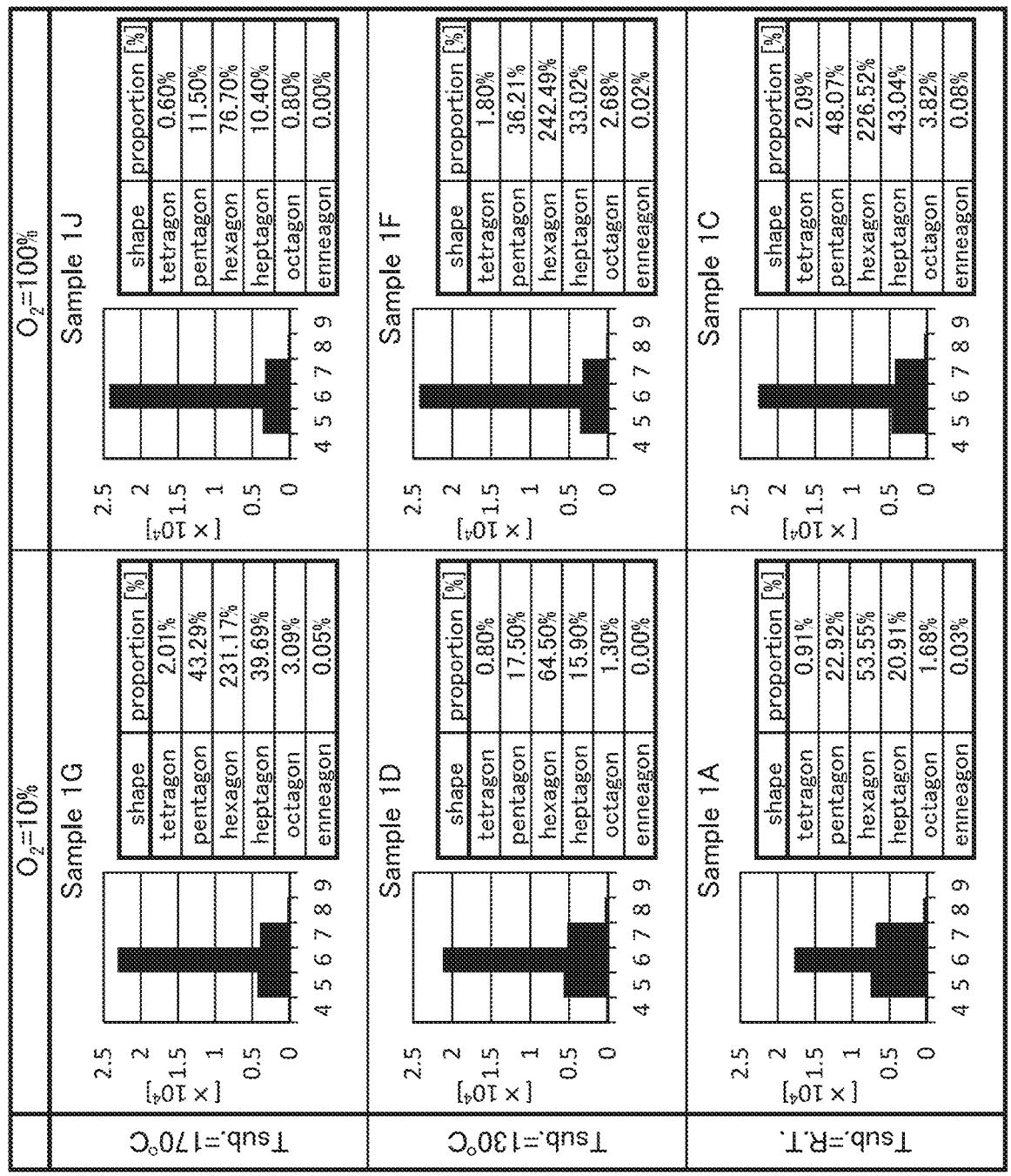
FIG. 29 shows the number of shapes of Voronoi regions of Example and proportions thereof.

FIG. 29 shows the proportions of the shapes of Voronoi regions (tetragon, pentagon, hexagon, heptagon, octagon, and enneagon) in Samples 1A, 1C, 1D, 1F, 1G, and 1J. Bar graphs show the numbers of the shapes of Voronoi regions (tetragon, pentagon, hexagon, heptagon, octagon, and enneagon) in the samples. Furthermore, tables show the proportions of the shapes of Voronoi regions (tetragon, pentagon, hexagon, heptagon, octagon, and enneagon) in the samples.

It is found from FIG. 29 that there is a tendency that the proportion of hexagons is high in Sample 1J with a high degree of crystallinity and the proportion of hexagons is low in Sample 1A with a low degree of crystallinity. The proportion of hexagons in Sample 1D is between those in Samples 1J and 1A. Accordingly, it is found from FIG. 29 that the crystal state of the metal oxide significantly differs under different formation conditions.

It is found from FIG. 29 that as the substrate temperature at the time of formation is lower or the oxygen gas flow rate ratio at the time of formation is lower, the degree of crystallinity is lower and the proportion of hexagons is lower.

<Elementary Analysis>

This section describes the analysis results of elements included in Sample 1A. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point were attributed to electron transition to the L shell in an In atom, electron transition to the K shell in a Ga atom, electron transition to the K shell in a Zn atom, and electron transition to the K shell in an O atom, and the proportions of the atoms in the point are calculated. An EDX mapping image indicating distributions of proportions of atoms can be obtained through the process in an analysis target region of a sample.

FIGS. 30A to 30H show a cross-sectional TEM image, a plan-view TEM image, and EDX mapping images of Sample 1A. In the EDX mapping images, the proportion of an element is indicated by grayscale: the more measured atoms exist in a region, the brighter the region is; the less measured atoms exist in a region, the darker the region is. The magnification of the EDX mapping images in FIGS. 30B to 30D and 30F to 30H is 7,200,000 times.

FIG. 30A shows a cross-sectional TEM image, and FIG. 30E shows a plan-view TEM image. FIG. 30B shows a cross-sectional EDX mapping image of In atoms, and FIG. 30F shows a plan-view EDX mapping image of In atoms. In the EDX mapping image in FIG. 30B, the proportion of the In atoms in all the atoms is 9.28 atomic % to 33.74 atomic %. In the EDX mapping image in FIG. 30F, the proportion of the In atoms in all the atoms is 12.97 atomic % to 38.01 atomic %.

FIG. 30C shows a cross-sectional EDX mapping image of Ga atoms, and FIG. 30G shows a plan-view EDX mapping image of Ga atoms. In the EDX mapping image in FIG. 30C, the proportion of the Ga atoms in all the atoms is 1.18 atomic % to 18.64 atomic %. In the EDX mapping image in FIG. 30G, the proportion of the Ga atoms in all the atoms is 1.72 atomic % to 19.82 atomic %.

FIG. 30D shows a cross-sectional EDX mapping image of Zn atoms, and FIG. 30H shows a plan-view EDX mapping image of Zn atoms. In the EDX mapping image in FIG. 30D, the proportion of the Zn atoms in all the atoms is 6.69 atomic % to 24.99 atomic %. In the EDX mapping image in FIG. 30H, the proportion of the Zn atoms in all the atoms is 9.29 atomic % to 28.32 atomic %.

Note that FIGS. 30A to 30D show the same region in the cross section of Sample 1A. FIGS. 30E to 30H show the same region in the plane of Sample 1A.

Figure 31D:
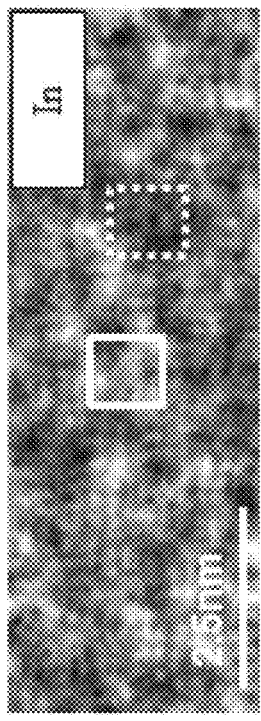
FIGS. 31A to 31F show EDX mapping images of a sample of Example.
Figure 31E:
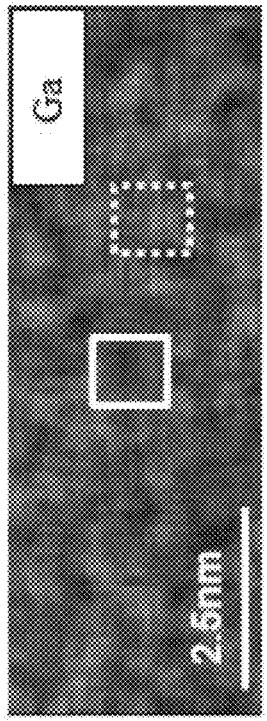
Figure 31F:
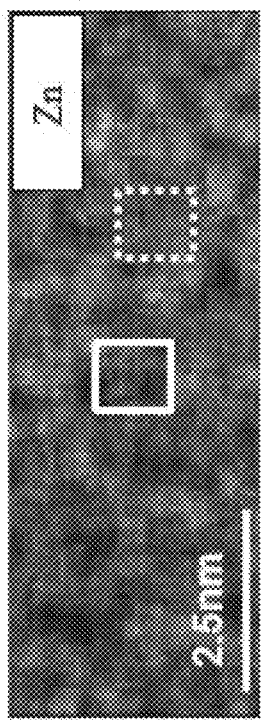
Figure 31A:
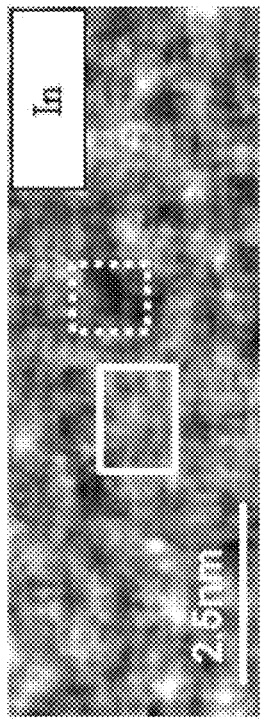
Figure 31B:
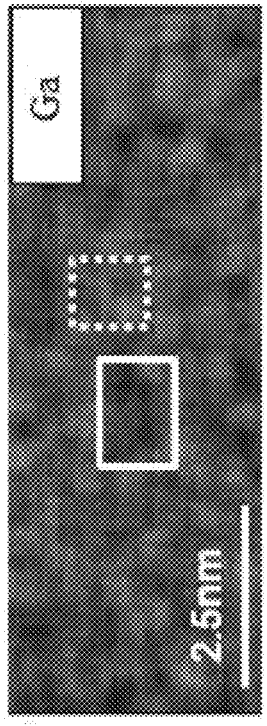
Figure 31C:
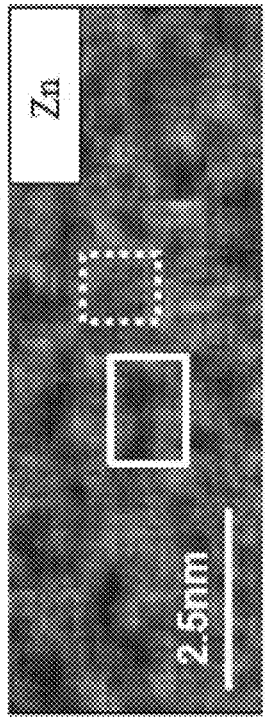

FIGS. 31A to 31F show enlarged cross-sectional EDX mapping images and enlarged plan-view EDX mapping images of Sample 1A. FIG. 31A is an enlarged view of a part in FIG. 30B. FIG. 31B is an enlarged view of a part in FIG. 30C. FIG. 31C is an enlarged view of a part in FIG. 30D. FIG. 31D is an enlarged view of a part in FIG. 30F. FIG. 31E is an enlarged view of a part in FIG. 30G. FIG. 31F is an enlarged view of a part in FIG. 30H.

The EDX mapping images in FIGS. 31A to 31C show relative distribution of bright and dark areas, indicating that the atoms have distributions in Sample 1A. Areas surrounded by solid lines and areas surrounded by dashed lines in FIGS. 31A to 31C are examined.

As shown in FIG. 31A, a relatively bright region occupies a large area in the area surrounded by the solid line and a relatively dark region occupies in a large area in the area surrounded by the dashed line. As shown in FIG. 31B, a relatively dark region occupies a large area in the area surrounded by the solid line and a relatively bright region occupies a large area in the area surrounded by the dashed line.

That is, it is found that the areas surrounded by the solid lines are regions including a relatively large number of In atoms and the areas surrounded by the dashed lines are regions including a relatively small number of In atoms. FIG. 31C shows that a lower portion of the area surrounded by the solid line is relatively bright and an upper portion thereof is relatively dark. Thus, it is found that the area surrounded by the solid line is a region including $In_{X2}Zn_{Y2}O_{Z2}$, $InO_{X1}$, or the like as a main component.

It is found that the area surrounded by the solid line is a region including a relatively small number of Ga atoms and the area surrounded by the dashed line is a region including a relatively large number of Ga atoms. FIG. 31C shows that a left portion of the area surrounded by the dashed line is relatively dark and a right portion thereof is relatively bright.

Thus, it is found that the area surrounded by the dashed line is a region including $GaO_{X3}$, $Ga_{X4}Zn_{Y4}O_{Z4}$, or the like as a main component.

Similarly, areas surrounded by solid lines and dashed lines in the EDX mapping images in FIGS. 31D to 31F are examined.

As shown in FIG. 31D, a relatively bright region occupies a large area in the area surrounded by the solid line and a relatively dark region occupies a large area in the area surrounded by the dashed line. As shown in FIG. 31E, a relatively dark region occupies a large area in the area surrounded by the solid line and a relatively bright region occupies a large area in the area surrounded by the dashed line.

That is, it is found that the areas surrounded by the solid lines are regions including a relatively large number of In atoms and a relatively small number of Ga atoms. FIG. 31F shows that a lower portion of the area surrounded by the solid line is relatively dark and an upper portion thereof is relatively bright. Thus, it is found that the area surrounded by the solid line is a region including $In_{X2}Zn_{Y2}O_{Z2}$, $InO_{X1}$, or the like as a main component.

It is found that the area surrounded by the dashed line is a region including a relatively small number of In atoms and a region including a relatively large number of Ga atoms. FIG. 31F shows that a right portion of the area surrounded by the dashed line is relatively dark and a left portion thereof is relatively bright. Thus, it is found that the area surrounded by the dashed line is a region including $GaO_{X3}$, $Ga_{X4}Zn_{Y4}O_{Z4}$, or the like as a main component.

Furthermore, as shown in FIGS. 31A to 31F, the In atoms are relatively more uniformly distributed than the Ga atoms, and regions including $InO_{X1}$ as a main component are seemingly joined to each other through a region including $In_{X2}Zn_{Y2}O_{Z2}$ as a main component. It can be thus guessed that the regions including $In_{X2}Zn_{Y2}O_{Z2}$ or $InO_{X1}$ as a main component extend like a cloud.

An In—Ga—Zn oxide having a composition in which the regions including $GaO_{X3}$ as a main component and the regions including $In_{X2}Zn_{Y2}O_{Z2}$ or $InO_{X1}$ as a main component are unevenly distributed and mixed can be referred to as CAC-IGZO.

As shown in FIGS. 31A to 31F, each of the regions including $GaO_{X3}$ as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm.

As described above, it is confirmed that the CAC-IGZO has a structure different from that of an IGZO compound in which metal elements are evenly distributed, and has characteristics different from those of the IGZO compound. That is, it can be confirmed that in the CAC-IGZO, regions including $GaO_{X3}$ or the like as a main component and regions including $In_{X2}Zn_{Y2}O_{Z2}$ or $InO_{X1}$ as a main component are separated to form a mosaic pattern.

Accordingly, it can be expected that when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current ($I_{on}$), high field-effect mobility ($\mu$) and low off-state current ($I_{off}$) can be achieved. A semiconductor element including CAC-IGZO has high reliability. Thus, CAC-IGZO is suitably used in a variety of semiconductor devices typified by a display.

[Samples 1B to 1J]

Figures 2D, 31:
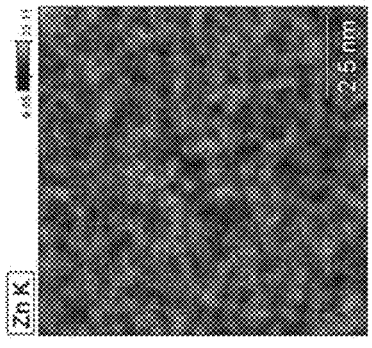
Figures 2H, 31:
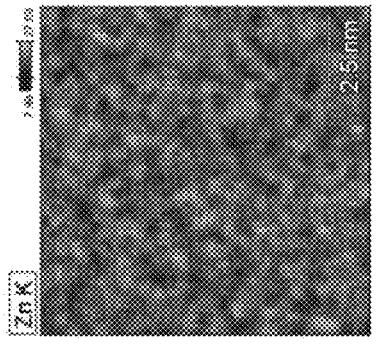
Figures 2C, 31:
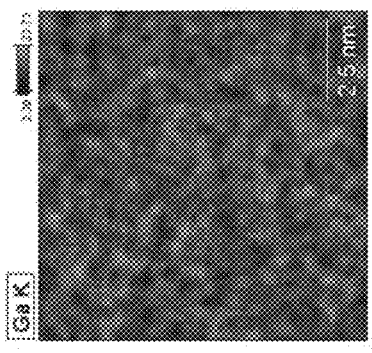

FIGS. 31-2A to 31-2H show a cross-sectional TEM image, a plan-view TEM image, and EDX mapping images of Sample 1B. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-2B to 31-2D and 31-2F to 31-2H is 7,200,000 times.

Figures 2G, 31:
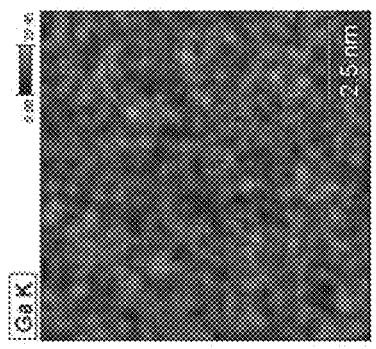
Figures 2B, 31:
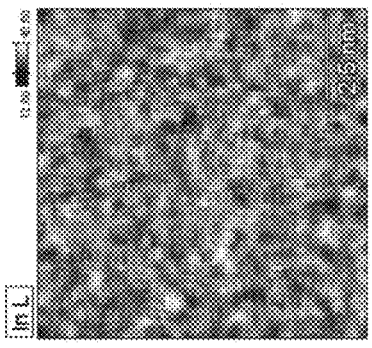
Figures 2F, 31:
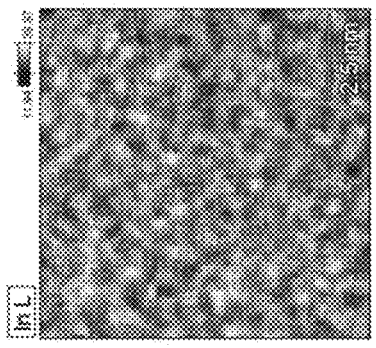
Figures 2A, 31:
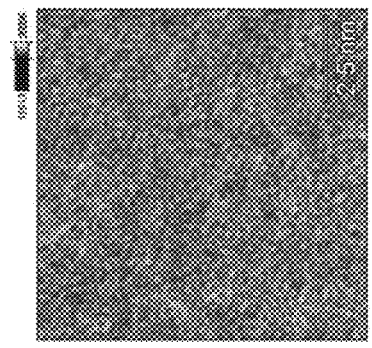
Figures 2E, 31:
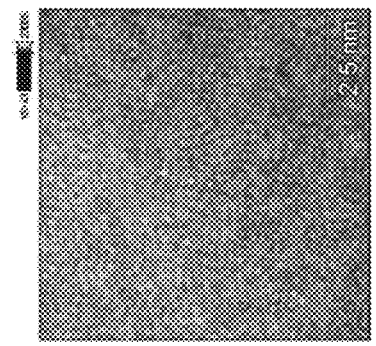
Figures 9A, 31:
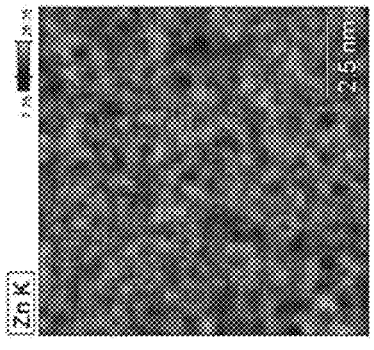
Figures 9B, 31:
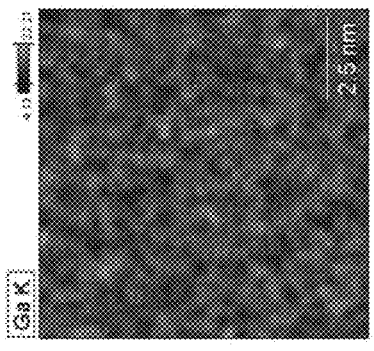
Figures 9C, 31:
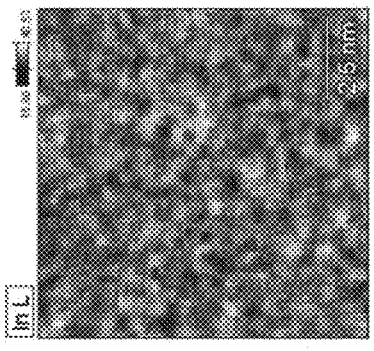
Figures 9D, 31:
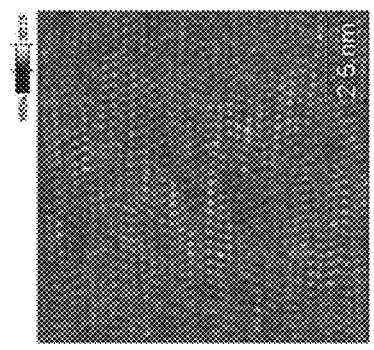

FIG. 31-2A shows a cross-sectional TEM image, and FIG. 31-2E shows a plan-view TEM image. FIG. 31-2B shows a cross-sectional EDX mapping image of In atoms, and FIG. 31-2F shows a plan-view EDX mapping image of In atoms. In the EDX mapping image in FIG. 31-2B, the proportion of the In atoms in all the atoms is 12.60 atomic % to 40.60 atomic %. In the EDX mapping image in FIG. 31-2F, the proportion of the In atoms in all the atoms is 11.94 atomic % to 39.97 atomic %.

FIG. 31-2C shows a cross-sectional EDX mapping image of Ga atoms, and FIG. 31-2G shows a plan-view EDX mapping image of Ga atoms. In the EDX mapping image in FIG. 31-2C, the proportion of the Ga atoms in all the atoms is 2.30 atomic % to 23.73 atomic %. In the EDX mapping image in FIG. 31-2G, the proportion of the Ga atoms in all the atoms is 0.00 atomic % to 20.45 atomic %.

FIG. 31-2D shows a cross-sectional EDX mapping image of Zn atoms, and FIG. 31-2H shows a plan-view EDX mapping image of Zn atoms. In the EDX mapping image in FIG. 31-2D, the proportion of the Zn atoms in all the atoms is 9.85 atomic % to 33.11 atomic %. In the EDX mapping image in FIG. 31-2H, the proportion of the Zn atoms in all the atoms is 7.49 atomic % to 27.69 atomic %.

Note that FIGS. 31-2A to 31-2D show the same region in the cross section of Sample 1B. FIGS. 31-2E to 31-2H show the same region in the plane of Sample 1B.

FIGS. 31-3A to 31-3H show a cross-sectional TEM image, a plan-view TEM image, and EDX mapping images of Sample 1C. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-3B to 31-3D and 31-3F to 31-3H is 7,200,000 times.

FIG. 31-3A shows a cross-sectional TEM image, and FIG. 31-3E shows a plan-view TEM image. FIG. 31-3B shows a cross-sectional EDX mapping image of In atoms, and FIG. 31-3F shows a plan-view EDX mapping image of In atoms. In the EDX mapping image in FIG. 31-3B, the proportion of the In atoms in all the atoms is 14.79 atomic % to 39.71 atomic %. In the EDX mapping image in FIG. 31-3F, the proportion of the In atoms in all the atoms is 14.08 atomic % to 50.62 atomic %.

FIG. 31-3C shows a cross-sectional EDX mapping image of Ga atoms, and FIG. 31-3G shows a plan-view EDX mapping image of Ga atoms. In the EDX mapping image in FIG. 31-3C, the proportion of the Ga atoms in all the atoms is 2.83 atomic % to 21.61 atomic %. In the EDX mapping image in FIG. 31-3G, the proportion of the Ga atoms in all the atoms is 0.00 atomic % to 21.13 atomic %.

FIG. 31-3D shows a cross-sectional EDX mapping image of Zn atoms, and FIG. 31-3H shows a plan-view EDX mapping image of Zn atoms. In the EDX mapping image in FIG. 31-3D, the proportion of the Zn atoms in all the atoms is 10.27 atomic % to 28.84 atomic %. In the EDX mapping image in FIG. 31-3H, the proportion of the Zn atoms in all the atoms is 3.64 atomic % to 32.84 atomic %.

Note that FIGS. 31-3A to 31-3D show the same region in the cross section of Sample 1C. FIGS. 31-3E to 31-3H show the same region in the plane of Sample 1C.

FIGS. 31-4A to 31-4H show a cross-sectional TEM image, a plan-view TEM image, and EDX mapping images of Sample 1D. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-4B to 31-4D and 31-4F to 31-4H is 7,200,000 times.

FIG. 31-4A shows a cross-sectional TEM image, and FIG. 31-4E shows a plan-view TEM image. FIG. 31-4B shows a cross-sectional EDX mapping image of In atoms, and FIG. 31-4F shows a plan-view EDX mapping image of In atoms. In the EDX mapping image in FIG. 31-4B, the proportion of the In atoms in all the atoms is 9.61 atomic % to 40.10 atomic %. In the EDX mapping image in FIG. 31-4F, the proportion of the In atoms in all the atoms is 13.83 atomic % to 45.10 atomic %.

FIG. 31-4C shows a cross-sectional EDX mapping image of Ga atoms, and FIG. 31-4G shows a plan-view EDX mapping image of Ga atoms. In the EDX mapping image in FIG. 31-4C, the proportion of the Ga atoms in all the atoms is 0.00 atomic % to 21.14 atomic %. In the EDX mapping image in FIG. 31-4G, the proportion of the Ga atoms in all the atoms is 1.28 atomic % to 23.63 atomic %.

FIG. 31-4D shows a cross-sectional EDX mapping image of Zn atoms, and FIG. 31-4H shows a plan-view EDX mapping image of Zn atoms. In the EDX mapping image in FIG. 31-4D, the proportion of the Zn atoms in all the atoms is 6.13 atomic % to 28.45 atomic %. In the EDX mapping image in FIG. 31-4H, the proportion of the Zn atoms in all the atoms is 7.50 atomic % to 31.90 atomic %.

Note that FIGS. 31-4A to 31-4D show the same region in the cross section of Sample 1D. FIGS. 31-4E to 31-4H show the same region in the plane of Sample 1D.

FIGS. 31-5A to 31-5H show a cross-sectional TEM image, a plan-view TEM image, and EDX mapping images of Sample 1E. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-5B to 31-5D and 31-5F to 31-5H is 7,200,000 times.

FIG. 31-5A shows a cross-sectional TEM image, and FIG. 31-5E shows a plan-view TEM image. FIG. 31-5B shows a cross-sectional EDX mapping image of In atoms, and FIG. 31-5F shows a plan-view EDX mapping image of In atoms. In the EDX mapping image in FIG. 31-5B, the proportion of the In atoms in all the atoms is 10.35 atomic % to 40.04 atomic %. In the EDX mapping image in FIG. 31-5F, the proportion of the In atoms in all the atoms is 6.90 atomic % to 42.28 atomic %.

FIG. 31-5C shows a cross-sectional EDX mapping image of Ga atoms, and FIG. 31-5G shows a plan-view EDX mapping image of Ga atoms. In the EDX mapping image in FIG. 31-5C, the proportion of the Ga atoms in all the atoms is 0.00 atomic % to 23.03 atomic %. In the EDX mapping image in FIG. 31-5G, the proportion of the Ga atoms in all the atoms is 0.00 atomic % to 22.85 atomic %.

FIG. 31-5D shows a cross-sectional EDX mapping image of Zn atoms, and FIG. 31-5H shows a plan-view EDX mapping image of Zn atoms. In the EDX mapping image in FIG. 31-5D, the proportion of the Zn atoms in all the atoms is 5.10 atomic % to 30.74 atomic %. In the EDX mapping image in FIG. 31-5H, the proportion of the Zn atoms in all the atoms is 0.63 atomic % to 31.76 atomic %.

Note that FIGS. 31-5A to 31-5D show the same region in the cross section of Sample 1E. FIGS. 31-5E to 31-5H show the same region in the plane of Sample 1E.

FIGS. 31-6A to 31-6H show a cross-sectional TEM image, a plan-view TEM image, and EDX mapping images of Sample 1F. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-6B to 31-6D and 31-6F to 31-6H is 7,200,000 times.

FIG. 31-6A shows a cross-sectional TEM image, and FIG. 31-6E shows a plan-view TEM image. FIG. 31-6B shows a cross-sectional EDX mapping image of In atoms, and FIG. 31-6F shows a plan-view EDX mapping image of In atoms. In the EDX mapping image in FIG. 31-6B, the proportion of the In atoms in all the atoms is 13.37 atomic % to 42.99 atomic %. In the EDX mapping image in FIG. 31-6F, the proportion of the In atoms in all the atoms is 8.73 atomic % to 46.45 atomic %.

FIG. 31-6C shows a cross-sectional EDX mapping image of Ga atoms, and FIG. 31-6G shows a plan-view EDX mapping image of Ga atoms. In the EDX mapping image in FIG. 31-6C, the proportion of the Ga atoms in all the atoms is 2.56 atomic % to 26.02 atomic %. In the EDX mapping image in FIG. 31-6G, the proportion of the Ga atoms in all the atoms is 0.00 atomic % to 22.51 atomic %.

FIG. 31-6D shows a cross-sectional EDX mapping image of Zn atoms, and FIG. 31-6H shows a plan-view EDX mapping image of Zn atoms. In the EDX mapping image in FIG. 31-6D, the proportion of the Zn atoms in all the atoms is 8.66 atomic % to 32.64 atomic %. In the EDX mapping image in FIG. 31-6H, the proportion of the Zn atoms in all the atoms is 1.41 atomic % to 29.64 atomic %.

Note that FIGS. 31-6A to 31-6D show the same region in the cross section of Sample 1F. FIGS. 31-6E to 31-6H show the same region in the plane of Sample 1F.

FIGS. 31-7A to 31-7H show a cross-sectional TEM image, a plan-view TEM image, and EDX mapping images of Sample 1G. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-7B to 31-7D and 31-7F to 31-7H is 7,200,000 times.

FIG. 31-7A shows a cross-sectional TEM image, and FIG. 31-7E shows a plan-view TEM image. FIG. 31-7B shows a cross-sectional EDX mapping image of In atoms, and FIG. 31-7F shows a plan-view EDX mapping image of In atoms. In the EDX mapping image in FIG. 31-7B, the proportion of the In atoms in all the atoms is 10.76 atomic % to 43.30 atomic %. In the EDX mapping image in FIG. 31-7F, the proportion of the In atoms in all the atoms is 6.93 atomic % to 43.39 atomic %.

FIG. 31-7C shows a cross-sectional EDX mapping image of Ga atoms, and FIG. 31-7G shows a plan-view EDX mapping image of Ga atoms. In the EDX mapping image in FIG. 31-7C, the proportion of the Ga atoms in all the atoms is 1.40 atomic % to 23.07 atomic %. In the EDX mapping image in FIG. 31-7G, the proportion of the Ga atoms in all the atoms is 0.00 atomic % to 21.30 atomic %.

FIG. 31-7D shows a cross-sectional EDX mapping image of Zn atoms, and FIG. 31-7H shows a plan-view EDX mapping image of Zn atoms. In the EDX mapping image in FIG. 31-7D, the proportion of the Zn atoms in all the atoms is 4.67 atomic % to 28.72 atomic %. In the EDX mapping image in FIG. 31-7H, the proportion of the Zn atoms in all the atoms is 4.16 atomic % to 30.54 atomic %.

Note that FIGS. 31-7A to 31-7D show the same region in the cross section of Sample 1G. FIGS. 31-7E to 31-7H show the same region in the plane of Sample 1G.

FIGS. 31-8A to 31-8H show a cross-sectional TEM image, a plan-view TEM image, and EDX mapping images of Sample 1H. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-8B to 31-8D and 31-8F to 31-8H is 7,200,000 times.

FIG. 31-8A shows a cross-sectional TEM image, and FIG. 31-8E shows a plan-view TEM image. FIG. 31-8B shows a cross-sectional EDX mapping image of In atoms, and FIG. 31-8F shows a plan-view EDX mapping image of In atoms. In the EDX mapping image in FIG. 31-8B, the proportion of the In atoms in all the atoms is 12.67 atomic % to 43.09 atomic %. In the EDX mapping image in FIG. 31-8F, the proportion of the In atoms in all the atoms is 13.99 atomic % to 41.90 atomic %.

FIG. 31-8C shows a cross-sectional EDX mapping image of Ga atoms, and FIG. 31-8G shows a plan-view EDX mapping image of Ga atoms. In the EDX mapping image in FIG. 31-8C, the proportion of the Ga atoms in all the atoms is 0.60 atomic % to 27.37 atomic %. In the EDX mapping image in FIG. 31-8G, the proportion of the Ga atoms in all the atoms is 1.67 atomic % to 21.53 atomic %.

FIG. 31-8D shows a cross-sectional EDX mapping image of Zn atoms, and FIG. 31-8H shows a plan-view EDX mapping image of Zn atoms. In the EDX mapping image in FIG. 31-8D, the proportion of the Zn atoms in all the atoms is 7.85 atomic % to 33.61 atomic %. In the EDX mapping image in FIG. 31-8H, the proportion of the Zn atoms in all the atoms is 5.10 atomic % to 30.22 atomic %.

Note that FIGS. 31-8A to 31-8D show the same region in the cross section of Sample 1H. FIGS. 31-8E to 31-8H show the same region in the plane of Sample 1H.

Figures 9E, 31:
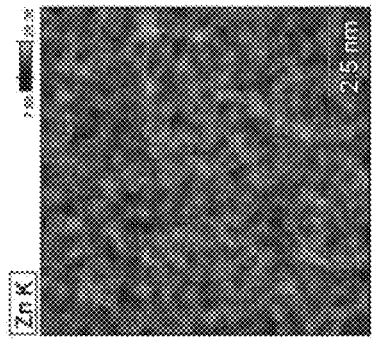
Figures 9F, 31:
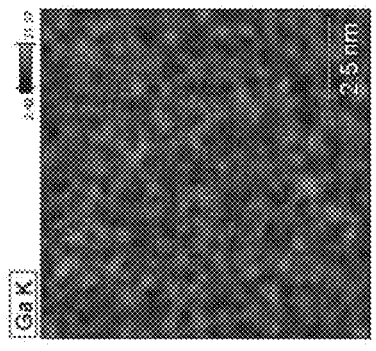
Figures 9G, 31:
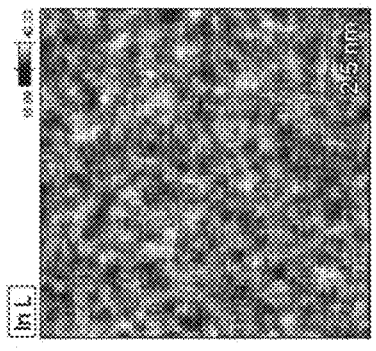
Figures 9H, 31:
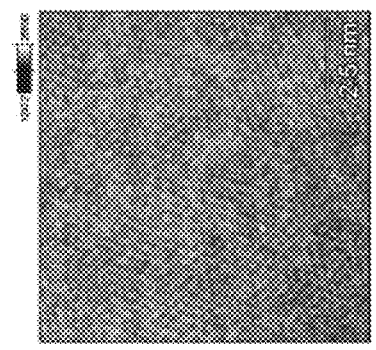

FIGS. 31-9A to 31-9H show a cross-sectional TEM image, a plan-view TEM image, and EDX mapping images of Sample 1J. In the EDX mapping images, the proportion of an element is indicated by grayscale: the more measured atoms exist in a region, the brighter the region is; the less measured atoms exist in a region, the darker the region is. The magnification of the EDX mapping images in FIGS. 31-9B to 31-9D and 31-9F to 31-9H is 7,200,000 times.

FIG. 31-9A shows a cross-sectional TEM image, and FIG. 31-9E shows a plan-view TEM image. FIG. 31-9B shows a cross-sectional EDX mapping image of In atoms, and FIG. 31-9F shows a plan-view EDX mapping image of In atoms. In the EDX mapping image in FIG. 31-9B, the proportion of the In atoms in all the atoms is 15.80 atomic % to 40.53 atomic %. In the EDX mapping image in FIG. 31-9F, the proportion of the In atoms in all the atoms is 16.09 atomic % to 40.33 atomic %.

FIG. 31-9C shows a cross-sectional EDX mapping image of Ga atoms, and FIG. 31-9G shows a plan-view EDX mapping image of Ga atoms. In the EDX mapping image in FIG. 31-9C, the proportion of the Ga atoms in all the atoms is 4.13 atomic % to 22.21 atomic %. In the EDX mapping image in FIG. 31-9G, the proportion of the Ga atoms in all the atoms is 2.42 atomic % to 21.37 atomic %.

FIG. 31-9D shows a cross-sectional EDX mapping image of Zn atoms, and FIG. 31-9H shows a plan-view EDX mapping image of Zn atoms. In the EDX mapping image in FIG. 31-9D, the proportion of the Zn atoms in all the atoms is 7.75 atomic % to 26.35 atomic %. In the EDX mapping image in FIG. 31-9H, the proportion of the Zn atoms in all the atoms is 7.88 atomic % to 28.36 atomic %.

Note that FIGS. 31-9A to 31-9D show the same region in the cross section of Sample 1J. FIGS. 31-9E to 31-9H show the same region in the plane of Sample 1J.

At least part of this example can be implemented in combination with any of the other embodiments and the other examples described in this specification as appropriate.

Example 2

In this example, the transistor 150 including the metal oxide 108 of one embodiment of the present invention was fabricated and subjected to tests for electrical characteristics and reliability. In this example, nine transistors, i.e., Samples 2A, 2B, 2C, 2D, 2E, 2F, 2G, 2H, and 2J, were fabricated as the transistor 150 including the metal oxide 108.

<Structure of Samples and Fabrication Method Thereof>

Samples 2A to 2H and 2J relating to one embodiment of the present invention are described below. As Samples 2A to 2H and 2J, the transistors 150 having the structure illustrated in FIGS. 6A to 6C were fabricated by the fabrication method described in Embodiment 2 with reference to FIGS. 9A to 9D, FIGS. 10A to 10C, and FIGS. 11A to 11C.

Samples 2A to 2H and 2J were fabricated at different temperatures and different oxygen flow rate ratios in formation of the metal oxide 108. The temperatures and the oxygen flow rate ratios in formation of the metal oxides of Samples 2A to 2H and 2J are shown in Table 3 below.

TABLE 3

| | Formation conditions of metal oxide 108 | | | |
|---|---|---|---|---|
| | Flow rate [sccm] | | $O_2$ ratio [%] | Formation temperature [° C.] |
| | $O_2$ | Ar | | |
| Sample 2A | 30 | 270 | 10 | R.T. |
| Sample 2B | 90 | 210 | 30 | R.T. |
| Sample 2C | 300 | 0 | 100 | R.T. |
| Sample 2D | 30 | 270 | 10 | 130 |
| Sample 2E | 90 | 210 | 30 | 130 |
| Sample 2F | 300 | 0 | 100 | 130 |
| Sample 2G | 30 | 270 | 10 | 170 |
| Sample 2H | 90 | 210 | 30 | 170 |
| Sample 2J | 300 | 0 | 100 | 170 |

The samples were fabricated by the fabrication method described in Embodiment 2. The metal oxide 108 was formed using a metal oxide target (In:Ga:Zn=4:2:4.1 [atomic ratio]).

The transistor 150 had a channel length of 2 μm and a channel width of 3 μm (hereinafter, also referred to as L/W=⅔ μm) or a channel length of 2 μm and a channel width of 50 μm (hereinafter, also referred to as L/W=2/50 μm).

<Electrical Characteristics of Transistors>

Next, $I_d$-$V_g$ characteristics of the transistors (L/W=⅔ μm) in Samples 2A to 2H and 2J were measured. As conditions for measuring the $I_d$-$V_g$ characteristics of each transistor, a voltage applied to the conductive film 112 serving as a first gate electrode (hereinafter the voltage is also referred to as gate voltage ($V_g$)) and a voltage applied to the conductive film 106 serving as a second gate electrode (hereinafter the voltage is also referred to as back gate voltage ($V_{bg}$)) were changed from −10 V to +10 V in increments of 0.25 V. A voltage applied to the conductive film 120a serving as a source electrode (the voltage is also referred to as source voltage ($V_s$)) was 0 V (comm), and a voltage applied to the conductive film 120b serving as a drain electrode (the voltage is also referred to as drain voltage ($V_d$)) was 0.1 V and 20 V.

[$I_d$-$V_g$ Characteristics of Transistor]

Figure 34A:
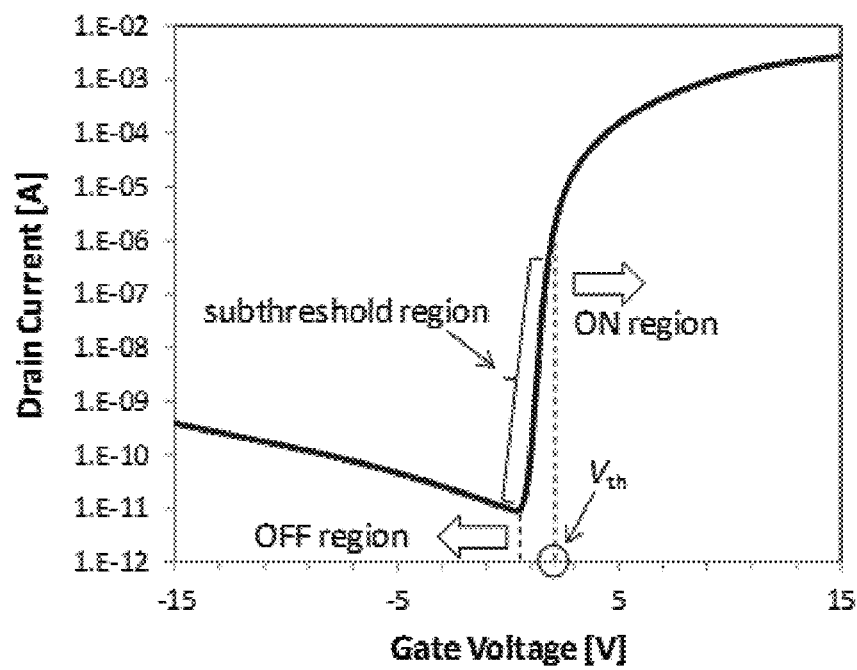
FIGS. 34A and 34B show $I_d$-$V_g$ characteristics and $I_d$-$V_d$ characteristics of a transistor.

Drain current-gate voltage characteristics ($I_d$-$V_g$ characteristics) of a transistor are described. FIG. 34A illustrates an example of $I_d$-$V_g$ characteristics of the transistor. FIG. 34A shows the case where polycrystalline silicon is used for an active layer of the transistor for easy understanding. In FIG. 34A, the vertical axis and the horizontal axis represent $I_d$ and $V_g$, respectively.

As illustrated in FIG. 34A, $I_d$-$V_g$ characteristics are broadly divided into three regions. A first region, a second region, and a third region are referred to as an off region (OFF region), a subthreshold region, and an on region (ON region), respectively. A gate voltage at a boundary between the subthreshold region and the on region is referred to as a threshold voltage ($V_{th}$).

To obtain favorable characteristics of the transistor, it is preferable that the drain current in the off region (also referred to as off-state current or $I_{off}$) be low and the drain current in the on region (also referred to as on-state current or $I_{on}$) be high. As an index of the on-state current of the transistor, the field-effect mobility is often used. The details of the field-effect mobility are described later.

To drive the transistor at a low voltage, the slope of the $I_d$-$V_g$ characteristics in the subthreshold region is preferably steep. An index of the degree of change in the $I_d$-$V_g$ characteristics in the subthreshold region is referred to as subthreshold swing (SS) or an S value. The S value is represented by the following formula (2).

[Formula 2]

$$SS = \min\left(\frac{\partial V_g}{\partial \log_{10}(I_d)}\right) \quad (2)$$

The S value is a minimum value of the amount of change in gate voltage which is needed for changing a drain current by an order of magnitude in the subthreshold region. As the S value is smaller, switching operation between on and off states can be performed rapidly.

[$I_d$-$V_d$ Characteristics of Transistor]

Figure 34B:
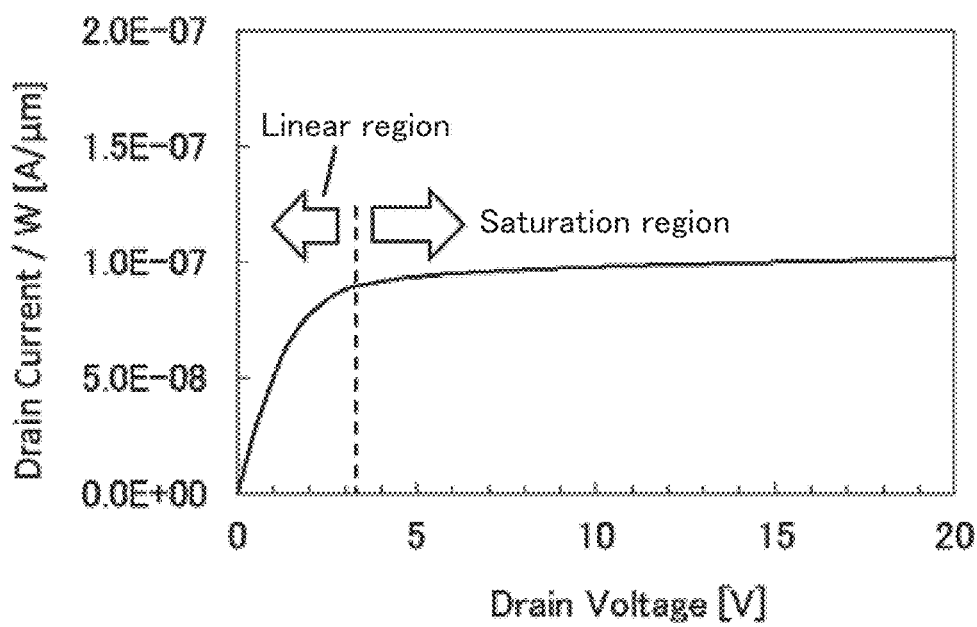

Next, drain current-drain voltage characteristics ($I_d$-$V_d$ characteristics) of a transistor are described. FIG. 34B illustrates an example of $I_d$-$V_d$ characteristics of the transistor. In FIG. 34B, the vertical axis and the horizontal axis represent $I_d$ and $V_d$, respectively.

As illustrated in FIG. 34B, the on region is further divided into two regions. A first region and a second region are referred to as a linear region and a saturation region, respectively. In the linear region, drain current increases in a parabola shape in accordance with the increase in drain voltage. On the other hand, in the saturation region, drain current does not greatly change even when drain voltage changes. According to a vacuum tube, the linear region and the saturation region are referred to as a triode region and a pentode region, respectively, in some cases.

The linear region indicates the state where $V_g$ is higher than $V_d$ ($V_d$<$V_g$) in some cases. The saturation region indicates the state where $V_d$ is higher than $V_g$ ($V_g$<$V_d$) in some cases. However, in practice, the threshold voltage of the transistor needs to be considered. Thus, the state where a value obtained by subtracting the threshold voltage of the transistor from the gate voltage is higher than the drain voltage ($V_d$<$V_g$-$V_{th}$) is referred to as the linear region in some cases. Similarly, the state where a value obtained by subtracting the threshold voltage of the transistor from the gate voltage is lower than the drain voltage ($V_g$—$V_{th}$<$V_d$) is referred to as the saturation region in some cases.

The $I_d$-$V_d$ characteristics of the transistor with which current in the saturation region is constant are expressed as "favorable saturation" in some cases. The favorable saturation of the transistor is important particularly when the transistor is used in an organic EL display. For example, the use of a transistor with favorable saturation as a transistor of a pixel of an organic EL display can suppress a change in luminance of the pixel even when the drain voltage is changed.

[Analysis Model of Drain Current]

Next, an analysis model of the drain current is described. As the analysis model of the drain current, analytic formulae of drain current based on gradual channel approximation (GCA) is known. On the basis of GCA, the drain current of the transistor is represented by the following formula (3).

[Formula 3]

$$I_d = \begin{cases} \mu\frac{W}{L}C_{OX}\left[(V_g - V_{th})V_d - \frac{1}{2}V_d^2\right] & \cdots (V_g - V_{th} > V_d) \\ \mu\frac{W}{2L}C_{OX}(V_g - V_{th})^2 & \cdots (V_g - V_{th} \leq V_d) \end{cases} \quad (3)$$

In the formula (3), the upper formula is a formula for drain current in a linear region and the lower formula is a formula for drain current in a saturation region. In the formula (3), $I_d$ represents the drain current, μ represents the mobility of the active layer, L represents the channel length of the transistor, W represents the channel width of the transistor, Cox represents the gate capacitance, $V_g$ represents the gate voltage, $V_d$ represents the drain voltage, and $V_{th}$ represents the threshold voltage of the transistor.

[Field-Effect Mobility]

Next, field-effect mobility is described. As an index of current drive capability of a transistor, the field-effect mobility is used. As described above, the on region of the transistor is divided into the linear region and the saturation region. From the characteristics in the regions, the field-effect mobility of the transistor can be calculated on the basis of the analytic formulae of the drain current based on GCA. The field-effect mobility in the linear region and the field-effect mobility in the saturation region are referred to as linear mobility and saturation mobility, respectively, when they need to be distinguished from each other. The linear mobility is represented by the following formula (4) and the saturation mobility is represented by the following formula (5).

[Formula 4]

$$\mu_{FE}^{lin} = \frac{L}{WC_{OX}}\frac{\partial I_d}{\partial V_g}\frac{1}{V_d} \quad (4)$$

-continued

[Formula 5]

$$\mu_{FE}^{sat} = \frac{2L}{WC_{OX}} \left( \frac{\partial \sqrt{I_d}}{\partial V_g} \right)^2 \quad (5)$$

Figure 35:
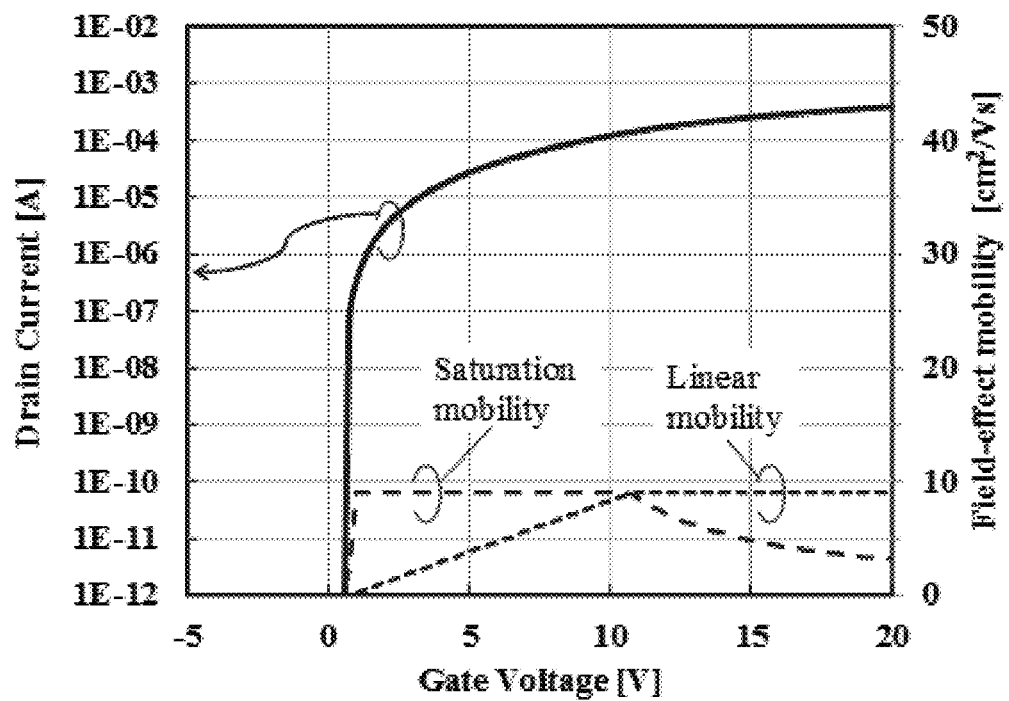
FIG. 35 shows $I_d$-$V_g$ characteristics and linear and saturation mobility curves which are calculated on the basis of GCA.

In this specification and the like, curves calculated from the formula (4) and the formula (5) are referred to as mobility curves. FIG. 35 shows mobility curves calculated from the analytic formulae of drain current based on GCA. In FIG. 35, the $I_d$-$V_g$ characteristics at $V_d$=10 V and the mobility curves of the linear mobility and the saturation mobility at the time when GCA is assumed to be effective are shown together.

In FIG. 35, the $I_d$-$V_g$ characteristics are calculated from the analytic formulae of drain current based on GCA. The shapes of the mobility curves can be a lead to understanding the state of the inside of the transistor.

Figure 32:
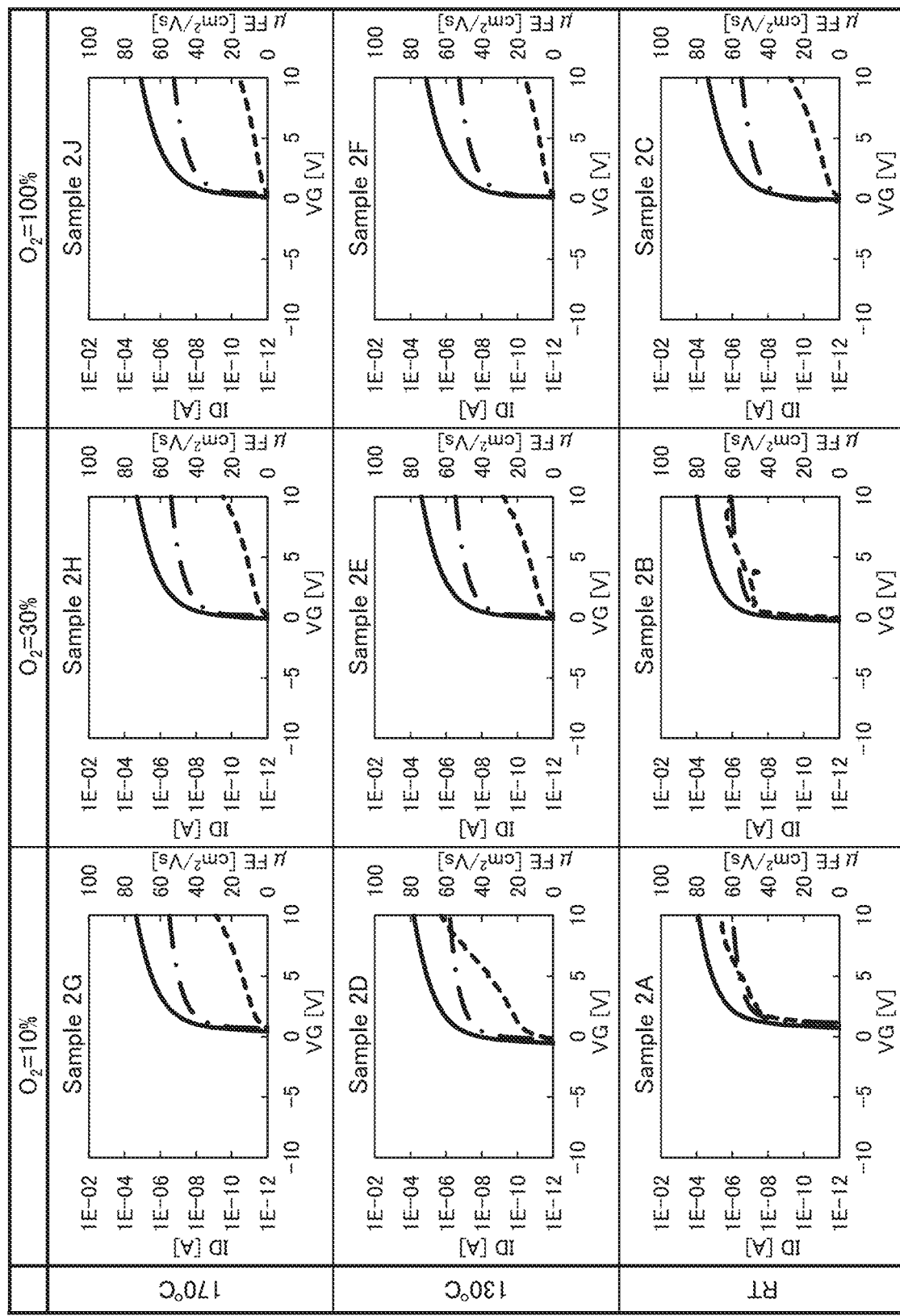
FIG. 32 shows $I_d$-$V_g$ characteristics of samples of Example.

In FIG. 32, the results of $I_d$-$V_g$ characteristics and field-effect mobilities of Samples 2A to 2H and 2J are shown. The solid line and the dashed-dotted line represent $I_d$ at $V_d$=20 V and $I_d$ at $V_d$=0.1 V, respectively. The dashed line represents field-effect mobility. In FIG. 32, the first vertical axis represents $I_d$ [A], the second vertical axis represents field-effect mobility (μFE) [cm²/Vs], and the horizontal axis represents $V_g$ [V]. The field-effect mobility was calculated from the value measured at $V_d$=20 V.

As shown in FIG. 32, it is found that Samples 2A to 2H and 2J have different on-state currents ($I_{on}$) and different field effect mobilities, particularly different field effect mobilities in saturation regions. In particular, the maximum saturation mobilities and the rising characteristics of the field-effect mobilities around 0 V differ distinctly.

It is found from FIG. 32 that as the substrate temperature at the time of formation is lower or the oxygen flow rate ratio at the time of formation is lower, the on-state current ($I_{on}$) becomes higher and the field effect mobility rises more steeply around 0 V. In particular, Sample 2A has a maximum field-effect mobility close to 70 cm²/Vs.

<Gate Bias-Temperature Stress Test (GBT Test)>

Next, the reliability of the transistors (L/W=⅖₀ μm) of Samples 2A to 2H and 2J was evaluated. As the reliability evaluation, GBT tests were used.

The conditions for GBT tests in this example were as follows. A voltage applied to the conductive film 112 serving as the first gate electrode and the conductive film 106 serving as the second gate electrode (hereinafter referred to as gate voltage ($V_g$)) was ±30 V, and a voltage applied to the conductive film 120a serving as the source electrode and the conductive film 120b serving as a drain electrode (hereinafter referred to as source voltage ($V_s$) and drain voltage ($V_d$), respectively) was 0 V (COMMON). The stress temperature was 60° C., the time for stress application was 1 hour, and two kinds of measurement environments, a dark environment and a photo environment (irradiation with light at approximately 10,000 lx from a white LED), were employed.

In other words, the conductive film 120a serving as the source electrode of the transistor 150 and the conductive film 120b serving as the drain electrode of the transistor 150 were set at the same potential, and a potential different from that of the conductive film 120a serving as the source electrode and the conductive film 120b serving as the drain electrode was applied to the conductive film 112 serving as the first gate electrode and the conductive film 106 serving as the second gate electrode for a certain time (here, one hour).

A case where the potential applied to the conductive film 112 serving as the first gate electrode and the conductive film 106 serving as the second gate electrode is higher than the potential applied to the conductive film 120a serving as the source electrode and the conductive film 120b serving as the drain electrode is called positive stress, and a case where the potential applied to the conductive film 112 serving as the first gate electrode and the conductive film 106 serving as the second gate electrode is lower than the potential applied to the conductive film 120a serving as the source electrode and the conductive film 120b serving as the drain electrode is called negative stress. Thus, the reliability evaluation was performed under four conditions in total, i.e., positive GBT (dark), negative GBT (dark), positive GBT (light irradiation), and negative GBT (light irradiation).

Note that the positive GBT (dark) can be referred to as positive bias temperature stress (PBTS), the negative GBT (dark) as negative bias temperature stress (NBTS), the positive GBT (light irradiation) as positive bias illumination temperature stress (PBITS), and the negative GBT (light irradiation) as negative bias illumination temperature stress (NBITS).

Figure 33:
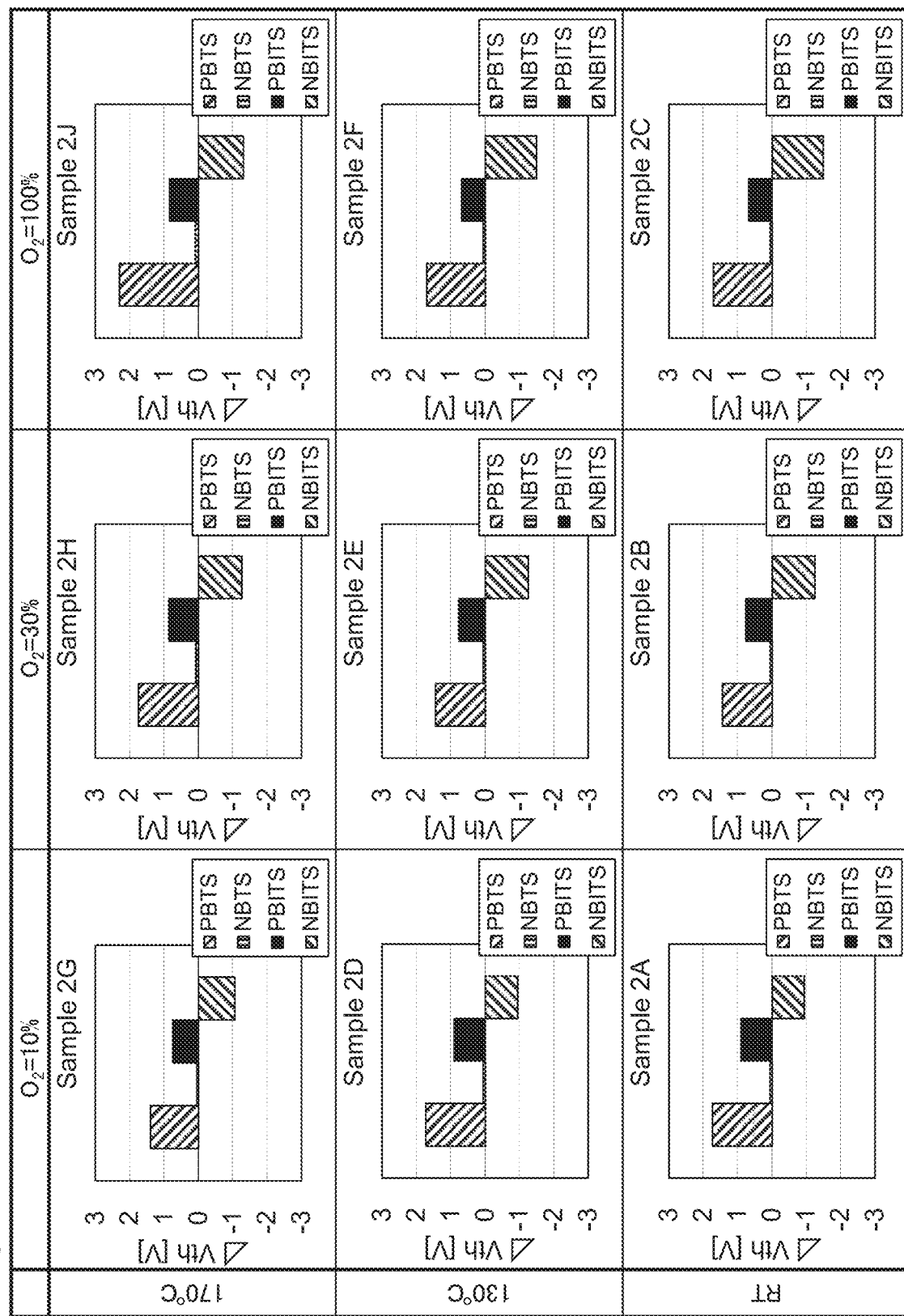
FIG. 33 shows $I_d$-$V_g$ characteristics of samples after +GBT stress tests of Example.

FIG. 33 shows the GBT test results of Samples 2A to 2H and 2J. In FIG. 33, the vertical axis represents the amount of shift in the threshold voltage ($\Delta V_{th}$) of the transistors.

The results in FIG. 33 indicate that the amount of shift in the threshold voltage ($\Delta V_{th}$) of each of the transistors included in Samples 2A to 2H and 2J was within ±3 V in the GBT tests. Thus, it is confirmed that the transistors included in Samples 2A to 2H and 2J each have high reliability.

Thus, even the IGZO film having low crystallinity is presumed to have a low density of defect states like an IGZO film having high crystallinity.

At least part of this example can be implemented in combination with any of the other embodiments and the other examples described in this specification as appropriate.

Example 3

In this example, measurement results of a metal oxide of one embodiment of the present invention formed over a substrate are described. A variety of methods were used for the measurement. Note that in this example, Samples 3A, 3D, and 3J were fabricated.

<<Structure of Samples and Fabrication Method Thereof>>

Samples 3A, 3D, and 3J relating to one embodiment of the present invention are described below. Samples 3A, 3D, and 3J each include a substrate and a metal oxide over the substrate.

Samples 3A, 3D, and 3J were fabricated at different temperatures and different oxygen flow rate ratios in formation of the metal oxide. The temperatures and the oxygen flow rate ratios in formation of the metal oxides of Samples 3A, 3D, and 3J are shown in Table 4 below.

TABLE 4

| | Flow rate [sccm] | | O₂ ratio | Formation temperature |
|---|---|---|---|---|
| | O₂ | Ar | [%] | [° C.] |
| Sample 3A | 30 | 270 | 10 | R. T. |
| Sample 3D | 30 | 270 | 10 | 130 |
| Sample 3J | 150 | 150 | 50 | 170 |

Next, methods for fabricating the samples will be described.

A glass substrate was used as the substrate. Over the substrate, a 100-nm-thick In—Ga—Zn metal oxide was formed as a metal oxide with a sputtering apparatus. The formation conditions were as follows: the pressure in a chamber was 0.6 Pa, and a metal oxide target (an atomic ratio of In:Ga:Zn=1:1:1.2) was used as a target. The metal oxide target provided in the sputtering apparatus was supplied with an AC power of 2500 W.

The formation temperatures and oxygen flow rate ratios shown in the above table were used as the conditions for forming metal oxides to fabricate Samples 3A, 3D, and 3J.

Through the above steps, Samples 3A, 3D, and 3J of this example were fabricated.

<TEM Images and Electron Diffraction>

This section describes the TEM observation and analysis results of Samples 3A, 3D, and 3J.

This section describes electron diffraction patterns obtained by irradiation of Samples 3A, 3D, and 3J with an electron beam with a probe diameter of 1 nm (also referred to as a nanobeam).

The plan-view TEM images were observed with a spherical aberration corrector function. The HAADF-STEM images were obtained using an atomic resolution analytical electron microscope JEM-ARM200F manufactured by JEOL Ltd. under the following conditions: the acceleration voltage was 200 kV, and irradiation with an electron beam with a diameter of approximately 0.1 nm was performed.

Note that the electron diffraction patterns were observed while an electron beam irradiation was performed in the following manner that the electron beam was moved at a constant rate for 35 seconds.

Figure 36A:
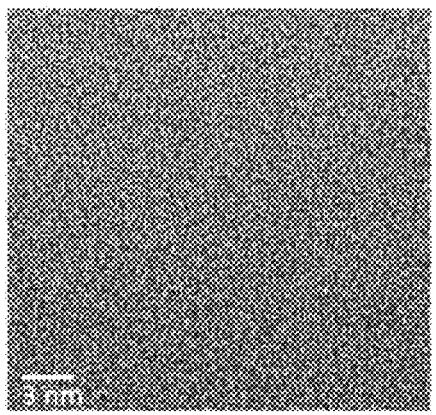
FIGS. 36A to 36F show cross-sectional TEM images of samples of Example and electron diffraction patterns thereof.
Figure 36B:
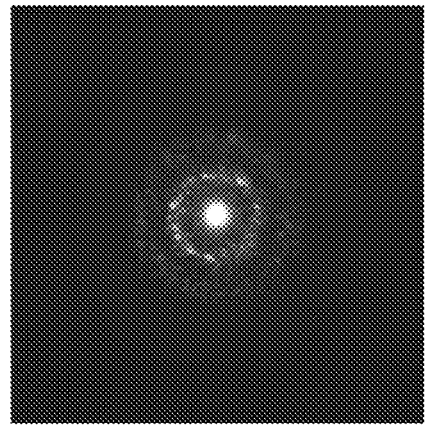
Figure 36C:
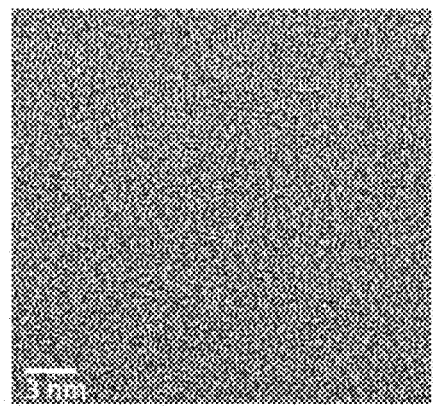
Figure 36D:
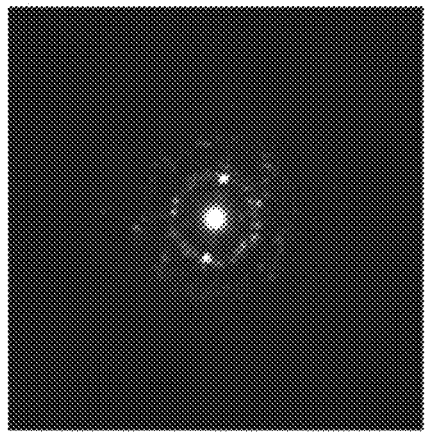
Figure 36E:
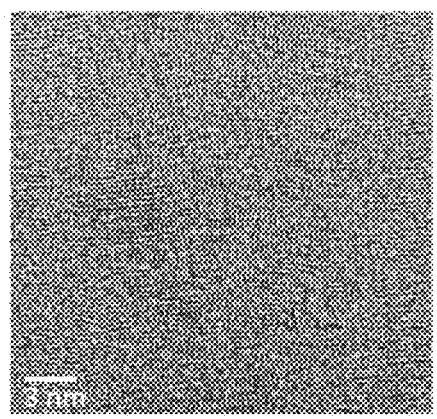
Figure 36F:
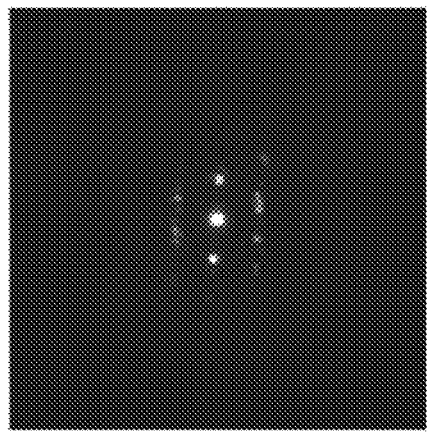

FIG. 36A shows a cross-sectional TEM image of Sample 3A, and FIG. 36B shows an electron diffraction pattern of Sample 3A. FIG. 36C shows a cross-sectional TEM image of Sample 3D, and FIG. 36D shows an electron diffraction pattern of Sample 3D. FIG. 36E shows a cross-sectional TEM image of Sample 3J, and FIG. 36F shows an electron diffraction pattern of Sample 3J.

A nanocrystal is found in Sample 3A from the result of the cross-sectional TEM observation in FIG. 36A. As shown in FIG. 36B, the observed electron diffraction pattern of Sample 3A has a region with high luminance in a circular (ring) pattern. Furthermore, a plurality of spots are shown in the ring-shaped region.

Sample 3D is found to have a CAAC structure and a nanocrystal From the result of the cross-sectional TEM observation in FIG. 36C. As shown in FIG. 36D, the observed electron diffraction pattern of Sample 3D has a region with high luminance in a circular (ring) pattern. Furthermore, a plurality of spots are shown in the ring-shaped region. In the diffraction pattern, spots derived from the (009) plane are slightly observed.

Sample 3J is clearly found to have layered arrangement of a CAAC structure from the result of the cross-sectional TEM observation in FIG. 36E. Furthermore, spots derived from the (009) plane are included in the electron diffraction pattern of Sample 3J in FIG. 36F.

The features observed in the cross-sectional TEM images and the plan-view TEM images are one aspect of a structure of a metal oxide.

According to the above description, the electron diffraction patterns of Sample 3A and Sample 3D each have a region with high luminance in a ring pattern and a plurality of bright spots appear in the ring-shaped region. Accordingly, Samples 3A and 3D each exhibit an electron diffraction pattern of the metal oxide including nanocrystals and do not show alignment in the plane direction and the cross-sectional direction. Sample 3D is found to be a mixed material of the nc structure and the CAAC structure.

In the electron diffraction pattern of Sample 3J, spots derived from the (009) plane of an InGaZnO₄ crystal are included. Thus, Sample 3J has c-axis alignment and the c-axes are aligned in the direction substantially perpendicular to the formation surface or the top surface of Sample 3J.

<Analysis of TEM Image>

This section describes the observation and analysis results of Samples 3A, 3D, and 3J with an HAADF-STEM.

The results of image analysis of plan-view TEM images are described. The plan-view TEM images were obtained with a spherical aberration corrector function. The plan-view TEM images were obtained using an atomic resolution analytical electron microscope JEM-ARM200F manufactured by JEOL Ltd. under the following conditions: the acceleration voltage was 200 kV, and irradiation with an electron beam with a diameter of approximately 0.1 nm was performed.

Figure 37A:
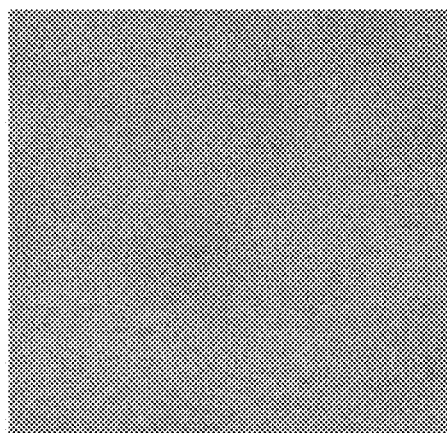
FIGS. 37A to 37F show plan-view TEM images of samples of Example and electron diffraction patterns thereof.
Figure 37B:
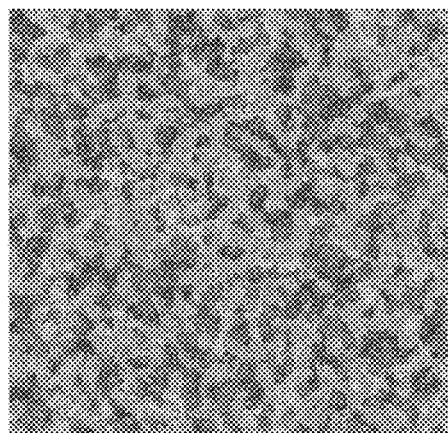
Figure 37C:
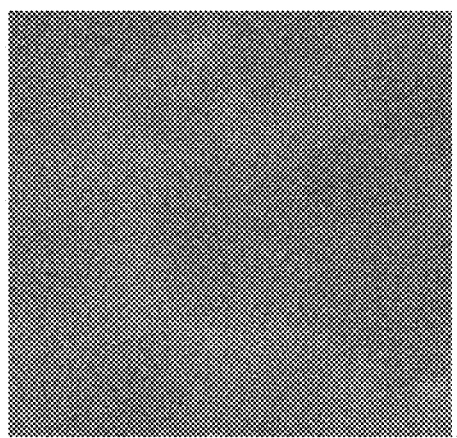
Figure 37D:
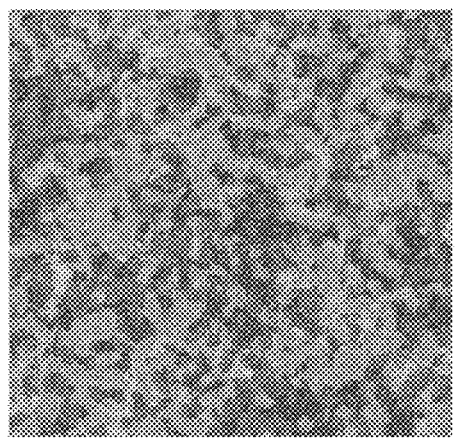
Figure 37E:
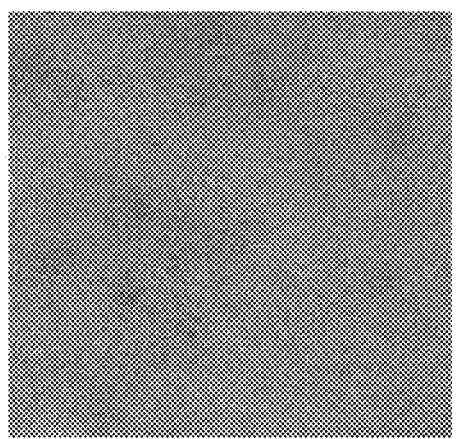

FIG. 37A shows a plan-view TEM image of Sample 3A, and FIG. 37B shows an image obtained through image processing of the plan-view TEM image of Sample 3A. FIG. 37C shows a plan-view TEM image of Sample 3D and FIG. 37D shows an image obtained through image processing of the plan-view TEM image of Sample 3D. FIG. 37E shows a plan-view TEM image of Sample 3J and FIG. 37F shows an image obtained through image processing of the plan-view TEM image of Sample 3J.

Figure 37F:
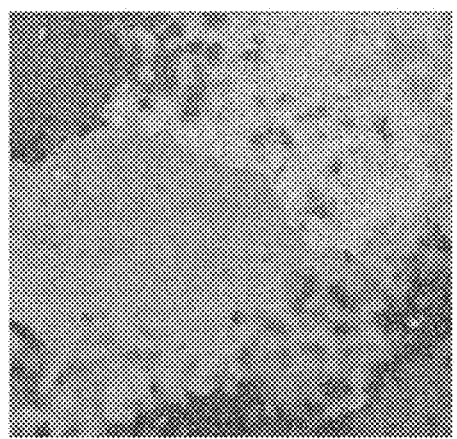

The images obtained through image processing of the plan-view TEM images in FIGS. 37B, 37D, and 37F are images obtained through image analysis of the plan-view TEM images in FIGS. 37A, 37C, and 37E by the method described in Example 1 and applying color in accordance with the angle of the hexagonal lattice. In other words, the images obtained through the image processing of the plan-view TEM images are each an image in which the orientations of lattice points in certain wavenumber ranges are extracted by color-coding the certain wavenumber ranges in an FFT filtering image of the plan-view TEM image.

As shown in FIGS. 37A to 37F, in Samples 3A and 3D in which nc is observed, the hexagons are oriented randomly and distributed in a mosaic pattern. In Sample 3J in which a layered structure is observed in the cross-sectional TEM image, regions with uniformly oriented hexagons exist in a large area of several tens of nanometers. In Sample 3D, it is found that an nc region in a random mosaic pattern and a large-area region with uniformly oriented hexagons as in Sample 3J are included.

It is found from FIGS. 37A to 37F that as the substrate temperature at the time of formation is lower or the oxygen gas flow rate ratio at the time of formation is lower, regions in which the hexagons are oriented randomly and distributed in a mosaic pattern are likely to exist.

Through the analysis of a plan-view TEM image of a CAAC-OS, a boundary portion where angles of hexagonal lattices change can be examined.

Next, Voronoi diagrams were formed using lattice point groups in Sample 3A. The Voronoi diagrams were obtained by the method described in Example 1.

Figure 38A:
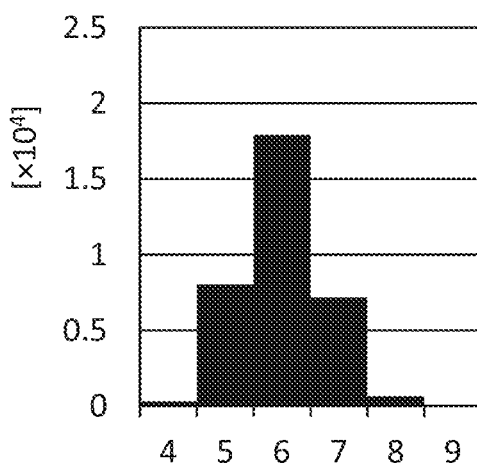
FIGS. 38A to 38C show the numbers of shapes of Voronoi regions of Example and proportions thereof.
Figure 38B:
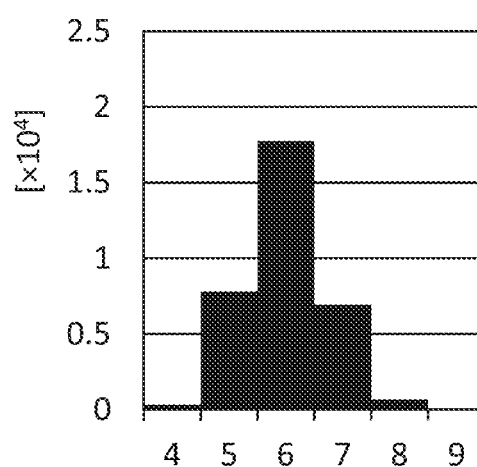
Figure 38C:
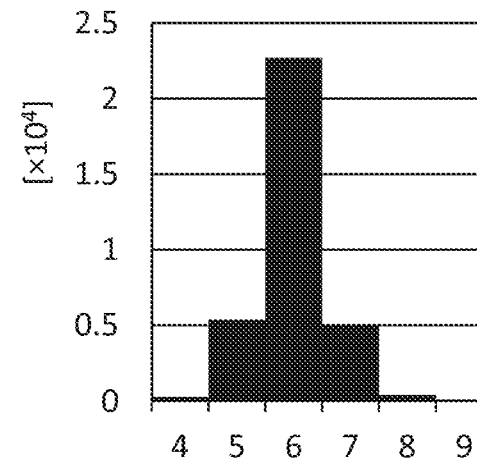

FIGS. 38A to 38C show the proportions of the shapes of Voronoi regions (tetragon, pentagon, hexagon, heptagon, octagon, and enneagon) in Samples 3A, 3D, and 3J, respectively. Bar graphs show the numbers of the shapes of Voronoi regions (tetragon, pentagon, hexagon, heptagon, octagon, and enneagon) in the samples. Furthermore, tables show the proportions of the shapes of Voronoi regions (tetragon, pentagon, hexagon, heptagon, octagon, and enneagon) in the samples.

It is found from FIGS. 38A to 38C that there is a tendency that the proportion of hexagons is high in Sample 3J with a high degree of crystallinity and the proportion of hexagons is low in Sample 3A with a low degree of crystallinity. The proportion of hexagons in Sample 3D is between those in Samples 3J and 3A. Accordingly, it is found from FIGS. 38A to 38C that the crystal state of the metal oxide significantly differs under different formation conditions.

It is found from FIGS. 38A to 38C that as the substrate temperature at the time of formation is lower or the oxygen gas flow rate ratio at the time of formation is lower, the degree of crystallinity is lower and the proportion of hexagons is lower.

<Elementary Analysis>

This section describes the analysis results of elements included in Sample 3A. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point were attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

FIGS. 39A to 39H show a cross-sectional TEM image, a plan-view TEM image, and EDX mapping images of Sample 3A. In the EDX mapping images, the proportion of an element is indicated by grayscale: the more measured atoms exist in a region, the brighter the region is; the less measured atoms exist in a region, the darker the region is. The magnification of the EDX mapping images in FIGS. 39B to 39D and 39F to 39H is 7,200,000 times.

FIG. 39A shows a cross-sectional TEM image, and FIG. 39E shows a plan-view TEM image. FIG. 39B shows a cross-sectional EDX mapping image of In atoms, and FIG. 39F shows a plan-view EDX mapping image of In atoms. In the EDX mapping image in FIG. 39B, the proportion of the In atoms in all the atoms is 8.64 atomic % to 34.91 atomic %. In the EDX mapping image in FIG. 39F, the proportion of the In atoms in all the atoms is 5.76 atomic % to 34.69 atomic %.

FIG. 39C shows a cross-sectional EDX mapping image of Ga atoms, and FIG. 39G shows a plan-view EDX mapping image of Ga atoms. In the EDX mapping image in FIG. 39C, the proportion of the Ga atoms in all the atoms is 2.45 atomic % to 25.22 atomic %. In the EDX mapping image in FIG. 39G, the proportion of the Ga atoms in all the atoms is 1.29 atomic % to 27.64 atomic %.

FIG. 39D shows a cross-sectional EDX mapping image of Zn atoms, and FIG. 39H shows a plan-view EDX mapping image of Zn atoms. In the EDX mapping image in FIG. 39D, the proportion of the Zn atoms in all the atoms is 5.05 atomic % to 23.47 atomic %. In the EDX mapping image in FIG. 39H, the proportion of the Zn atoms in all the atoms is 3.69 atomic % to 27.86 atomic %.

Note that FIGS. 39A to 39D show the same region in the cross section of Sample 3A. FIGS. 39E to 39H show the same region in the plane of Sample 3A.

Figure 40A:
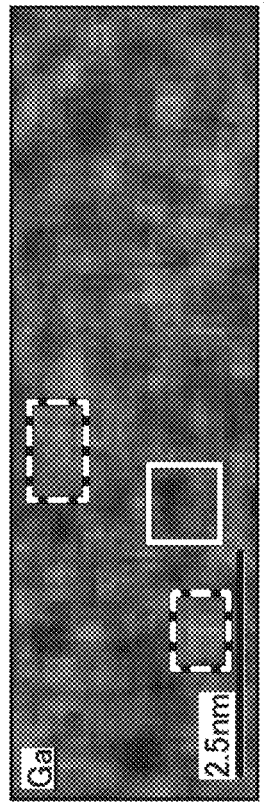
FIGS. 40A to 40C show EDX mapping images of a sample of Example.
Figure 40B:
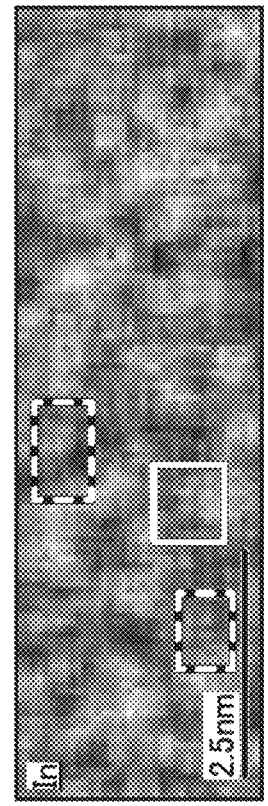
Figure 40C:
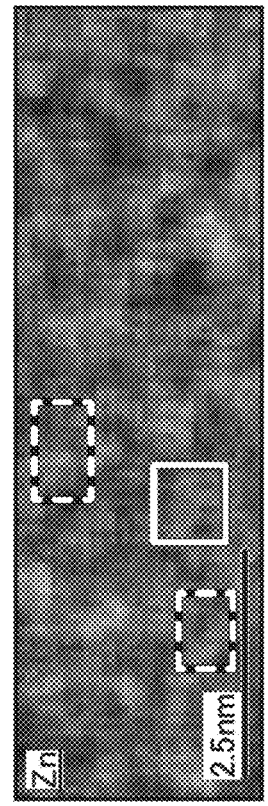

FIGS. 40A to 40C show enlarged cross-sectional EDX mapping images of Sample 3A. FIG. 40A is an enlarged view of a part in FIG. 39B. FIG. 40B is an enlarged view of a part in FIG. 39C. FIG. 40C is an enlarged view of a part in FIG. 39D.

The EDX mapping images in FIGS. 40A to 40C show relative distribution of bright and dark areas, indicating that the atoms have distributions in Sample 3A. Areas surrounded by solid lines and areas surrounded by dashed lines in FIGS. 40A to 40C are examined.

As shown in FIG. 40A, a relatively dark region occupies a large area in the area surrounded by the solid line and a relatively bright region occupies a large area in the area surrounded by the dashed line. As shown in FIG. 40B, a relatively bright region occupies a large area in the area surrounded by the solid line and a relatively dark region occupies a large area in the area surrounded by the dashed line.

That is, it is found that the areas surrounded by the solid lines are regions including a relatively large number of In atoms and the areas surrounded by the dashed lines are regions including a relatively small number of In atoms. FIG. 40C shows that an upper portion of the area surrounded by the solid line is relatively bright and a lower portion thereof is relatively dark. Thus, it is found that the area surrounded by the solid line is a region including $In_{X2}Zn_{Y2}O_{Z2}$, $InO_{X1}$, or the like as a main component.

It is found that the area surrounded by the solid line is a region including a relatively small number of Ga atoms and the area surrounded by the dashed line is a region including a relatively large number of Ga atoms. As shown in FIG. 40C, a relatively bright region occupies a large area in a right portion in the area surrounded by the upper dashed line and a dark region occupies a large area in a left portion therein. As shown in FIG. 40C, a relatively bright region occupies a large area in an upper left portion in the area surrounded by the lower dashed line and a dark region occupies a large area in a lower right portion therein. Thus, it is found that the area surrounded by the dashed line is a region including $GaO_{X3}$, $Ga_{X4}Zn_{Y4}O_{Z4}$, or the like as a main component.

Furthermore, as shown in FIGS. 40A to 40C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. It can be thus guessed that the regions including $In_{X2}Zn_{Y2}O_{Z2}$ or $InO_{X1}$ as a main component extend like a cloud.

An In—Ga—Zn oxide having a composition in which the regions including $GaO_{X3}$ as a main component and the regions including $In_{x2}Zn_{y2}O_{z2}$ or $InO_{X1}$ as a main component are unevenly distributed and mixed can be referred to as CAC-IGZO.

As shown in FIGS. 40A to 40C, each of the regions including $GaO_{X3}$ as a main component and the regions including $In_{x2}Zn_{y2}O_{z2}$ or $InO_{X1}$ as a main component has a size of greater than or equal to 0.5 nm and less than or equal to 10 nm, or greater than or equal to 1 nm and less than or equal to 3 nm.

FIGS. 41A to 41H show a cross-sectional TEM image, a plan-view TEM image, and EDX mapping images of Sample 3J. In the EDX mapping images, the proportion of an element is indicated by grayscale: the more measured atoms exist in a region, the brighter the region is; the less measured atoms exist in a region, the darker the region is. The magnification of the EDX mapping images in FIGS. 41B to 41D and 41F to 41H is 7,200,000 times.

FIG. 41A shows a cross-sectional TEM image, and FIG. 41E shows a plan-view TEM image. FIG. 41B is a cross-sectional EDX mapping image of In atoms, and FIG. 41F is a plan-view EDX mapping image of In atoms. In the EDX mapping image in FIG. 41B, the proportion of the In atoms in all the atoms is 9.70 atomic % to 40.47 atomic %. In the EDX mapping image in FIG. 41F, the proportion of the In atoms in all the atoms is 9.16 atomic % to 35.76 atomic %.

FIG. 41C shows a cross-sectional EDX mapping image of Ga atoms, and FIG. 41G shows a plan-view EDX mapping image of Ga atoms. In the EDX mapping image in FIG. 41C, the proportion of the Ga atoms in all the atoms is 8.23 atomic % to 31.95 atomic %. In the EDX mapping image in FIG. 41G, the proportion of the Ga atoms in all the atoms is 8.21 atomic % to 28.86 atomic %.

FIG. 41D shows a cross-sectional EDX mapping image of Zn atoms, and FIG. 41H shows a plan-view EDX mapping image of Zn atoms. In the EDX mapping image in FIG. 41D, the proportion of the Zn atoms in all the atoms is 5.37 atomic % to 25.92 atomic %. In the EDX mapping image in FIG. 41H, the proportion of the Zn atoms in all the atoms is 7.86 atomic % to 24.36 atomic %.

Note that FIGS. 41A to 41D show the same region in the cross section of Sample 3J. FIGS. 41E to 41H show the same region in the plane of Sample 3J.

In FIG. 41A, a group of laterally grown crystals is clearly observed, and in FIG. 41E, crystals having a hexagonal structure with an angle of 120° is observed.

The EDX mapping images of the In atoms and the Zn atoms in FIGS. 41B and 41D show particularly bright spots aligned as indicated by white lines. In FIGS. 41F and 41H, these lines form an angle of approximately 120°, which is characteristic of the hexagonal structure, and in FIGS. 41B and 41D, the same layered arrangement as in FIG. 41A can be observed. As shown in FIGS. 41C and 41G, such a tendency is not observed for Ga atoms.

The resolution of EDX is generally affected by the regularity of atomic arrangement. When atoms are regularly arranged as in a single crystal, the atoms are arranged linearly in the beam incident direction, and incident electrons are therefore channeled and propagated along the atom rows. Thus, atomic columns can be separated. In contrast, when the regularity of atomic arrangement is low, the atom rows are out of alignment and incident electrons are therefore scattered without being channeled. That is, the spatial resolution is low and an obtained image is in a blurred state in some cases.

The following consideration can be obtained. Since the crystallinity of CAAC is not as high as that of single crystal, a beam is broadened and the resolution of EDX mapping is not as high as that of HAADF-STEM; thus, CAAC is observed in a blurred state. From FIGS. 39A to 39H, CAC is blurred because of a broadened beam; thus, the atoms are determined to be nanoparticles with a blurry boundary.

As described above, it is confirmed that the CAC-IGZO has a structure different from that of an IGZO compound in which metal elements are evenly distributed, and has characteristics different from those of the IGZO compound. That is, it can be confirmed that in the CAC-IGZO, regions including $GaO_{X3}$ or the like as a main component and regions including $In_{x2}Zn_{y2}O_{z2}$ or $InO_{X1}$ as a main component are separated to form a mosaic pattern.

Accordingly, it can be expected that when CAC-IGZO is used for a semiconductor element, the property derived from $GaO_{X3}$ or the like and the property derived from $In_{x2}Zn_{y2}O_{z2}$ or $InO_{X1}$ complement each other, whereby high on-state current ($I_{on}$), high field-effect mobility ($\mu$), and low off-state current ($I_{off}$) can be achieved. A semiconductor element including CAC-IGZO has high reliability. Thus, CAC-IGZO is suitably used in a variety of semiconductor devices typified by a display.

At least part of this example can be implemented in combination with any of the other embodiments and the other examples described in this specification as appropriate.

Example 4

In this example, the transistor 150 including the metal oxide 108 of one embodiment of the present invention was fabricated and subjected to tests for electrical characteristics and reliability. In this example, nine transistors, i.e., Samples 4A, 4B, 4C, 4D, 4E, 4F, 4G, 4H, and 4J, were fabricated as the transistor 150 including the metal oxide 108.

<<Structure of Samples and Fabrication Method Thereof>>

Samples 4A to 4H and 4J relating to one embodiment of the present invention are described below. As Samples 4A to 4H and 4J, the transistors 150 having the structure illustrated in FIGS. 6A to 6C were fabricated by the fabrication method described in Embodiment 2 with reference to FIGS. 9A to 9D, FIGS. 10A to 10C, and FIGS. 11A to 11C.

Samples 4A to 4H and 4J were fabricated at different temperatures and different oxygen flow rate ratios in formation of the metal oxide 108. The temperatures and the oxygen flow rates in formation of the metal oxide of Samples 4A to 4H and 4J are shown in Table 5 below.

TABLE 5

Formation conditions of metal oxide 108

| | Flow rate [sccm] | | $O_2$ ratio | Formation temperature |
|---|---|---|---|---|
| | $O_2$ | Ar | [%] | [° C.] |
| Sample 4A | 30 | 270 | 10 | R.T. |
| Sample 4B | 90 | 210 | 30 | R.T. |
| Sample 4C | 150 | 150 | 50 | R.T. |
| Sample 4D | 30 | 270 | 10 | 130 |
| Sample 4E | 90 | 210 | 30 | 130 |
| Sample 4F | 150 | 150 | 50 | 130 |
| Sample 4G | 30 | 270 | 10 | 170 |
| Sample 4H | 90 | 210 | 30 | 170 |
| Sample 4J | 150 | 150 | 50 | 170 |

The samples were fabricated by the fabrication method described in Embodiment 2. The metal oxide 108 was formed using a metal oxide target (In:Ga:Zn=1:1:1.2 [atomic ratio]).

The transistor 150 had a channel length of 2 μm and a channel width of 3 μm (hereinafter, also referred to as L/W=⅔ μm).

<$I_d$-$V_g$ Characteristics of Transistors>

Next, $I_d$-$V_g$ characteristics of the transistors (L/W=⅔ μm) in Samples 4A to 4J were measured. As conditions for measuring the $I_d$-$V_g$ characteristics of each transistor, a voltage applied to the conductive film 112 serving as a first gate electrode (hereinafter the voltage is also referred to as gate voltage ($V_g$)) and a voltage applied to the conductive film 106 serving as a second gate electrode (hereinafter the voltage is also referred to as back gate voltage ($V_{bg}$)) were changed from −10 V to +10 V in increments of 0.25 V. A voltage applied to the conductive film 120a serving as a source electrode (the voltage is also referred to as source voltage ($V_s$)) was 0 V (comm), and a voltage applied to the conductive film 120b serving as a drain electrode (the voltage is also referred to as drain voltage ($V_d$)) was 0.1 V and 20 V.

Figure 42:
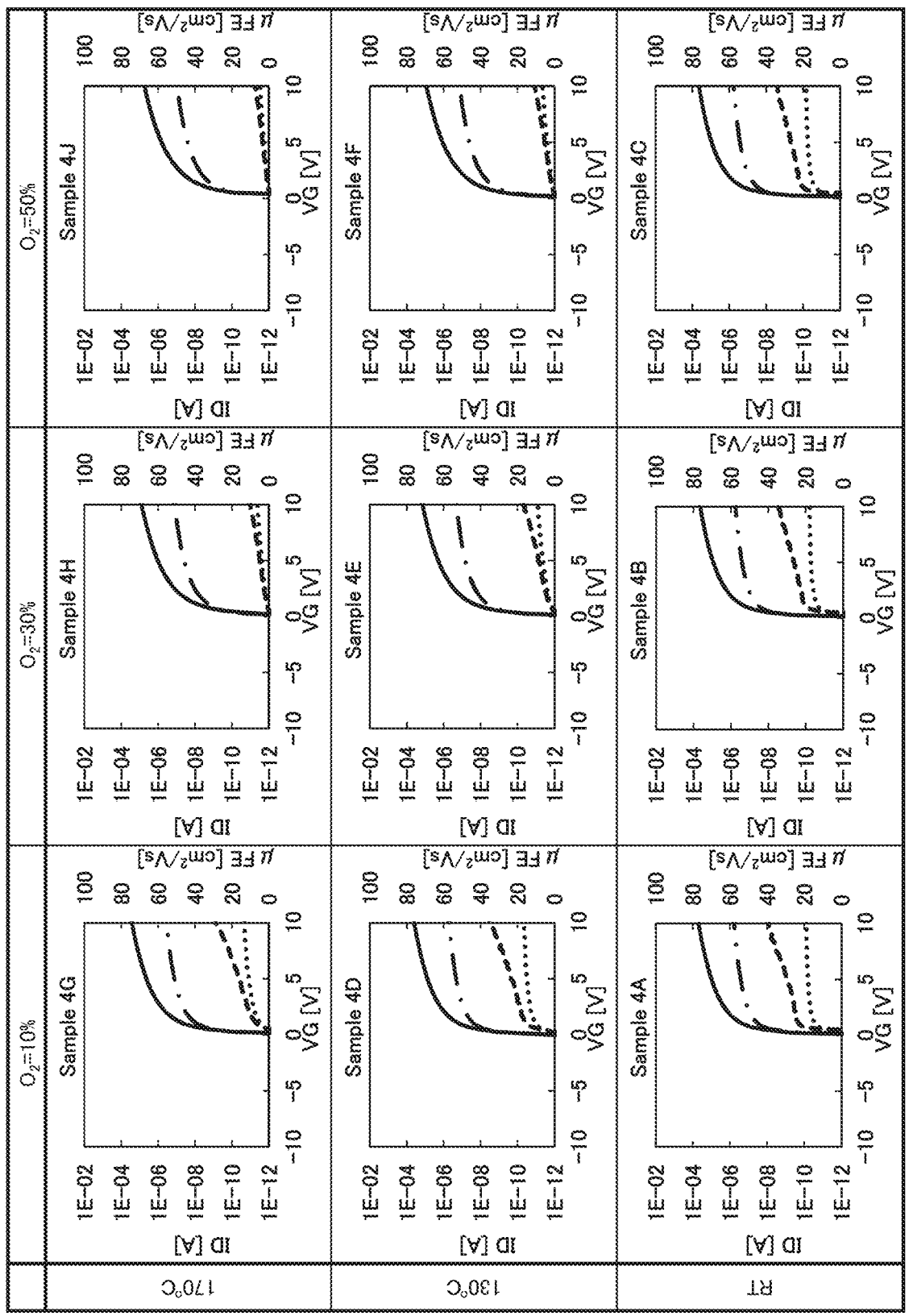
FIG. 42 is a graph showing $I_d$-$V_g$ characteristics of samples of Example.

In FIG. 42, the results of $I_d$-$V_g$ characteristics and field-effect mobilities of Samples 4A to 4H and 4J are shown. The solid line and the dashed-dotted line represent $I_d$ at $V_d$=20 V and $I_d$ at $V_d$=0.1 V, respectively. The dashed line and the dotted line represent field-effect mobility calculated from a value measured at $V_d$=20 V and field-effect mobility calculated from a value measured at $V_d$=0.1 V, respectively. In FIG. 42, the first vertical axis represents $I_d$ [A], the second vertical axis represents field-effect mobility (μFE) [cm$^2$/Vs], and the horizontal axis represents $V_g$ [V].

As shown in FIG. 42, the transistors 150 of Samples 4A to 4H and 4J have normally-off characteristics. As shown in FIG. 42, it is found that Samples 4A to 4H and 4J have different on-state currents ($I_{on}$) and different field effect mobilities, particularly different field effect mobilities in saturation regions. In particular, the maximum saturation mobilities and the rising characteristics of the field-effect mobilities around 0 V differ distinctly.

It is found from FIG. 42 that as the substrate temperature at the time of formation is lower or the oxygen gas flow rate ratio at the time of formation is lower, the field-effect mobility at low $V_g$ is significantly higher. In particular, Sample 4A has a maximum field-effect mobility close to 40 cm$^2$/Vs. Having high mobility at low $V_g$ means being suitable for high-speed driving at low voltage; therefore, application to a variety of semiconductor devices typified by a display can be expected.

From FIG. 42, different behavior of field-effect mobility is found at $V_d$=20 V (shown by dashed lines) and $V_d$=0.1 V (shown by dotted lines). As $V_g$ is increased, the field-effect mobility measured at $V_d$=20 V (shown by dashed lines) becomes higher. This is considered as an influence of heat generation of the transistor. Meanwhile, the field-effect mobility measured at $V_d$=0.1 V (shown by dotted lines) in a high $V_g$ range substantially coincides with an ideal saturation mobility curve calculated by the formula (5).

At least part of this example can be implemented in combination with any of the other embodiments and the other examples described in this specification as appropriate.

Example 5

In this example, the analysis results of elements included in a sample is described. For the analysis, energy dispersive X-ray spectroscopy (EDX) was performed to obtain EDX mapping images of a metal oxide of one embodiment of the present invention formed over a substrate. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

<<Structure of Sample and Fabrication Method Thereof>>

Sample 5A was fabricated in this example. Sample 5A includes a substrate and a metal oxide over the substrate.

Next, a method for fabricating the sample will be described.

A glass substrate was used as the substrate. Over the substrate, a 100-nm-thick In—Ga—Zn oxide was formed as a metal oxide with a sputtering apparatus. The formation conditions were as follows: the pressure in a chamber was 0.6 Pa; an atmosphere using an Ar gas at a flow rate of 270 sccm and an $O_2$ gas at a flow rate of 30 sccm as sputtering gases was employed; and a metal oxide target (an atomic ratio of In:Ga:Zn=4:2:4.1) was used as a target. The metal oxide target provided in the sputtering apparatus was supplied with an AC power of 2500 W.

Through the above steps, Sample 5A of this example was fabricated.

<Measurement Results>

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point were attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 43A:
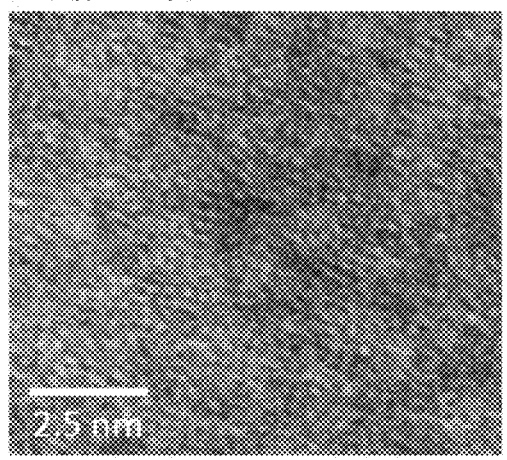
FIGS. 43A to 43D show a cross-sectional TEM image, EDX mapping images, and a diagram illustrating an atomic ratio of a sample of Example.
Figure 43B:
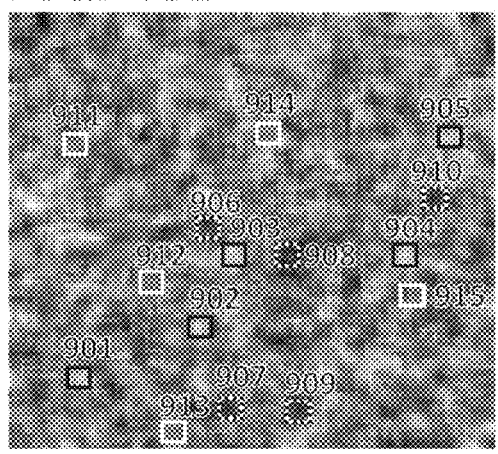
Figure 43C:
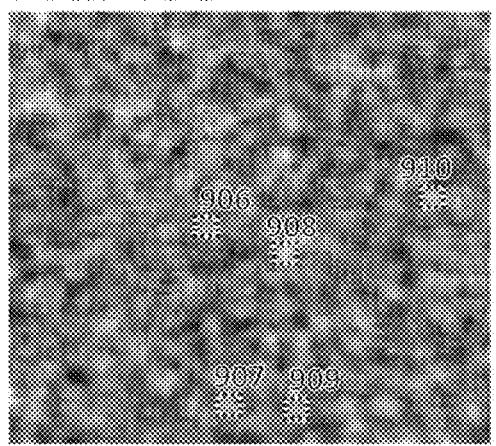

FIGS. 43A to 43D show measurement results of a cross section of Sample 5A. FIG. 43A shows a cross-sectional TEM image, and FIGS. 43B and 43C show cross-sectional EDX mapping images. In the EDX mapping images, the proportion of an element is indicated by grayscale: the more measured atoms exist in a region, the brighter the region is; the less measured atoms exist in a region, the darker the region is. The magnification of the EDX mapping images in FIGS. 43B and 43C is 7,200,000 times. Note that FIGS. 43A to 43C show the same region in the cross section of Sample 5A.

FIG. 43B shows a cross-sectional EDX mapping image of In atoms. In the EDX mapping image in FIG. 43B, the proportion of the In atoms in all the atoms is 12.11 atomic % to 40.30 atomic %. FIG. 43C shows a cross-sectional EDX mapping image of Ga atoms. In the EDX mapping image in FIG. 43C, the proportion of the Ga atoms in all the atoms is 0.00 atomic % to 13.18 atomic %.

The EDX mapping images in FIGS. 43B and 43C show relative distribution of bright and dark areas, indicating that the In atoms and the Ga atoms have distributions in Sample 5A. Here, five regions surrounded by black lines (a region 901, a region 902, a region 903, a region 904, and a region 905) were extracted among regions whose luminance is greater than or equal to 75% of the maximum luminance in FIG. 43B. Five regions surrounded by dashed lines (a region 906, a region 907, a region 908, a region 909, and a region 910) were extracted among regions whose luminance is greater than or equal to 75% of the maximum luminance in FIG. 43C. Five regions surrounded by white lines (a region 911, a region 912, a region 913, a region 914, and a region 915) were extracted among regions whose luminance is greater than or equal to 25% and less than or equal to 75% of the maximum luminance in FIG. 43B.

In other words, the regions 901 to 905 are regions including a relatively large number of In atoms. The regions 906 to 910 are regions including a relatively large number of Ga atoms. The regions 911 to 915 are regions including an average number of In atoms and Ga atoms.

Regions including a relatively large number of Ga atoms, that is, the five regions surrounded by the dashed lines (the regions 906 to 910) in FIG. 43C are relatively dark in FIG. 43B. That is, the region including a relatively large number of Ga atoms is expected to include a relatively small number of In atoms.

Figure 43D:
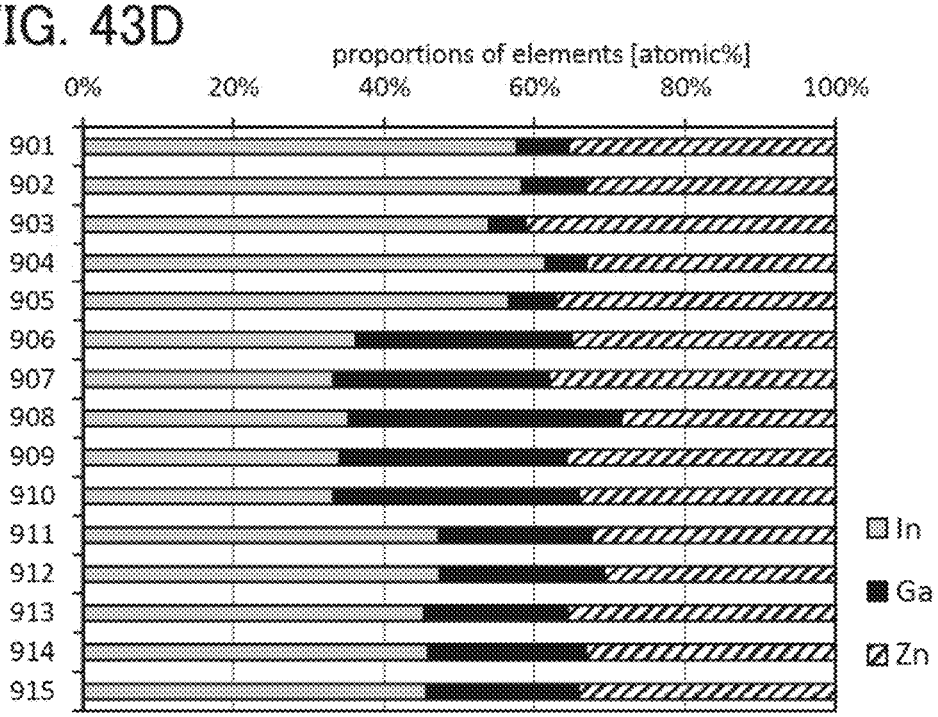

The proportions of elements in the regions 901 to 915 in FIG. 43B are shown in FIG. 43D. The regions surrounded by the black lines (the regions 901 to 905) are found to include a relatively large number of In atoms and a relatively small number of Ga atoms. The regions surrounded by the dashed lines (the regions 906 to 910) are found to include a relatively small number of In atoms and a relatively large number of Ga atoms.

Figure 44A:
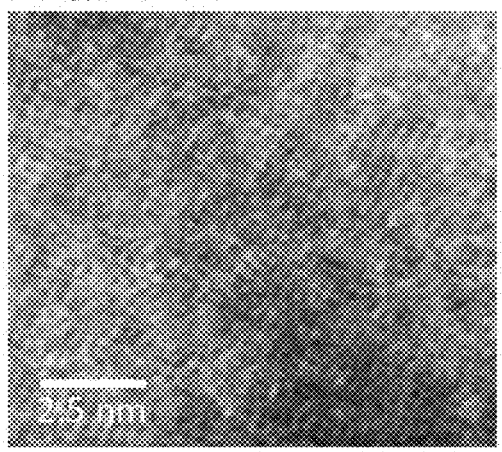
FIGS. 44A to 44D show a plan-view TEM image, EDX mapping images, and a diagram illustrating an atomic ratio of a sample of Example.
Figure 44B:
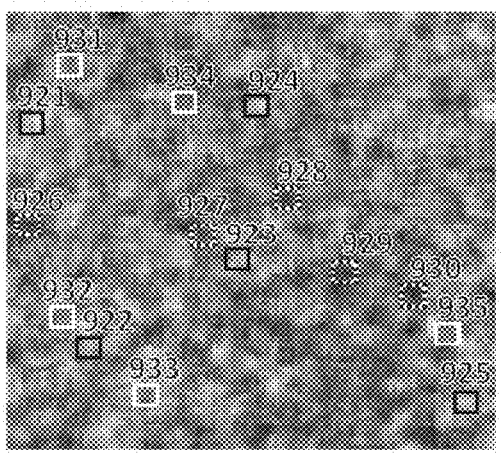
Figure 44C:
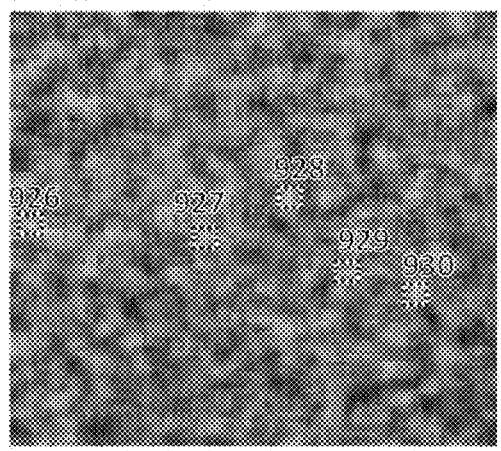

FIGS. 44A to 44D show measurement results of a plane of Sample 5A. FIG. 44A shows a plan-view TEM image, and FIGS. 44B and 44C show plan-view EDX mapping images. Note that FIGS. 44A to 44C show the same region in the plane of Sample 5A.

FIG. 44B shows a plan-view EDX mapping image of In atoms. In the EDX mapping image in FIG. 44B, the proportion of the In atoms in all the atoms is 12.11 atomic % to 43.80 atomic %. FIG. 44C shows a plan-view EDX mapping image of Ga atoms. In the EDX mapping image in FIG. 44C, the proportion of the Ga atoms in all the atoms is 0.00 atomic % to 14.83 atomic %.

The EDX mapping images in FIGS. 44B and 44C show relative distribution of bright and dark areas, indicating that the In atoms and the Ga atoms have distributions in Sample 5A. Here, five regions surrounded by black lines (a region 921, a region 922, a region 923, a region 924, and a region 925) were extracted among regions whose luminance is greater than or equal to 75% of the maximum luminance in FIG. 44B. Five regions surrounded by dashed lines (a region 926, a region 927, a region 928, a region 929, and a region 930) were extracted among regions whose luminance is greater than or equal to 75% of the maximum luminance in FIG. 44C. Five regions surrounded by white lines (a region 931, a region 932, a region 933, a region 934, and a region 935) were extracted among regions whose luminance is greater than or equal to 25% and less than or equal to 75% of the maximum luminance in FIG. 44B.

Regions including a relatively large number of Ga atoms, that is, the five regions surrounded by the dashed lines (the regions 926 to 930) in FIG. 44C are relatively dark in FIG. 44B. That is, the region including a relatively large number of Ga atoms is expected to include a relatively small number of In atoms.

Figure 44D:
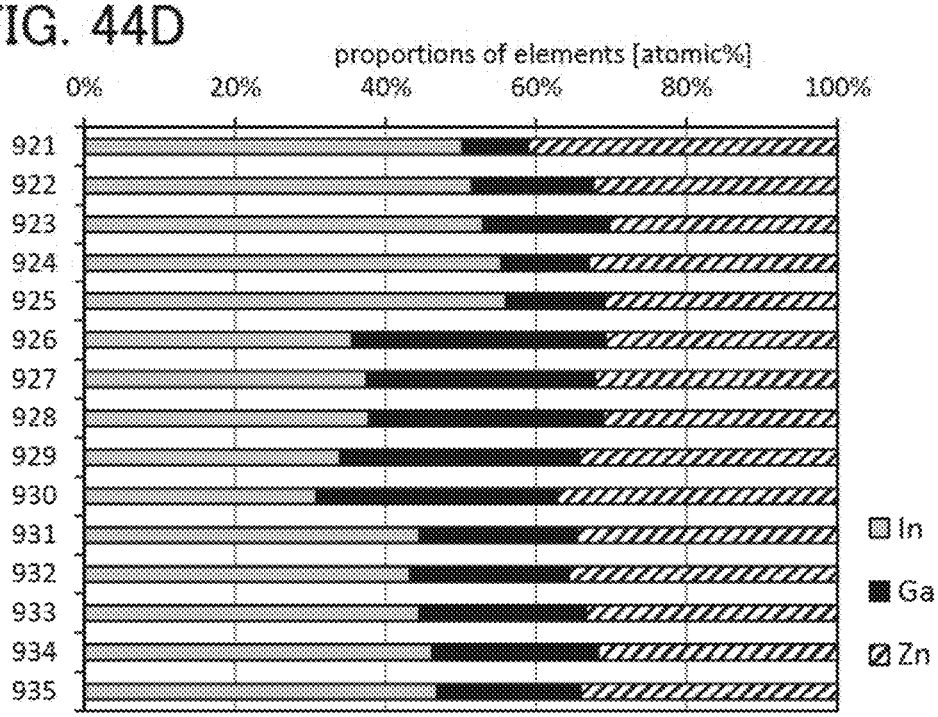

The percentages of elements in the regions 921 to 935 in FIG. 44B are shown in FIG. 44D. The regions surrounded by the black lines (the regions 921 to 925) are found to include a relatively large number of In atoms and a relatively small number of Ga atoms. The regions surrounded by the dashed lines (the regions 926 to 930) are found to include a relatively small number of In atoms and a relatively large number of Ga atoms.

As shown in FIGS. 43D and 44D, it is found that the In atoms are distributed in a range of higher than or equal to 25 atomic % and lower than or equal to 60 atomic %. Furthermore, it is found that the Ga atoms are distributed in a range of higher than or equal to 3 atomic % and lower than or equal to 40 atomic %.

A region including a relatively large number of In atoms can be expected to have relatively high conductivity. In contrast, a region including a relatively large number of Ga atoms can be expected to have a relatively high insulating property. Accordingly, it is considered that carriers flow through the region including a relatively large number of In atoms, so that the conductivity property is exhibited and high field-effect mobility ($\mu$) is achieved. Meanwhile, it is considered that distributing the region including a relatively large number of Ga atoms in the metal oxide enables low leakage current and favorable switching operation.

In other words, when a metal oxide having a CAC composition is used in a semiconductor element, the insulating property derived from a Ga atom or the like and the conductivity type derived from an In atom complement each other, whereby high on-state current ($I_{on}$) and high field-effect mobility ($\mu$) can be achieved.

At least part of this example can be implemented in combination with any of the other embodiments and the other examples described in this specification as appropriate.

Example 6

In this example, the transistor 150 including the metal oxide 108 of one embodiment of the present invention was fabricated and the density of defect states was measured. In this example, nine transistors, i.e., Samples 6A, 6B, 6C, 6D, 6E, 6F, 6G, 6H, and 6J, were fabricated as the transistor 150 including the metal oxide 108.

<Structure of Samples and Fabrication Method Thereof>

Samples 6A to 6H and 6J relating to one embodiment of the present invention are described below. As Samples 6A to 6H and 6J, the transistors 150 having the structure illustrated in FIGS. 6A to 6C were fabricated by the fabrication method described in Embodiment 2 with reference to FIGS. 9A to 9D, FIGS. 10A to 10C, and FIGS. 11A to 11C.

Samples 6A to 6H and 6J were fabricated at different temperatures and different oxygen flow rate ratios in formation of the metal oxide. The metal oxide 108 was formed using a metal oxide target (In:Ga:Zn=1:1:1.2 [atomic ratio]). The temperatures and the oxygen flow rate ratios in formation of the metal oxide of Samples 6A to 6H and 6J are shown in Table 6 below.

TABLE 6

|  | Flow rate [sccm] | | $O_2$ ratio [%] | Formation temperature [° C.] |
|---|---|---|---|---|
|  | $O_2$ | Ar | | |
| Sample 6A | 30 | 270 | 10 | R.T. |
| Sample 6B | 90 | 210 | 30 | R.T. |
| Sample 6C | 150 | 150 | 50 | R.T. |
| Sample 6D | 30 | 270 | 10 | 130 |
| Sample 6E | 90 | 210 | 30 | 130 |
| Sample 6F | 150 | 150 | 50 | 130 |
| Sample 6G | 30 | 270 | 10 | 170 |
| Sample 6H | 90 | 210 | 30 | 170 |
| Sample 6J | 150 | 150 | 50 | 170 |

The samples were fabricated by the fabrication method described in Embodiment 2.

The transistor 150 had a channel length of 2 μm and a channel width of 3 μm (hereinafter, also referred to as L/W=⅔ μm) or a channel length of 2 μm and a channel width of 50 μm (hereinafter, also referred to as L/W=2/50 μm).

<Measurement of Shallow Defect States Using Transistor Characteristics>

[Measurement Method of Density of Shallow Defect States]

Shallow defect states (hereinafter, also referred to as sDOS) of a metal oxide can be estimated from electrical characteristics of a transistor in which the metal oxide was used as a semiconductor. In the following description, the density of interface states of the transistor was measured. In addition, a method for estimating subthreshold leakage current in consideration of the density of interface states and the number of electrons trapped by the interface states, $N_{trap}$ is described.

The number of electrons trapped by the interface states, $N_{trap}$, can be measured by comparing drain current-gate voltage ($I_d$-$V_g$) characteristics of the transistor that was actually measured and drain current-gate voltage ($I_d$-$V_g$) characteristics that was calculated.

Figure 45:
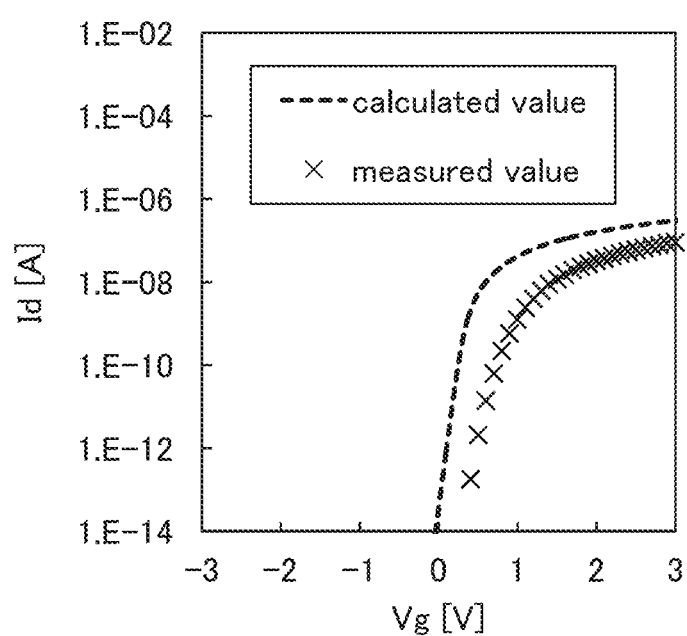
FIG. 45 shows $I_d$-$V_g$ characteristics.

FIG. 45 illustrates ideal $I_d$-$V_g$ characteristics obtained by calculation and the actually measured $I_d$-$V_g$ characteristics of the transistor when a source voltage $V_s$ is 0 V and a drain voltage $V_d$ is 0.1 V. Note that only values more than or equal to $1\times10^{-13}$ A at which drain current $I_d$ can be easily measured were plotted among the measurement results of the transistor.

A change of the drain current $I_d$ with respect to the gate voltage $V_g$ is more gradual in the actually measured $I_d$-$V_g$ characteristics than in the ideal $I_d$-$V_g$ characteristics obtained by calculation. This is probably because an electron is trapped by a shallow interface state positioned near energy at the conduction band minimum (represented as Ec). In this measurement, the density of interface states Nit can be estimated more accurately in consideration of the number of electrons (per unit area and unit energy) trapped by shallow interface states, $N_{trap}$, with use of the Fermi distribution function.

Figure 46:
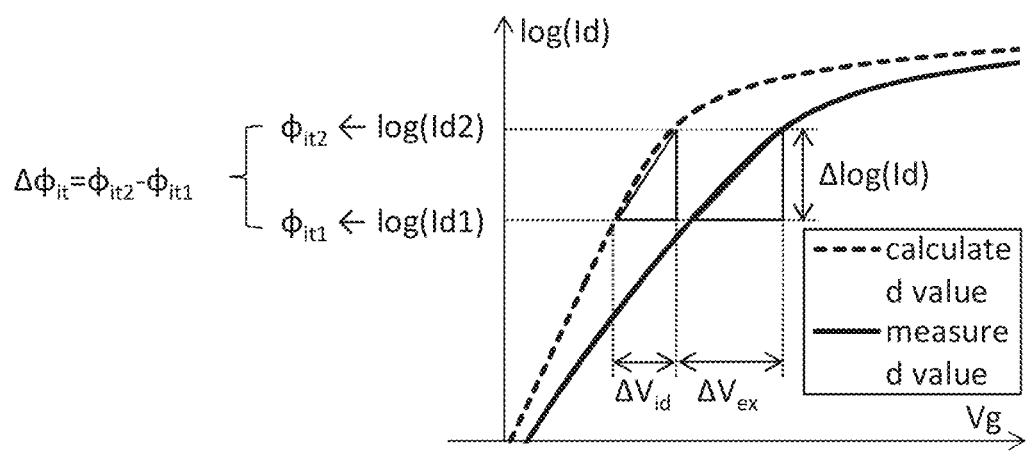
FIG. 46 shows $I_d$-$V_g$ characteristics.

First, a method for evaluating the number of electrons trapped by interface trap states, $N_{trap}$, by using schematic $I_d$-$V_g$ characteristics illustrated in FIG. 46 is described. The dashed line indicates ideal $I_d$-$V_g$ characteristics without trap state which are obtained by the calculation. On the dashed line, a change in gate voltage $V_g$ when the drain current changes from $I_d1$ to $I_d2$ is represented by $\Delta V_{id}$. The solid line indicates the actually measured $I_d$-$V_g$ characteristics. On the solid line, a change in gate voltage $V_g$ when the drain current changes from $I_d1$ to $I_d2$ is represented by $\Delta V_{ex}$. The potential at the target interface when the drain current is $I_d1$, the potential at the target interface when the drain current is $I_d2$, and the amount of change are represented by $\phi_{it1}$, $\phi_{it2}$, and $\phi_{it}$, respectively.

The slope of the actually measured values is smaller than that of the calculated values in FIG. 46, which indicates that $\Delta V_{ex}$ is always larger than $\Delta V_{id}$. Here, a difference between $\Delta V_{ex}$ and $\Delta V_{id}$ corresponds to a potential difference that is needed for trapping of an electron in a shallow interface state. Therefore, $\Delta Q_{trap}$ which is the amount of change in charge due to trapped electrons can be expressed by the following formula (6).

[Formula 6]

$$\Delta Q_{trap} = -C_{tg}(\Delta V_{ex} - \Delta V_{id}) \quad (6)$$

$C_{tg}$ is combined capacitance of an insulator and a semiconductor per unit area. In addition, $\Delta Q_{trap}$ can be expressed by the formula (7) by using the number of trapped electrons $N_{trap}$ (per unit area and per unit energy). Note that q represents elementary charge.

[Formula 7]

$$\Delta Q^{trap} = -qN_{trap}\Delta\phi_{it} \quad (7)$$

Simultaneously solving the formulae (6) and (7) gives the formula (8).

[Formula 8]

$$-C_{tg}(\Delta V_{ex} - \Delta V_{id}) = -qN_{trap}\Delta\phi_{it} \quad (8)$$

Then, taking the limit zero of $\Delta\phi_{it}$ in the formula (8) gives the formula (9).

[Formula 9]

$$N_{trap} = \frac{C_{tg}}{q}\lim_{\Delta\phi_{it}\to 0}\left(\frac{\Delta V_{ex}}{\Delta\phi_{it}} - \frac{\Delta V_{id}}{\Delta\phi_{it}}\right) = C_{tg}\left(\frac{\partial V_{ex}}{\partial\phi_{it}} - \frac{\partial V_{id}}{\partial\phi_{it}}\right) \quad (9)$$

In other words, the number of electrons trapped by an interface, $N_{trap}$, can be estimated by using the ideal $I_d$-$V_g$ characteristics, the actually measured $I_d$-$V_g$ characteristics, and the formula (9). Furthermore, the relationship between the drain current and the potential at the interface can be obtained by the above calculations.

The relationship between the number of electrons $N_{trap}$ per unit area and per unit energy and the density of interface states Nit is expressed by the formula (10).

[Formula 10]

$$N_{trap} = \frac{\partial}{\partial\phi_{it}}\int_{-\infty}^{\infty}N_{it}(E)f(E)dE \quad (10)$$

Here, f(E) is Fermi distribution function. The $N_{trap}$ obtained from the formula (9) is fitted with the formula (10) to determine $N_{it}$. The conduction characteristics including $I_d$<0.1 pA can be obtained by the device simulator to which the $N_{it}$ is set.

Figure 47:
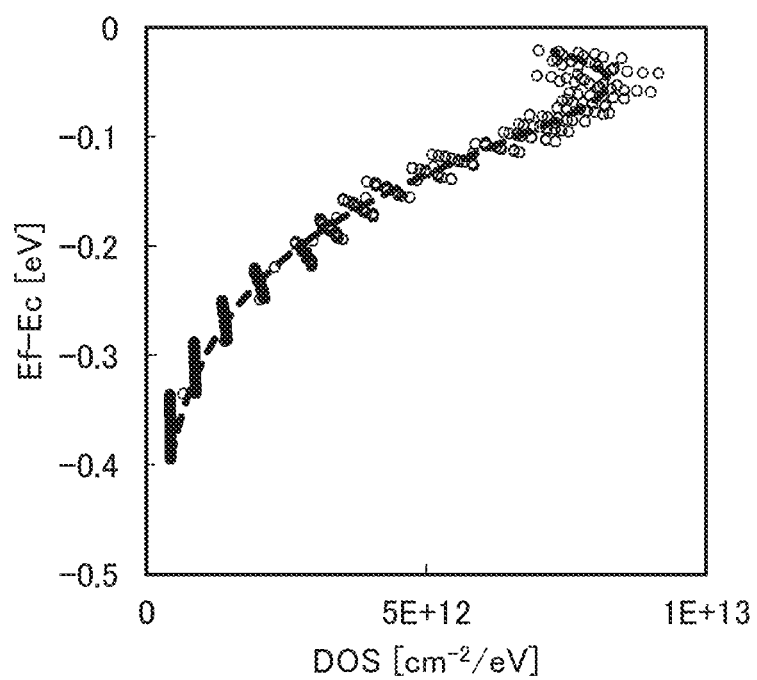
FIG. 47 shows calculation results of a density of interface states.

The actually measured $I_d$-$V_g$ characteristics in FIG. 45 are applied to the formula (9) and the results of extracting $N_{trap}$ are plotted as white circles in FIG. 47. The vertical axis in FIG. 47 represents Fermi energy $E_f$ at the conduction band minimum Ec of a semiconductor. The maximum value is positioned on the dashed line just under Ec. When tail distribution of the formula (11) is assumed as $N_{it}$ of the formula (10), $N_{trap}$ can be fitted well like the dashed line in FIG. 47. As a result, the trap density at an end of the conduction band $N_{ta}=1.67\times10^{13}$ cm$^{-2}$ eV and the characteristic decay energy $W_{ta}=0.105$ eV are obtained as the fitting parameters.

[Formula 11]

$$N_{it}(E) = N_{ta}\exp\left[\frac{E - E_c}{W_{ta}}\right] \quad (11)$$

Figure 48A:
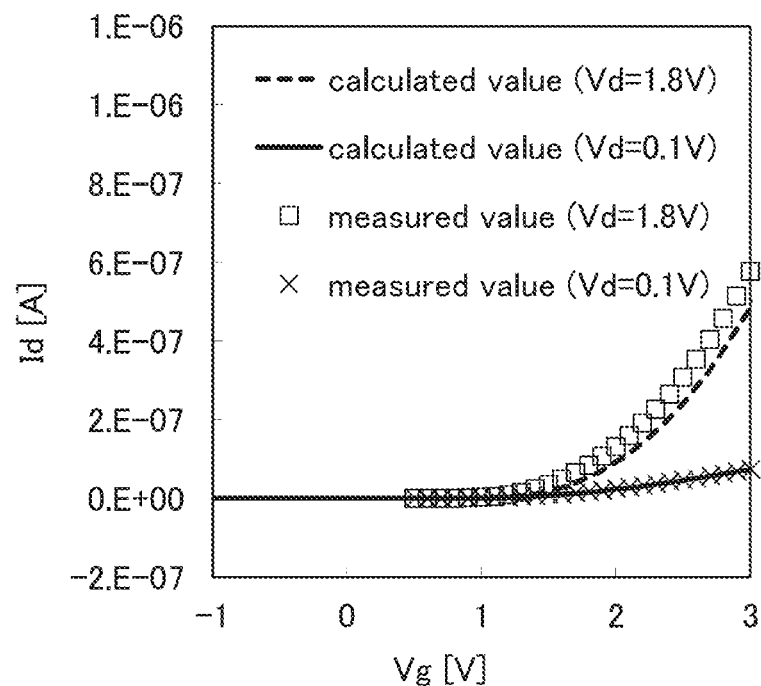
FIGS. 48A and 48B show $I_d$-$V_g$ characteristics.
Figure 48B:
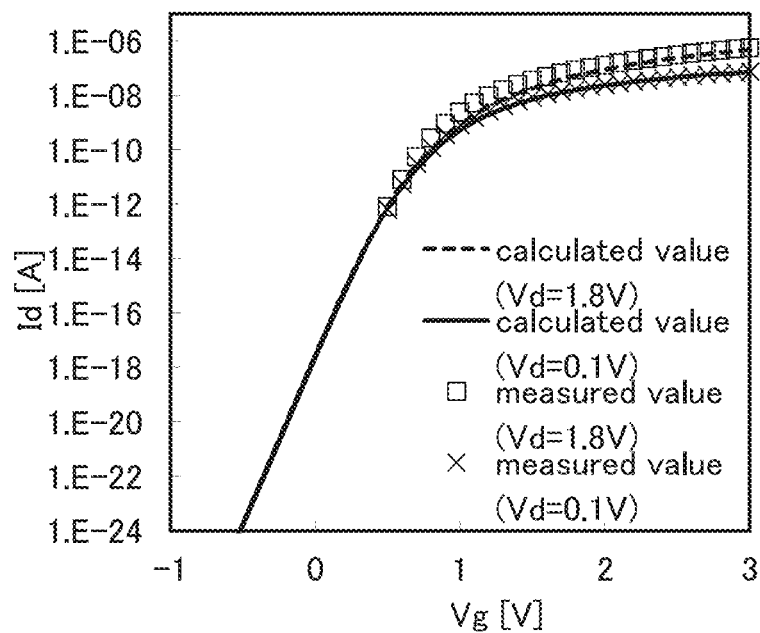

FIGS. 48A and 48B show the inverse calculation results of $I_d$-$V_g$ characteristics by feeding back the obtained fitting curve of interface state to the calculation using the device simulator. FIG. 48A shows the calculated $I_d$-$V_g$ characteristics when the drain voltage $V_d$ is 0.1 V and 1.8V and the actually measured $I_d$-$V_g$ characteristics when the drain voltage $V_d$ is 0.1 V and 1.8V. FIG. 48B is a graph in which the drain current $I_d$ is a logarithm in FIG. 48A.

The curve obtained by the calculation substantially matches with the plot of the actually measured values, which suggests that the calculated values and the measured values are highly reproducible. Thus, the above method is quite appropriate as a method for calculating the density of shallow defect states.

[Measurement Results of Density of Shallow Defect States]

Next, the density of shallow defect states of Samples 6A, 6B, 6C, 6D, 6E, 6F, 6G, 6H, and 6J were measured by comparing measured electrical characteristics with ideal calculation values according to the above-described method.

FIG. 49 shows calculated average density of shallow defect states of Samples 6A to 6H and 6J.

As shown in FIG. 49, the sample formed at a lower oxygen flow rate ratio in formation of the metal oxide 108 or a lower temperature in formation of the metal oxide 108 has a lower peak density of shallow defect states.

As described above, Samples 6A to 6H and 6J are found to be transistors including a metal oxide film with a low density of defect states. It is inferred that the oxygen-transmitting property is improved because the metal oxide film is formed at a low temperature and a low oxygen flow rate ratio, and the amount of diffused oxygen in the fabrication process of the transistor is increased, whereby the amount of defects such as oxygen vacancies in the metal oxide film and at the interface between the metal oxide film and the insulating film is reduced.

At least part of this example can be implemented in combination with any of the other embodiments and the other examples described in this specification as appropriate.

Example 7

In this example, the transistor 150 including the metal oxide 108 of one embodiment of the present invention was fabricated and the density of defect states was measured. In this example, nine transistors, i.e., Samples 7A, 7B, 7C, 7D, 7E, 7F, 7G, 7H, and 7J, were fabricated as the transistor 150 including the metal oxide 108.

<Structure of Samples and Fabrication Method Thereof>

Samples 7A to 7H and 7J relating to one embodiment of the present invention are described below. As Samples 7A to 7H and 7J, the transistors 150 having the structure illustrated in FIGS. 6A to 6C were fabricated by the fabrication method described in Embodiment 2 with reference to FIGS. 9A to 9D, FIGS. 10A to 10C, and FIGS. 11A to 11C.

Samples 7A to 7H and 7J were fabricated at different temperatures and different oxygen flow rate ratios in formation of the metal oxide 108. The metal oxide 108 was formed using a metal oxide target (In:Ga:Zn=4:2:4.1 [atomic ratio]). The temperatures and the oxygen flow rate ratios in formation of the metal oxide of the samples 7A to 7H and 7J are shown in Table 7 below.

TABLE 7

| | Flow rate [sccm] | | $O_2$ ratio | Formation temperature |
|---|---|---|---|---|
| | $O_2$ | Ar | [%] | [° C.] |
| Sample 7A | 30 | 270 | 10 | R.T. |
| Sample 7B | 90 | 210 | 30 | R.T. |
| Sample 7C | 300 | 0 | 100 | R.T. |
| Sample 7D | 30 | 270 | 10 | 130 |
| Sample 7E | 90 | 210 | 30 | 130 |

TABLE 7-continued

| | Flow rate [sccm] | | $O_2$ ratio | Formation temperature |
|---|---|---|---|---|
| | $O_2$ | Ar | [%] | [° C.] |
| Sample 7F | 300 | 0 | 100 | 130 |
| Sample 7G | 30 | 270 | 10 | 170 |
| Sample 7H | 90 | 210 | 30 | 170 |
| Sample 7J | 300 | 0 | 100 | 170 |

The samples were fabricated by the fabrication method described in Embodiment 2.

The transistor 150 had a channel length of 2 μm and a channel width of 3 μm (hereinafter, also referred to as L/W=⅔ μm) or a channel length of 2 μm and a channel width of 50 μm (hereinafter, also referred to as L/W=2/50 μm).

<Measurement of Shallow Defect States Using Transistor Characteristics>

[Measurement Method of Density of Shallow Defect States]

Shallow defect states of the metal oxide 108 were estimated from electrical characteristics of a transistor in which the metal oxide was used as a semiconductor. The calculation method was similar to that described in the above example. The density of interface states of the transistor was measured. In addition, subthreshold leakage current was estimated in consideration of the density of interface states and the number of electrons trapped by the interface states, $N_{trap}$.

[Measurement Results of Density of Shallow Defect States]

Next, the density of shallow defect states of Samples 7A, 7B, 7C, 7D, 7E, 7F, 7G, 7H, and 7J were measured by comparing measured electrical characteristics with ideal calculation values according to the above-described method.

FIG. 50 shows calculated average density of shallow defect states of Samples 7A to 7H and 7J.

As shown in FIG. 50, the sample formed at a lower oxygen flow rate ratio in formation of the metal oxide 108 or a lower temperature in formation of the metal oxide 108 has a lower peak density of shallow defect states.

As described above, Samples 7A to 7H and 7J are found to be transistors including a metal oxide film with a low density of defect states. It is inferred that the oxygen-transmitting property is improved because the metal oxide film is formed at a low temperature and a low oxygen flow rate ratio, and that the amount of diffused oxygen in the fabrication process of the transistor is increased, whereby the amount of defects such as oxygen vacancies in the metal oxide film and at the interface between the metal oxide film and the insulating film is reduced.

At least part of this example can be implemented in combination with any of the other embodiments and the other examples described in this specification as appropriate.

Example 8

In this example, the transistor 150 including the metal oxide 108 of one embodiment of the present invention was fabricated and subjected to tests for electrical characteristics and reliability. In this example, a transistor of Sample 8A was fabricated as the transistor 150 including the metal oxide 108.

<Structure of Sample and Fabrication Method Thereof

Sample 8A relating to one embodiment of the present invention is described below. As Sample 8A, the transistor 150 having the structure illustrated in FIGS. 6A to 6C was fabricated by the fabrication method described in Embodiment 2 with reference to FIGS. 9A to 9D, FIGS. 10A to 10C, and FIGS. 11A to 11C.

The temperature and the oxygen flow rate ratio in formation of the metal oxide 108 of Sample 8A are shown in Table 8 below.

TABLE 8

| | Flow rate [sccm] | | O$_2$ ratio | Formation temperature |
|---|---|---|---|---|
| | O$_2$ | Ar | [%] | [° C.] |
| Sample 8A | 0 | 300 | 0 | R. T. |

Sample 8A was fabricated by the fabrication method described in Embodiment 2. The metal oxide 108 was formed using a metal oxide target (In:Ga:Zn=5:1:7 [atomic ratio]).

The transistor 150 had a channel length of 3 μm and a channel width of 50 μm (hereinafter, also referred to as L/W=3/50 μm).

<$I_d$-$V_g$ Characteristics of Transistor>

Next, $I_d$-$V_g$ characteristics of the transistor (L/W=3/50 μm) in Sample 8A were measured. As conditions for measuring the $I_d$-$V_g$ characteristics of the transistor, a voltage applied to the conductive film 112 serving as a first gate electrode (hereinafter the voltage is also referred to as gate voltage ($V_g$)) and a voltage applied to the conductive film 106 serving as a second gate electrode (hereinafter the voltage is also referred to as back gate voltage ($V_{bg}$)) were changed from −10 V to +10 V in increments of 0.25 V. A voltage applied to the conductive film 120a serving as a source electrode (the voltage is also referred to as source voltage ($V_s$)) was 0 V (comm), and a voltage applied to the conductive film 120b serving as a drain electrode (the voltage is also referred to as drain voltage ($V_d$)) was 0.1 V and 20 V.

Figure 51:
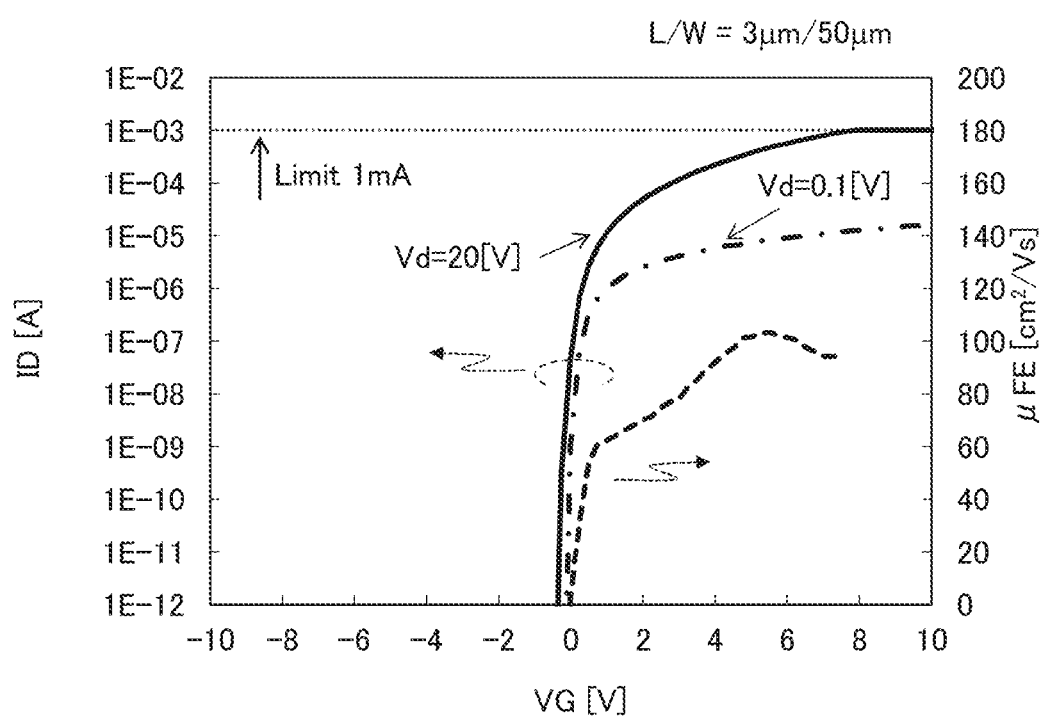
FIG. 51 shows $I_d$-$V_g$ characteristics of a transistor.

In FIG. 51, the results of $I_d$-$V_g$ characteristics and field-effect mobility of Sample 8A are shown. The solid line and the dashed-dotted line represent $I_d$ at $V_d$=20 V and $I_d$ at $V_d$=0.1 V, respectively. The dashed line represents field-effect mobility. In FIG. 51, the first vertical axis represents $I_d$ [A], the second vertical axis represents field-effect mobility (μFE) [cm$^2$/Vs], and the horizontal axis represents $V_g$ [V]. The field-effect mobility was calculated from the value measured at $V_d$=20 V.

Note that the results in FIG. 51 were obtained with the upper limit of $I_d$ in the measurement set to 1 mA. In FIG. 51, when $V_d$ is 20 V, $I_d$ exceeds this upper limit at $V_g$=7.5 V. For this reason, FIG. 51 shows the field-effect mobility in the range where $V_g$ is lower than or equal to 7.5 V as the field-effect mobility estimated from such $I_d$-$V_g$ characteristics.

As shown in FIG. 51, the transistor of this example has favorable electrical characteristics. Here, Table 9 shows the transistor characteristics that are shown in FIG. 51.

TABLE 9

| μFE (max) [cm$^2$V$^{-1}$s$^{-1}$] | Vth [V] | S [V/decade] | Ioff [A/cm$^2$] | μFE (@ Vg = 2 V) [cm$^2$V$^{-1}$s$^{-1}$] | μFE (max)/ μFE (@ Vg = 2 V) |
|---|---|---|---|---|---|
| 103 | −0.1 | 0.12 | <1 × 10$^{-12}$ | 70 | 1.47 |

As described above, the field-effect mobility of the transistor of this example exceeds 100 cm$^2$/Vs. This field-effect mobility is equivalent to that of a transistor including low-temperature polysilicon and means extraordinary characteristics for a transistor using the metal oxide 108.

As shown in Table 9, Sample 8A includes a first region where the maximum value of the field-effect mobility of the transistor at a gate voltage of higher than 0 V and lower than or equal to 10 V is larger than or equal to 60 cm$^2$/V$_s$ and smaller than 150 cm$^2$/Vs, a second region where the threshold voltage is higher than or equal to −1 V and lower than or equal to 1 V, a third region where the S value is smaller than 0.3 V/decade, and a fourth region where the off-state current is lower than 1×10$^{-12}$ A/cm$^2$, and μ$_{FE}$(max)/μ$_{FE}$ ($V_g$=2 V) is larger than or equal to 1 and smaller than 2 where μ$_{FE}$(max) represents the maximum value of the field-effect mobility of the transistor and μ$_{FE}$($V_g$=2 V) represents the value of the field-effect mobility of the transistor at a gate voltage of 2 V.

The characteristics of the transistor can be obtained with the use of the metal oxide 108 described above. A transistor including the metal oxide 108 in its semiconductor layer can have both high carrier mobility and excellent switching characteristics.

At least part of this example can be implemented in combination with any of the other embodiments and the other examples described in this specification as appropriate.

REFERENCE NUMERALS

001: region, 002: region, 100: transistor, 102: substrate, 104: insulating film, 106: conductive film, 108: metal oxide, 108a: metal oxide, 108n: region, 110: insulating film, 110_0: insulating film, 112: conductive film, 112O: conductive film, 112_1: conductive film, 112a: conductive film, 116: insulating film, 118: insulating film, 120a: conductive film, 120b: conductive film, 122: insulating film, 140: mask, 141a: opening, 141b: opening, 143: opening, 150: transistor, 160: transistor, 300A: transistor, 300B: transistor, 300C: transistor, 300D: transistor, 302: substrate, 304: conductive film, 306: insulating film, 307: insulating film, 308: metal oxide, 312a: conductive film, 312b: conductive film, 314: insulating film, 316: insulating film, 318: insulating film, 320a: conductive film, 320b: conductive film, 341a: opening, 341b: opening, 342a: opening, 342b: opening, 342c: opening, 600: display panel, 601: transistor, 604: connection portion, 605: transistor, 606: transistor, 607: connection portion, 612: liquid crystal layer, 613: conductive film, 617: insulating film, 620: insulating film, 621: insulating film, 623: conductive film, 631: coloring layer, 632: light-blocking film, 633a: alignment film, 633b: alignment film, 634: coloring layer, 635: conductive film, 640: liquid crystal element, 641: adhesive layer, 642: adhesive layer, 643: conductive film, 644: EL layer, 645a: conductive film, 645b: conductive film, 646: insulating film, 647: insulating film, 648: conductive film, 649: connection layer, 651: substrate, 652: conductive film, 653: semiconductor film, 654: conductive film, 655: opening, 656: polarizing plate, 659: circuit, 660: light-emitting element, 661: substrate, 662: display portion, 663: conductive film, 666: wiring, 672: FPC, 673: IC, 681: insulating film, 682: insulating film, 683: insulating film, 684: insulating film, 685: insulating film, 686: connector, 687: connection portion, 700: model, 702: local structure, 704: local structure, 706: local structure, 708: local structure, 710: local structure, 712: local structure, 901: region, 902: region, 903: region, 904: region, 905: region, 906: region, 907: region, 908: region, 909: region, 910: region, 911: region, 912: region, 913: region, 914: region, 915: region, 920: region, 921: region, 922: region, 923: region, 924: region, 925: region, 926: region, 927: region, 928: region, 929: region, 930: region, 931: region, 932: region, 933: region, 934: region, and 935: region.

This application is based on Japanese Patent Application Serial No. 2016-111984 filed with Japan Patent Office on Jun. 3, 2016, Japanese Patent Application Serial No. 2016-125756 filed with Japan Patent Office on Jun. 24, 2016, Japanese Patent Application Serial No. 2016-126116 filed with Japan Patent Office on Jun. 25, 2016, Japanese Patent Application Serial No. 2016-135510 filed with Japan Patent Office on Jul. 7, 2016, Japanese Patent Application Serial No. 2016-151723 filed with Japan Patent Office on Aug. 2, 2016, Japanese Patent Application Serial No. 2016-155888 filed with Japan Patent Office on Aug. 8, 2016, Japanese Patent Application Serial No. 2016-184961 filed with Japan Patent Office on Sep. 22, 2016, and Japanese Patent Application Serial No. 2016-189426 filed with Japan Patent Office on Sep. 28, 2016, the entire contents of which are hereby incorporated by reference.

The invention claimed is:

1. A semiconductor device comprising:
a transistor comprising a channel formation region in a metal oxide,
wherein the channel formation region comprises a material having at least two different energy band widths,
wherein the material comprises nano-size particles each with a size of greater than or equal to 0.5 nm and less than or equal to 10 nm,
wherein a first nano-size particle of the nano-size particles comprises In,
wherein a second nano-size particle of the nano-size particles comprises Ga, and
wherein the first nano-size particle and the second nano-size particle are randomly and unevenly distributed.

2. The semiconductor device according to claim 1,
wherein a boundary between the first nano-size particle and the second nano-size particle is not clear, and
wherein the first nano-size particle and the second nano-size particle are mixed in a cloud-like manner.

3. The semiconductor device according to claim 1,
wherein an energy band width of the first nano-size particle is larger than an energy band width of the second nano-size particle.

4. The semiconductor device according to claim 1,
wherein the second nano-size particle further comprises at least one of In, Zn, and Sn.

* * * * *